(12) United States Patent
Peddle et al.

(10) Patent No.: US 11,037,625 B2
(45) Date of Patent: Jun. 15, 2021

(54) SOLID STATE DRIVE ARCHITECTURES

(71) Applicant: THSTYME BERMUDA LIMITED, Hamilton (BM)

(72) Inventors: Charles I. Peddle, Santa Cruz, CA (US); Martin Snelgrove, Toronto (CA); Robert Neil McKenzie, Toronto (CA); Xavier Snelgrove, Toronto (CA)

(73) Assignee: THSTYME BERMUDA LIMITED, Hamilton (BM)

( * ) Notice: Subject to any disclaimer, the term of this patent is extended or adjusted under 35 U.S.C. 154(b) by 36 days.

(21) Appl. No.: 16/255,320

(22) Filed: Jan. 23, 2019

(65) Prior Publication Data

US 2019/0172537 A1 Jun. 6, 2019

Related U.S. Application Data

(63) Continuation-in-part of application No. 15/905,540, filed on Feb. 26, 2018, now Pat. No. 10,796,762, which is a continuation of application No. 14/517,318, filed on Oct. 17, 2014, now Pat. No. 9,941,007, which is a continuation of application No. PCT/US2013/070789, filed on Nov. 19, 2013.

(Continued)

(51) Int. Cl.
| | |
|---|---|
| *G06F 12/00* | (2006.01) |
| *G06F 12/08* | (2016.01) |
| *G06F 13/00* | (2006.01) |
| *G11C 14/00* | (2006.01) |
| *G06F 12/02* | (2006.01) |
| *G06F 13/28* | (2006.01) |
| *G11C 11/4063* | (2006.01) |
| *G11C 16/10* | (2006.01) |
| *G11C 16/04* | (2006.01) |
| *G06F 3/06* | (2006.01) |

(52) U.S. Cl.
CPC ...... *G11C 14/0018* (2013.01); *G06F 12/0246* (2013.01); *G06F 12/08* (2013.01); *G06F 13/28* (2013.01); *G11C 11/4063* (2013.01); *G06F 3/0688* (2013.01); *G06F 2212/7201* (2013.01); *G11C 16/0408* (2013.01); *G11C 16/10* (2013.01); *G11C 2207/2245* (2013.01)

(58) Field of Classification Search
CPC .......................... G11C 14/0018; G06F 3/061
USPC ........................................................ 711/103
See application file for complete search history.

(56) References Cited

U.S. PATENT DOCUMENTS

| | | |
|---|---|---|
| 6,782,410 B1 | 8/2004 | Bhagat |
| 6,842,377 B2 | 1/2005 | Takano |

(Continued)

FOREIGN PATENT DOCUMENTS

CN 101398745 A 4/2009

*Primary Examiner* — Mohamed M Gebril
(74) *Attorney, Agent, or Firm* — Steven L. Nichols; Fabian VanCott

(57) ABSTRACT

A solid state drive (SSD) includes dynamic random access memory (DRAM), flash memory, and a solid state drive (SSD) controller. The solid state drive (SSD) also includes a peripheral component interconnect express (PCIe) bus to connect the SSD to a computing device such that a central processing unit (CPU) of the computing device exclusively reads data from, and writes data to, the DRAM. The SSD controller writes data to the flash memory from the DRAM independently of received commands from the computing device.

20 Claims, 36 Drawing Sheets

Related U.S. Application Data

(60) Provisional application No. 61/775,327, filed on Mar. 8, 2013, provisional application No. 61/728,394, filed on Nov. 20, 2012.

(56) References Cited

U.S. PATENT DOCUMENTS

| | | | |
|---|---|---|---|
| 7,017,011 B2 | 3/2006 | Lesmanne | |
| 7,039,074 B1* | 5/2006 | Calderone | H04J 3/047 |
| | | | 370/375 |
| 7,196,942 B2 | 3/2007 | Khurana | |
| 7,269,715 B2 | 9/2007 | Le | |
| 7,321,955 B2 | 1/2008 | Ohmura | |
| 7,512,736 B1 | 3/2009 | Overby | |
| 7,535,787 B2 | 5/2009 | Elmhurst | |
| 7,580,277 B2 | 8/2009 | Fuji | |
| 7,711,890 B2 | 5/2010 | Lasser | |
| 7,945,825 B2 | 5/2011 | Cohen | |
| 8,230,193 B2 | 7/2012 | Klemm | |
| 8,397,013 B1* | 3/2013 | Rosenband | G11C 5/02 |
| | | | 711/103 |
| 8,566,546 B1 | 10/2013 | Marshak | |
| 8,595,449 B2 | 11/2013 | Kund | |
| 8,959,280 B2* | 2/2015 | Yu | G06F 3/0631 |
| | | | 711/103 |
| 8,990,527 B1 | 3/2015 | Linstead | |
| 2004/0068621 A1 | 4/2004 | Van Doren | |
| 2005/0055532 A1* | 3/2005 | Yu | G06F 12/0246 |
| | | | 711/203 |
| 2005/0125607 A1 | 6/2005 | Chefalas | |
| 2005/0251617 A1* | 11/2005 | Sinclair | G06F 3/0679 |
| | | | 711/103 |
| 2006/0080501 A1* | 4/2006 | Auerbach | G11B 19/02 |
| | | | 711/112 |
| 2006/0202999 A1 | 9/2006 | Thornton | |
| 2007/0008328 A1 | 1/2007 | MacWilliams | |
| 2007/0016721 A1* | 1/2007 | Gay | G06F 12/0246 |
| | | | 711/103 |
| 2007/0133331 A1 | 6/2007 | Park | |
| 2007/0255898 A1* | 11/2007 | Nishide | G06F 12/0866 |
| | | | 711/113 |
| 2008/0028136 A1* | 1/2008 | Schakel | G11C 11/406 |
| | | | 711/106 |
| 2008/0104314 A1* | 5/2008 | Rajan | G11C 11/406 |
| | | | 711/105 |
| 2008/0177956 A1* | 7/2008 | Peddle | G11C 29/88 |
| | | | 711/156 |
| 2008/0244737 A1* | 10/2008 | Hayasaka | G06F 21/6209 |
| | | | 726/21 |
| 2008/0250189 A1 | 10/2008 | Cheng | |
| 2008/0320214 A1* | 12/2008 | Ma | G06F 12/0246 |
| | | | 711/103 |
| 2009/0094413 A1 | 4/2009 | Lehr | |
| 2009/0113119 A1* | 4/2009 | Oribe | G06F 12/0804 |
| | | | 711/103 |
| 2009/0161466 A1 | 6/2009 | Hamilton | |
| 2009/0172257 A1* | 7/2009 | Prins | G11C 7/1063 |
| | | | 711/103 |
| 2009/0172269 A1* | 7/2009 | Song | G06F 3/061 |
| | | | 711/103 |
| 2009/0228648 A1 | 9/2009 | Wack | |
| 2009/0282101 A1 | 11/2009 | Lim | |
| 2010/0042733 A1 | 2/2010 | Yeh | |
| 2010/0042773 A1* | 2/2010 | Yeh | G06F 12/0868 |
| | | | 711/103 |
| 2010/0046267 A1 | 2/2010 | Yan | |
| 2010/0050016 A1 | 2/2010 | Franklin | |
| 2010/0125712 A1 | 5/2010 | Murase | |
| 2010/0138591 A1* | 6/2010 | Yano | G11C 16/20 |
| | | | 711/103 |
| 2010/0202238 A1 | 8/2010 | Moshayedi et al. | |
| 2010/0241785 A1 | 9/2010 | Chen | |
| 2010/0241789 A1* | 9/2010 | Chu | G06F 12/0246 |
| | | | 711/103 |
| 2010/0274953 A1* | 10/2010 | Lee | G06F 1/266 |
| | | | 711/103 |
| 2010/0293420 A1 | 11/2010 | Kapil | |
| 2010/0332780 A1 | 12/2010 | Furuya | |
| 2011/0004722 A1* | 1/2011 | Jeddeloh | G06F 13/16 |
| | | | 711/103 |
| 2011/0041039 A1* | 2/2011 | Harari | G11C 29/76 |
| | | | 714/773 |
| 2011/0047324 A1* | 2/2011 | Norman | G11C 13/0002 |
| | | | 711/103 |
| 2011/0066837 A1* | 3/2011 | Lee | G06F 13/387 |
| | | | 713/2 |
| 2011/0145485 A1 | 6/2011 | Chun | |
| 2011/0161784 A1* | 6/2011 | Selinger | G06F 11/1068 |
| | | | 714/768 |
| 2011/0202735 A1 | 8/2011 | Kono | |
| 2011/0307745 A1 | 12/2011 | McCune | |
| 2012/0017033 A1* | 1/2012 | Moritoki | G06F 11/1441 |
| | | | 711/103 |
| 2012/0063255 A1 | 3/2012 | Nakazumi | |
| 2012/0110293 A1 | 5/2012 | Yang | |
| 2012/0198107 A1 | 8/2012 | McKean | |
| 2012/0239852 A1* | 9/2012 | Calvert | G06F 11/1441 |
| | | | 711/103 |
| 2012/0246388 A1* | 9/2012 | Hashimoto | G06F 3/0614 |
| | | | 711/103 |
| 2012/0246392 A1* | 9/2012 | Cheon | G06F 12/0638 |
| | | | 711/103 |
| 2012/0284587 A1* | 11/2012 | Yu | G06F 3/0631 |
| | | | 714/773 |
| 2012/0317333 A1* | 12/2012 | Yamamoto | G06F 3/0608 |
| | | | 711/103 |
| 2013/0007373 A1 | 1/2013 | Beckmann | |
| 2013/0024599 A1 | 1/2013 | Huang et al. | |
| 2013/0067161 A1 | 3/2013 | Chandra | |
| 2013/0080805 A1 | 3/2013 | Vick | |
| 2013/0086311 A1* | 4/2013 | Huang | G06F 3/0659 |
| | | | 711/103 |
| 2013/0111129 A1 | 5/2013 | Maki | |
| 2013/0152097 A1 | 6/2013 | Boctor | |
| 2013/0290605 A1* | 10/2013 | Kim | G06F 3/0658 |
| | | | 711/103 |
| 2013/0326270 A1 | 12/2013 | Chen | |
| 2014/0003114 A1 | 1/2014 | Pellizzer | |
| 2014/0215129 A1 | 7/2014 | Kuzmin et al. | |
| 2014/0244966 A1 | 8/2014 | Bosshart et al. | |
| 2014/0281151 A1* | 9/2014 | Yu | G06F 3/064 |
| | | | 711/103 |
| 2015/0019798 A1 | 1/2015 | Huang | |
| 2015/0106556 A1* | 4/2015 | Yu | G06F 13/1694 |
| | | | 711/103 |
| 2015/0177992 A1* | 6/2015 | Ito | G06F 11/14 |
| | | | 711/103 |
| 2016/0026399 A1* | 1/2016 | Purkayastha | G06F 3/0671 |
| | | | 711/103 |

\* cited by examiner

WRITE OPERATION

500

```
CPU sends a write command and places data to be written to
the SSD on the SATA bus
505
```

```
The write command is transferred to the master controller, which
instructs the Logical Flash Controller to accept the data and
transfer it the DRAM logical flash. As part of each write, the CPU
sends multiple redundant writes to update the FAT table for any
file being changed.
510
```

```
The logical flash controller sets up the SATA DMA and manages
the transfer of the data into DRAM logical flash
515
```

```
The logical flash controller manages the data as flash files, including
consolidating and update the data stored in the DRAM logical flash
520
```

```
The master controller determines if and when data should be
transferred from the DRAM logical flash to the flash memory.
525
```

*Fig. 5*

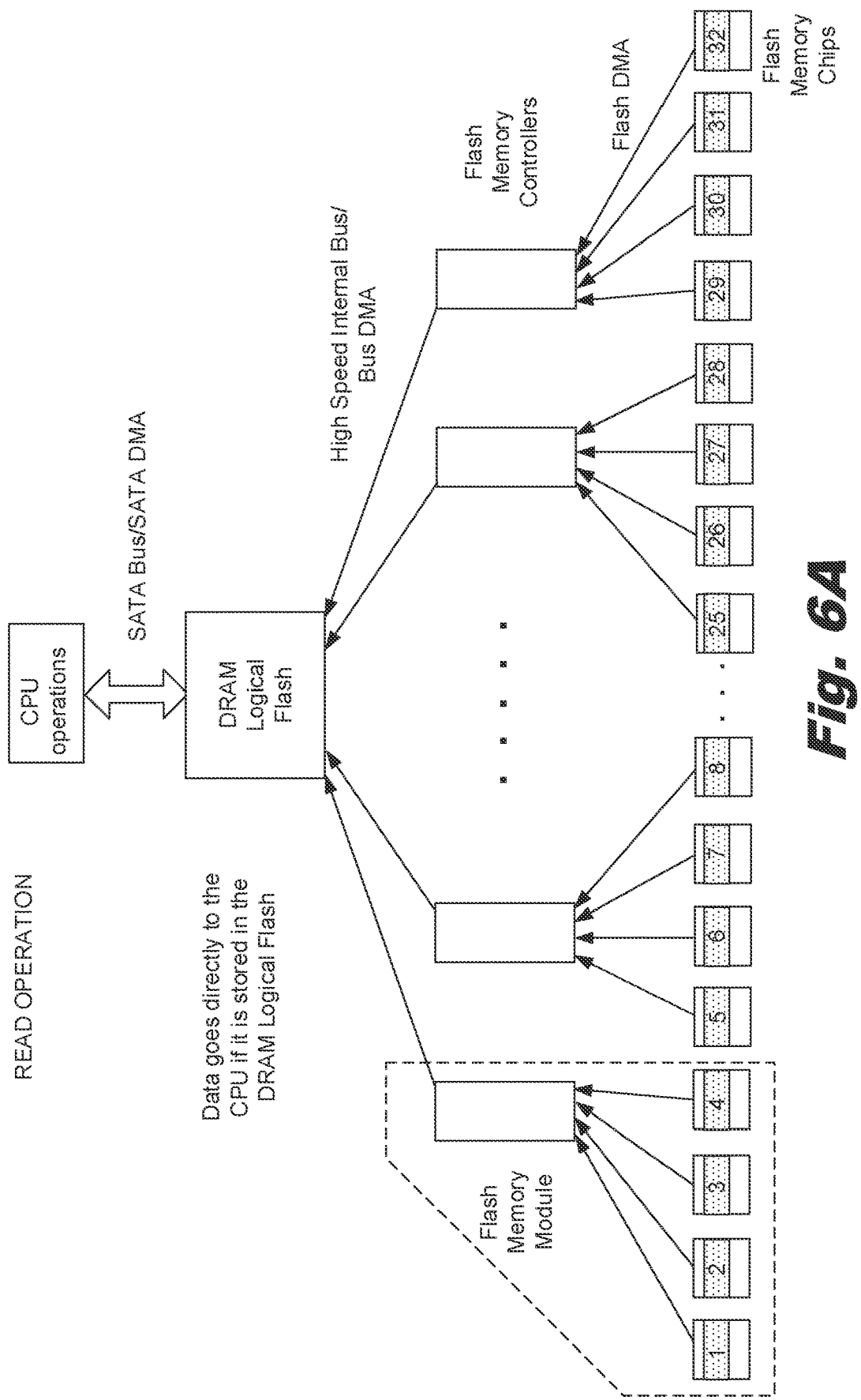

EMERGENCY STORE/
RECOVERY OPERATION

SOLID STATE DRIVE ARCHITECTURES

RELATED APPLICATIONS

The present application claims benefit and is a continuation in part of U.S. application Ser. No. 15/905,540 filed Feb. 26, 2018, which is a continuation of U.S. application Ser. No. 14/517,318 filed Oct. 17, 2014, which is a continuation of International Application No. PCT/US20131070789, filed Nov. 19, 2013, which claims the benefit of U.S. Provisional Application No. 61/728,394, filed Nov. 20, 2012 and U.S. Provisional Application No. 61/775,327, filed Mar. 8, 2013. These applications are incorporated herein by reference in their entireties.

FIELD OF THE INVENTION

This application is related to solid state drive architectures.

BACKGROUND

Computing devices preserve program executables and data in nonvolatile memory. This makes the files available to the computing devices after being restarted or after power interruptions. Traditionally, the preferred nonvolatile storage for large files has been a hard disk drive. Hard disk drives include rotating rigid platters on a motor driven spindle. Data is magnetically read from and written to the platter by heads that float on a film of air above the platters. These platters typically spin at speeds of between 4,200 and 15,000 revolutions per minute (rpm). Hard disk drives have a number of disadvantages, including access times that are related to the mechanical nature of the rotating disks and moving heads, high power consumption, mechanical failure, and low shock resistance.

Solid State Drives (SSDs) are nonvolatile storage devices that use integrated circuits to store data and consequently contain no moving parts. SSDs have a number of advantages over hard disk drives including higher shock resistance, lower access times, and more variable form factors. Additionally SSDs typically consume far less power during operation than hard disk drives. Consequently, SSDs allow for smaller, thinner device profiles and for longer operation on a battery charge.

BRIEF DESCRIPTION OF THE DRAWINGS

The accompanying drawings illustrate various examples of the principles described herein and are a part of the specification. The illustrated examples are merely examples and do not limit the scope of the claims.

FIG. 6A shows data flow during reading data from the solid state drive to CPU memory, according to one example of principles described herein.

Throughout the drawings, identical reference numbers designate similar, but not necessarily identical, elements.

DETAILED DESCRIPTION

Figure 1:
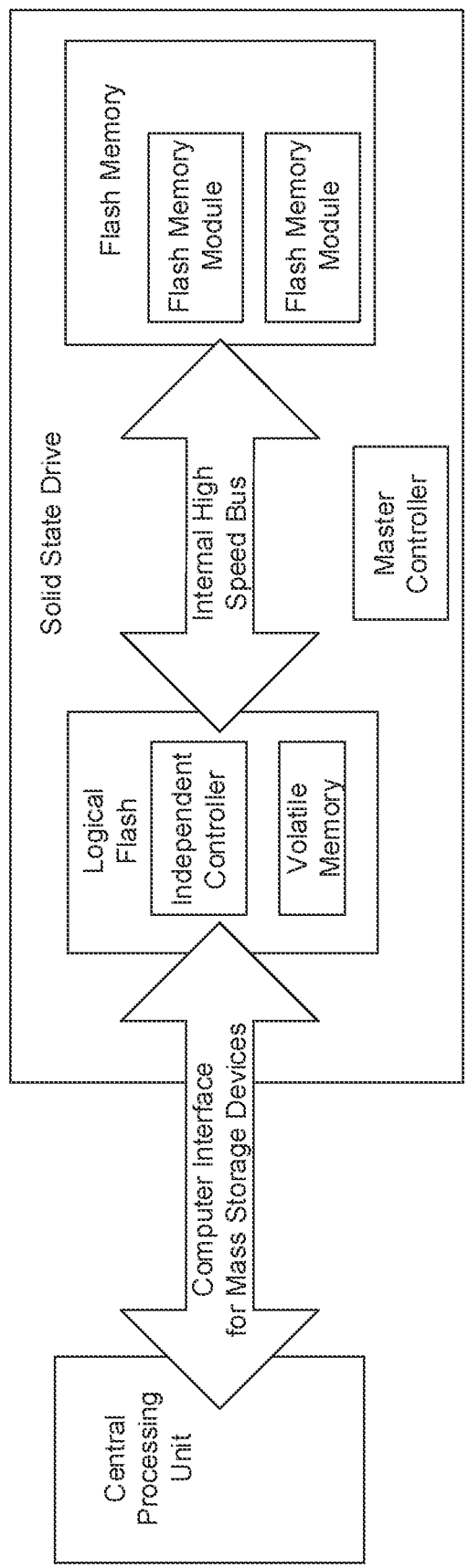
FIG. 1 is a block diagram of an illustrative solid state drive architecture, according to one example of principles described herein.

Solid State Drives (SSDs) are nonvolatile storage devices that use integrated circuits, such as NAND flash memory, to store data. SSDs have a number of advantages, such as high shock resistance, low power requirements, faster access times, and more variable form factors. However, integrated circuits that are used as memory in solid state drives have a limited lifetime. Typical specifications for NAND flash specify that NAND flash can only reliability be used for 1000-3000 write/erase cycles before failure. This lifetime limitation is particularly troublesome because, in the current architectures, a block of NAND flash must be erased and rewritten each time any part of the data contained with the block is changed. Thus, the more frequently a SSD drive is used, the faster it will fail. Many operating systems write to the non-volatile memory frequently. For example, File Access Tables (FAT tables) are rewritten every time a file changes. Each FAT table update includes multiple erase/write cycles. Additionally, many operating systems periodically save "snapshots" of the current state of the computing device into nonvolatile memory. While this can be beneficial in recovering the operation of the computing device, routinely saving the large snapshots on to the NAND flash can significantly shorten the lifetime of the SSD. Consequently, SSDs can fail to meet the customer expectations and may require frequent replacement.

A number of principles are described below that allow for flash memory to be used effectively as non-volatile storage despite its finite number of erase/write cycles. The solid state drive (SSD) architectures described below address the limitations of NAND flash memory by creating DRAM logical flash to act as an intermediary between the flash memory and then independently assessing when data should be written to the NAND flash memory. This significantly improves the operational speed and lifetime of the SSD and allows the SDD to be used as a plug and play alternative to hard disk drives.

Data usage within a computing device typically falls into two categories: a high amount of usage during creation/manipulation of the data and then a far lower amount of usage when the data is archived or stored as a functioning program. The illustrative SSD separates the process of storing data related to the transient state of the computing device and the permanent storage capability of the flash.

When the computing device is powered down, the data stored by the volatile memory of the computing device is lost. The SSD described below facilitates the creation of data files by allowing the data to be stored during development of the program or data file and protecting against data loss when the computing device powers down.

The SSD includes several flash interface controllers managing an optimum number of flash memory devices. In a simple system like a USB2 device one intermediate controller can be used to manage the flash directly. However, in a high speed system several controllers can be operated in parallel to manage the data much more rapidly. Principles described below can also be applied to a wide variety of bus and device technologies, including SATA 3 (500 megabytes per second), USB 3.0 "Superspeed" devices, including USB 3.0 solid state drives and storage devices. The USB 3.0 specification specifies transfer rates of up to 4.8 gigabits per second, increased maximum bus power and more efficient power management.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with the example is included in at least that one example, but not necessarily in other examples.

In several instances below, a controller is described that includes at least one microprocessor, read only memory (ROM) and random access memory (RAM). The microprocessor, ROM and RAM work together to implement the functions of the controller. The use of a different microprocessor with different controls and/or hardware implementation can be used to implement the principles described herein.

FIG. 1 shows one implementation of a solid state drive that includes logical flash and nonvolatile flash memory. The logical flash includes an independent controller and a segment of volatile memory. The logical flash is configured to implement all the functions of a flash controller such that the central processing unit (CPU) thinks it is reading and writing to flash, when it is actually reading and writing to logical flash. The logical flash implements flash memory behavior, but without the lifetime, speed, or addressing limitations of flash memory. The logical flash stores files in the same way as the flash memory and responds to flash commands. Further, the logical flash uses the FAT table, updates logical records, combines files, and is attached to a SATA 3 bus. Because the volatile memory of the logical flash has a virtually unlimited number of read/write cycles, the system processor and operating system can store as many updates and snap shots as desired. Further, the logical flash is extremely fast in both reading and writing data. The CPU reads from and writes exclusively to the logical flash while writes and reads to the flash memory are controlled exclusively by the solid state drive. The use of logical flash allows all flash commands to be handled at full interface speeds and minimizes writes to the flash memory. This is different from caching, because caching ultimately writes everything to flash memory and is implemented only to increase speed and to handle short read and writes.

A master controller within the SSD independently determines when data should be transferred to or from the flash memory. This significantly reduces the number of write/erase cycles for the flash memory because the CPU does not directly access the flash memory.

The flash memory includes a number of flash memory modules. Each flash memory module includes an independent controller and a number of flash die. By using independent controllers, the SSD can perform multiple operations in parallel. This leads to significantly faster read and write times.

The paragraphs below describe a variety of principles for developing an SSD that incorporates logical flash and multiple controllers. SSDs are currently more expensive per gigabyte of storage than hard disk drives. This is primarily due to the cost of the nonvolatile memory die that are used to store the data in the SSD. The memory die are typically flash memory, although other types of memory have been proposed, including Ferroelectric Random Access Memory (FeRAM), Magnetoresistive Random Access Memory (MRAM), Programmable Metallization Cell (PMC), Phase-Change Memory (PCM), and other technologies. Each of these types of nonvolatile memory types has advantages and disadvantages. However, flash memory is the most mature technology and has the lowest cost per unit of storage capacity. There are two predominant types of flash memory: NOR type and NAND type. Both NOR and NAND flash store data in memory cells made from floating gate transistors. These floating gate transistors have a finite number of program-erase cycles before wear begins to deteriorate the integrity of the storage. For example, NOR flash memory may have a typical endurance rating of 100,000 cycles and NAND flash memory may have a typical endurance ratings between 1,000 to 3000 cycles.

NOR type flash memory allows for a single byte to be written and/or read independently. However, this random access feature makes NOR memory less dense per unit area and more expensive per unit of storage. NAND type flash is very high density and has a correspondingly lower cost per unit of storage. However, in current chip architectures, NAND type flash must be read and programmed in larger segments called blocks. This limitation is significant because altering a single bit in a block requires the erasure and rewriting of the entire written space in a block. For purposes of explanation, NAND type flash will be used in illustrative examples of solid state drive architectures. However, the principles described herein can be applied to a wide variety of nonvolatile memory types.

As discussed above, NAND type flash is inexpensive and compact but has the disadvantages of having a finite number of program-erase cycles before wear begins to deteriorate the integrity of the storage. This challenge is compounded by fact that, while NAND type flash can be read at the bit level, NAND type flash must be written and erased in large segments ("blocks") rather than at the bit level. Consequently, when any bit in a block changes, the all the data in the block must be copied to a new block. During the copying process, the new bit(s) are incorporated into the data stored on the new block. The old block is then erased and used again. Programs and operating systems on many computing devices frequently read and write to the hard drive, which could lead to rapid degradation of the NAND flash. In these industry standard operations, changing even one bit in a block requires the copying and erasure of the entire block. In the discussion below, principles are described that provide from holding a block until it is full and only updating the pages that have already been written.

In some Apple® operating systems, the user's files are continuously written to the hard drive to allow the user to restore the machine to a previous state. Not only does the system recover to latest state, there is a program called a "time machine" that allows the system to be restored to any previous state for months before. This program compresses the snapshots and allows recovery to a day but not any period during that day. However, the snapshots can be maintained so that recovery to a particular point for the previous few days is possible. This time machine feature can be very useful in recovering files that were mishandled or lost. Recovering to time before the mistake was made allows for fully recovery of the file and system state.

These and other frequent write operations can lead to the early failure of flash memory because the limited amount of write/erase cycles can quickly be exceeded. Every new write requires a copy of the old data to a new block to add the new data. As discussed above, each memory location in the NAND memory can only be updated on the order of 1,000 to 3,000 times without substantially increasing the likelihood of failure. There are many algorithms that try to work around this problem, such as over-provisioning the memory with spares and wear leveling algorithms that attempt to spread the wear uniformly over the entire flash memory rather than concentrating it in the same blocks. However, these techniques may increase the cost and decrease the performance of solid state drives.

The examples below describe various solid state drive (SSD) architectures, methods, and principles. These SSDs incorporate flash memory for nonvolatile storage and are designed to have an order of magnitude longer lifetime than conventional SSDs and operate at full bus speeds despite the limitations of the flash memory.

Illustrative Flash Memory Module

Figure 2:
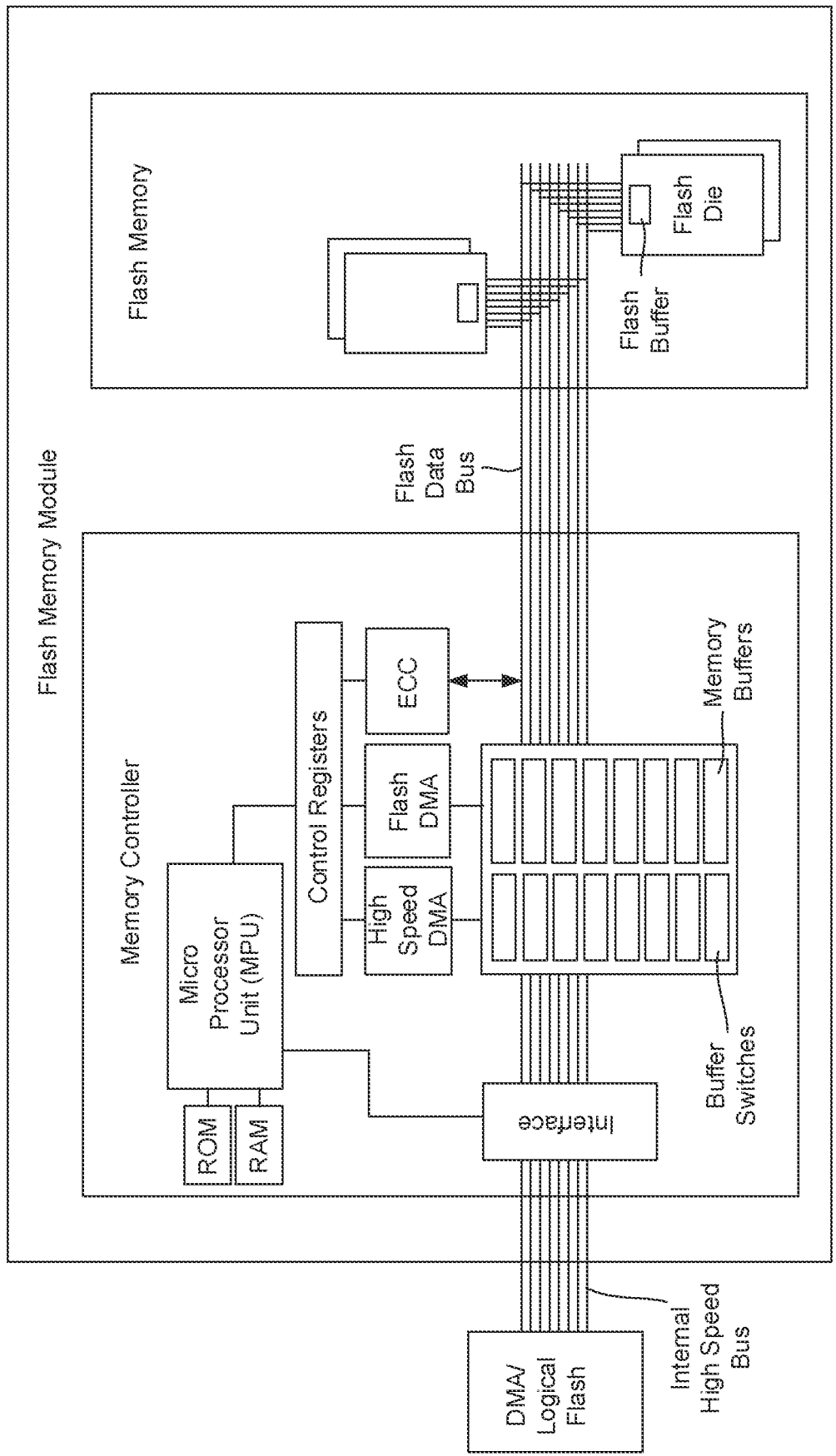
FIG. 2 is a block diagram of a flash memory module, according to one example of principles described herein.

FIG. 2 is a diagram of an illustrative flash memory module. As discussed above, flash memory is nonvolatile computer storage that can be electrically erased and reprogrammed. As discussed above, flash memory has a high resistance to mechanical shock, small foot print, relatively fast read times that are comparable to dynamic Random Access Memory (RAM), is energy efficient, and can store data for years without power. Flash memory is used in a variety of applications, including personal computers, mobile devices, digital cameras, video games, scientific instrumentation, industrial robots, medical electronics, and other devices. Flash memory has several limitations, including slow write times and limited lifetime. For flash memory, the write times are typically order of magnitude greater than the read times. The lifetime of various types of flash memory typically ranges from 1000 to 3000 erase cycles. The erasure of the flash memory causes incremental damage that eventually leads to failure of the memory mechanism in the flash memory.

The illustrative flash memory module shown in FIG. 2 includes a number of NAND flash die. The memory controller includes a processor, a small amount of Random Access Memory (RAM), a small amount of Read Only Memory (ROM), and a number of memory buffers. For example, the memory controller may be based on a 6502 processor, with 20 kilobytes of processor addressable RAM, 40 kilobytes of ROM to store operating code, and eight memory buffers. The memory controller accepts data from an external bus, accumulates the data in the buffers, and writes the data to the NAND flash die. The external bus may be a USB bus or a high-speed internal bus.

The memory controller also includes a high speed Direct Memory Access (DMA) and a flash DMA. In general, a DMA protocol includes an address counter that automatically and progressively increments the memory addresses during data transfers. The DMA protocol also includes a counter that keeps track of the number of bytes transferred. To begin a DMA transfer, two commands are given, the memory location to start at and a count that tells the DMA how many bytes to transfer. The DMA independently transfers the data starting at the designated memory location until the count is exhausted. The purpose of the DMA protocol is to allow full speed transfers to and from a memory without the need for external inputs other than the memory clock and enables. This entirely eliminates the requirement for the microprocessor to directly be involved with data transfers. This enables higher transfer speeds because the data transfer is not limited by the microprocessor speed or interrupted when the MPU is redirected to a different task.

In this application there are two independent DMAs with different functionality. The high speed DMA ("bus DMA") controls the transfer of data from the high speed bus to a bank of memory buffers and the flash DMA transfers data to and from the flash. In one embodiment, data transfer from the high-speed bus to the memory buffers is the highest priority process and is interrupt driven. Data movement to or from the flash is done with polling because the process can be interrupted with little disturbance. Further, the polling generates positive control on the timing signals to the flash memory.

The use of two separate DMA modules (the high speed DMA module and the flash DMA module) provides several advantages. First, by including two separate DMA modules, data can be simultaneously written to and read from the memory buffers. Additionally, the separate DMA modules can operate differently and be controlled differently to facilitate data transfers. For example, the high speed DMA may be operating on a high speed clock and write data to one memory buffer while the flash DMA is reading data out of a different memory buffer at slower speeds. In contrast, the flash DMA may operate on a flash clock and be operated by polling. Additionally, the flash memory module generates, stores, and uses error correction code (ECC) to automatically recover data that has a limited number of errors due to write and/or storage failure. In addition to the data received on the high speed bus, the flash memory module also writes additional information to the flash memory including wear number, logical record number, update number, and other data. This process is described in greater detail below. The registers can run at various clock rates and be switched between various functions.

The structure and architecture given above is only one example of a flash memory device. A variety of other structures could be used. For example, larger memory buffers, larger sector sizes, more memory buffers, different numbers of memory buffers and different numbers flash die could be included in the architecture.

Illustrative Solid State Drive Architecture

Figure 3:
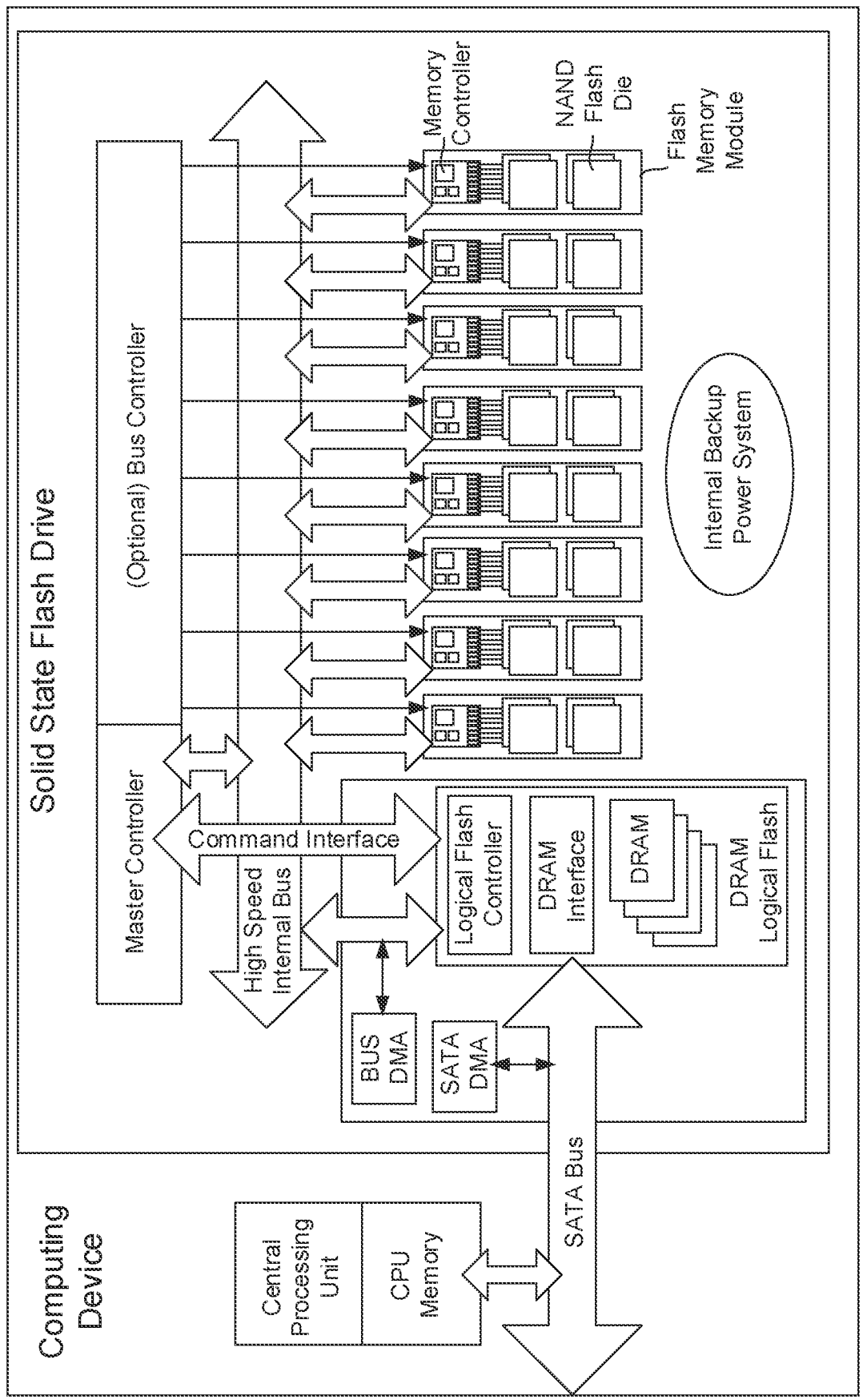
FIG. 3 is a block diagram of an illustrative solid state drive architecture that incorporates flash memory modules shown in FIG. 2, according to one example of principles described herein.

FIG. 3 shows an illustrative example of a SSD architecture that incorporates a number of flash memory modules such as those described above with respect to FIG. 2. The SSD architecture is capable of sustaining SATA data rates and mitigating the limited lifetime of the NAND flash memory. In this example, a central processing unit (CPU) external to the SSD is connected to a SATA bus. The SSD drive accepts data input, commands, and outputs data via the SATA bus. This output data is initially stored in DRAM logical flash. The DRAM logical flash includes a DRAM controller and a large bank of Dynamic Random Access Memory (DRAM). The DRAM logical flash is connected to a high speed internal bus. In addition to the connection to the DRAM logical flash, the high speed internal bus is connected to a bank of flash memory devices, and a master controller. In some embodiments, there may be a separate bus controller that controls operation of the high speed internal bus. Alternatively, the functionality of the master controller and bus controller can be combined so that the master controller performs the functions of the bus controller. The high speed internal bus allows bidirectional communication between any of these entities. The bus controller (or master controller acting as a bus controller) independently selects the device that is going to receive or transmit data. This allows the data flow to be controlled for each device individually (and in some examples sequentially). For example, the DRAM controller can accept data from the SATA bus while the bus controller is transferring data out of the DRAM and into the flash memory devices. These simultaneous operations allow for more efficient operation and higher overall throughput. Flash operations can have temporal variations so the final synchronization of the data is done by the master/bus controller managing the high speed bus and coordinating with the logical flash controller. This balancing approach allows SATA interface or other interface to run at full bus speed when reading or writing to the SSD.

Controllers

The SSD architecture uses a number of controllers to manage internal data flow. The master controller receives instructions from the central processing unit of the computing device and manages the operation of the solid state flash drive to perform the instructions. The master controller directs the operation of the bus, flash memory controllers in each of the flash memory devices, and logical flash controller. In one implementation, each of these controllers is a simple microprocessor system as described. According to one illustrative example, each of the controllers (master controller and optional Bus controller, DRAM controller, eight flash controllers) is a completely independent system with its own microprocessor, ROM for storing code, RAM, and bank of registers. For example, the controllers may be based on a 6502 processor combined with 32 kilobytes of RAM and 24 kilobytes of ROM. The logical flash controller manages data transfer into and out of the DRAM by controlling DMA transfers and interfacing with the logical flash controller. The logical flash controller manages the DRAM logical flash under the direction of the master controller. The master controller manages the transfer of data between the DRAM and flash memory. The individual flash controllers deal with the page mode structure for the flash memory, error correction, and wear leveling. The memory controller in each of the flash memory devices manages transfer of data between the high speed internal bus and the NAND flash die.

The use of multiple internal controllers provides a number of benefits. The controllers can perform dedicated functions that are specifically adapted to the device they are controlling while flexibly coordinating with other controllers. For example, the memory controllers may interface with the high speed bus at a first clock speed and then manage data being written to the NAND flash die at a different clock speed. Additionally, the memory controllers may signal the master controller when they have completed a task. This allows the master controller to intelligently allocate resources to maximize data transfer rates.

Direct Memory Access Interfaces

Direct Memory Access (DMA) interfaces manage the transfer of data for each controller that is connected to a bus. As discussed above, DMA is a hardware implemented protocol that allows hardware subsystems within the computer to access system memory independently of a controller. The controller can initiate a transfer, do other work while the transfer is in progress, and receive a feedback from a DMA controller once the transfer is complete. For example, a SATA DMA handles transfer of data from the SATA bus to the DRAM Logical Flash. A bus DMA handles transfer of data between the DRAM Logical Flash and the high speed internal bus. Similarly, DMA interfaces between the high speed internal bus and each of the flash memory devices manage data transfer into and out of the flash memory devices.

Using DMA techniques maintains the speed for both writing the flash and transferring data to/from the interface. As discussed above, a DMA protocol includes an address counter that automatically and progressively increments the memory addresses during data transfers. The purpose of the DMA protocol is to allow full speed transfers across an interface without external inputs other than the memory clock and enables. This entirely eliminates the requirement for a microprocessor to be directly involved with data transfers and enables higher transfer speeds because the data transfer is not limited by the controlling processor or interrupted when the controlling processor is redirected to a different task.

To begin a DMA transfer, the controlling processor may load control registers with addresses, a count for the number of DMA operations and other enabling functions. The data transfer then occurs as a function of the parameters in the control registers. The DMA may be configured such that other data may be added during the transfer such as error correction data, logical records, and housekeeping functions. The DMA protocol can trigger a variety of responses to signal the controlling processor that a data transfer is complete or to provide a status update. This allows the data to be accessed as soon as the DMA transfer is complete. Additionally, the use of interrupts to signal the status of data transfers allows for polling style parallel distribution of data between multiple memory storage components within the SSD.

DRAM Logical Flash

The DRAM in the DRAM logical flash uses arrays of capacitors to store data. The capacitor may be either charged or discharged. These two states represent the two values of a bit. Since the capacitors leak charge, the state of the capacitor eventually fades unless the capacitor charge is refreshed periodically. This refreshing occurs over intervals on the order of 10 to 100 milliseconds. DRAM is very simple, has negligible read/write cycle wear, and can be very densely packed onto a die. Additionally, DRAM provides extremely fast write and read times (on the order of 10 to 100 nanoseconds). The operation of the DRAM is controlled by a DRAM controller. In this example, the DRAM has a total capacity of 8 Gigabytes of Double Data Rate type three Synchronous Dynamic Random Access Memory (DDR3 SDRAM). In other implementations, the DRAM may have larger (e.g. 16 GB Gigabytes) or smaller amount of memory. For power management, the DRAM can operate at a clock speed of 800 Megahertz. However, any suitable clock speed and amount of DRAM can be included in the design. The DRAM logical flash stores files in the same way as flash and responds to flash commands. Further, the DRAM logical flash uses a file allocation table, updates logical records, combines files, and is attached to a SATA bus.

DRAM logical flash is not cache for a number of reasons. For example, cache is an alternative location for the CPU to look for data. If the data isn't in the cache, the CPU accesses the underlying nonvolatile memory. In contrast, the DRAM logical flash is the only memory in the SSD that is directly accessible to CPU. The actual NAND flash is under control of a master controller and is not directly accessible to the CPU. The DRAM logical flash acts as a gatekeeper between the CPU and the NAND flash. By separating the NAND flash from the CPU instructions, the NAND flash is not subject to numerous peculiarities of the operating system, including frequent writes. This allows the operating system to run without modification while protecting the lifetime of the NAND flash.

Data and files are only stored to the DRAM logical flash until deleted or no activity is observed. In general, data in the DRAM logical flash is organized by logical record for the user control of the data and referenced by the FAT table to control the operations of the various data records. The movement of data out of the DRAM logical flash to the flash memory is governed only by the master controller. The master controller may make decisions about when the data or files are moved out of the DRAM logical flash based on a number of factors, including the lack of use of the file.

In some instances, files and/or data may only be stored on the DRAM logical flash and never transferred to the flash memory. For example, a temporary data file may be created for a transient operation (such as a search). In other examples, a file may be created for a letter or email that will be sent to another system or stored by a remote system. When the file is sent to the remote system, the file can be deleted.

Cache appears to the CPU to have exactly the amount of physical memory that is actually present in the cache. In contrast, the DRAM logical flash appears to have a capacity that is much greater than the physical capacity of the memory that makes up the DRAM logical flash. The DRAM logical flash appears to have a capacity that is equivalent to the total working nonvolatile memory of the NAND flash.

Cache appears to the CPU to be volatile memory. In contrast, DRAM logical flash appears to be extremely fast nonvolatile memory. When a CPU writes data to cache, the CPU doesn't assume that the data is actually in nonvolatile storage. The CPU continues to manage the data flow until the data is actually stored in the nonvolatile storage that follows the cache. When power is unexpectedly lost to the cache, the data in the cache is lost and the CPU must recover without it. All cache transactions either fail or are written to nonvolatile flash memory increasing the wear and delaying the system.

In contrast, the CPU and operating system assume that the DRAM logical flash is the nonvolatile memory storage. The DRAM logical flash reports that data written to it is stored on the nonvolatile flash memory even through it actually stored in the DRAM logical flash. When the power to the SSD is lost, the CPU correctly assumes the data stored in the DRAM logical flash is stored in nonvolatile memory. This is correct because the SSD has a self-contained and self-powered system for dumping the data in the DRAM logical flash to NAND flash. In one implementation, the NAND flash is configured with an extra provision of spares to accommodate a data dump of all the data that can be stored in the DRAM logical flash.

Cache is designed to minimize access time to data stored in a slower memory. In typical cache operations, the cache writes data as quickly as possible to the nonvolatile storage but continues to hold the data written to minimize access times. In contrast, the DRAM logical flash is designed to minimize writes to the underlying memory. The master controller in the SSD only targets data that is not being used for transfer from the DRAM logical flash to the flash memory.

High Speed Internal Bus

As discussed above, the high speed internal bus allows bidirectional communication between any of these components connected with it. In one example, the master controller individually directs data to the memory controllers over the high speed internal bus. To implement the write transfer to the flash, the logical flash controller/interface connects the DRAM logical flash to the high speed internal bus and uses DRAM DMA to make the transfer to a designated file location. Using this technique, data could be directly transferred from the CPU, through the DRAM logical flash, to the flash memory. For example, high speed internal bus may be 8 bits wide and capable of operating at speeds of at least 400 megabytes (MB) per second. Data transfer rates over an 8 bit bus operating at 400 megahertz (or higher) would be approximately 400 megabytes per sec.

Flash Memory Devices

As discussed above with respect to FIG. 2, each of the flash memory devices includes a memory controller and a number of NAND flash die that make up the flash memory. The flash memory is divided into sectors, pages, blocks and planes. In this example, a sector is approximately 512 bytes with additional room for header and error correction code (ECC) information. In other implementations, the sector may be larger. A page is a group of sectors, a block is group of pages, and a plane is a collection of pages. In one example, a page includes 8192 bytes for data and additional room for header information. A block may be a group of 256 pages and a plane is a group of 2096 blocks. A device may include any number of planes. For example, a 32 gigabyte device may include 2 planes or 8,192 blocks. A 256 gigabyte device may include 16 planes or 65,536 blocks. Typically when a non-recoverable or repairable flash data error occurs in a sector, the entire block is marked as bad. However, using a page mode controller, only the offending page is marked as bad and is mapped around. This is further described in U.S. Pat. No. 8,122,319 to Charles I. Peddle, which is hereby incorporated by reference in its entirety.

As discussed above, an entire block of flash memory is traditionally considered unusable when a single bit in one of the pages in the block is inoperable. Consequently, a defective bit may reduce the storage capacity of the flash memory by 128 KB or more. When multiple defective bits are dispersed among many blocks, a flash memory may fail to meet capacity standards and may be discarded. However, many completely functional pages remain within each failed block. As shown below, by identifying inoperable pages rather than inoperable blocks, much of the storage capacity of the flash memory may be reclaimed.

Various commands are used to access a flash memory. For example, read and write commands to a flash memory may operate on a single page. Erase commands, however, affect an entire block. With the exception of block erase operations, nearly all operations may be performed on a single page. Once the pages in a block are erased, they may be selectively written in a manner that avoids inoperable pages.

Although the flash memory itself may not include logic to select only operable pages within a block, a memory controller may be configured to identify, select, and operate on only the operable pages. The memory controller may be implemented as a semiconductor chip separate and distinct from the flash memory. The memory controller coordinates the transfer of data to and from the flash memory. The memory controller processes requests from external devices by sending appropriate commands and memory addresses to one or more flash devices. According to one embodiment, the memory controller may generate chip select, block select, row select, and column select signals to transmit to one or more flash memories. The memory controller may also monitor control signals, status signals, timing constraints, and other aspects of data transfers to and from a flash memory device.

The memory controller may translate a virtual memory address (such as a logical record) from an external system to a physical address on one or more flash memory devices. A memory controller may receive a query from a processor requesting certain data. In response, the memory controller may determine the corresponding block, page, and byte where the requested data is physically stored in one or more flash memory devices. The memory controller may then issue the correct sequence of control signals and memory address values to the flash memory device to retrieve the requested data.

Similarly, the memory controller may translate write requests into an appropriate sequence of block erase, address select, and write commands to store data on a flash memory device. In effect, the memory controller may allow various systems and components access to the storage of the flash memory devices while concealing the complexity of the page mode interface with the flash memory devices. For example, when previously written data in a flash memory device is updated, the old data as well as the new data is written to a new block and the old block is erased. The memory controller may generate and execute the correct sequence of operations to carry out the storage operation. The memory controller may also identify which blocks contain a sufficient number of operable pages to complete an operation. Where data is transferred from a source block to a destination block, the destination block is selected to contain at least the same amount of storage capacity as the source block, but the destination block may still include one or more inoperable pages or sectors.

To track the number of operable pages in within each block, the memory controller may build a "good page" table, a "bad block" table, a table that has a "good" or "bad" designation for each page of the memory, or other indicator. The "bad block" table may identify inoperable pages and thus identify operable pages indirectly. The memory controller or other element may then be configured to read and write to any page except those listed as inoperable. An indication of operable pages may include one or more references, pointers, addresses, tables, lists, sets, identifiers, labels, signs, tokens, codes, or equations, or other information that may allow an operable page to be identified.

In one embodiment, a table of operable pages may be stored in the designated block or blocks of the flash memory. For example, thorough testing of an entire flash memory device by a memory controller may occur when an indication is incomplete, unreadable, missing, or damaged. This type of testing may occur when the memory controller and/or flash memory devices are powered on for the first time. Additional tests, for example by an error correction code (ECC) module may be performed during operation of a flash memory device to detect pages that fail during use. Error detection methods used during flash memory operation may include, but are not limited to, generating checksums, comparing checksums, performing redundancy checks, generating parity values, performing parity checks, and executing other error detection algorithms. If a failure is detected in a page, the ECC module may alert the flash controller that a failure occurred or that an operation in progress was unsuccessful. The flash controller may then repeat the operation in a new page or otherwise correct the error. If a page has recoverable repeatable errors then that page is discarded. The master controller than takes appropriate action to exclude these pages by their designation in the table. From this point on the defective page is not used.

When one or more indications are updated, internal operations and data transfers may be completed to hide failures and reconfigurations from systems accessing the flash memory devices and ultimately from a human user of the flash memory devices. Consequently, a failure will not disturb the overall experience of a user and will not require compensation by outside systems. According to one embodiment, this may be accomplished with spare blocks, pages, and/or sectors that may be reserved during an initialization, testing, or other phase. As failures occur, data and addresses for failing blocks, pages, and/or sectors may be replaced by spare blocks, pages, and/or sectors. One or more indications may then be updated to reflect the new logical memory addresses and physical memory addresses for the data. In the example depicted in FIGS. 8-21, substitute blocks are not required nor used.

In summary, page based failure management in a flash memory controller allows a memory controller to access a "good page" table or other indicator of the functionality of each of the pages within flash memory blocks. The memory controller can then execute read, write and erase commands utilizing the operable pages in each block, even if the block contains one or more inoperable pages. The use of page mode allows for a significant extension of the life of the flash memory. Further, the use of page mode allows for more efficient use of flash memory that has lower lifetime ratings and/or a higher number of errors. Rather than discard these flash memory chips with errors, these chips can be effectively used and have an extended lifetime in a device that implements page mode failure management as described above.

The memory controller accepts data from the high speed internal bus using DMA protocols, accumulates the data in its internal buffers and writes the data to the NAND flash die. Each flash memory module is configured to provide data transfer speeds of approximately 40 megabytes per second to and from the flash die. These parallel flash memory modules may have a number of configurations, including those described in U.S. Pat. App. No. 61/774,175; entitled "High Speed USB Controllers," to Charles Peddle, which is hereby incorporated by reference in its entirety. For example, there may be parallel eight flash memory modules. In one implementation each of the flash drives includes four flash dies. Each flash die includes 8 Gigabytes of storage, resulting in a total flash storage of 256 Gigabytes. These drives are configured to operate in parallel, providing approximate transfer rates of 320 Megabytes per second for data writing. Reading data from flash memory is significantly faster than writing data to the flash memory. Consequently, the flash memory modules may exhibit correspondingly higher data transfer rates during reading operations.

Moving Data Between the CPU Memory, DRAM Logical Flash, and Flash Memory

Various methods may be used to transfer data between the CPU memory, DRAM logical flash, and flash memory. Each of the methods for transferring data is described in more detail in the figures and description below.

As shown in FIG. 3, the CPU and CPU memory are connected to the DRAM logical flash in the solid state drive by the system bus (SATA bus). The DRAM logical flash is connected to the flash memory by a high speed internal bus. As discussed above, the movement of data between the DRAM logical flash and the flash memory is independently managed by the master controller. The master controller may act in response to commands received from the CPU, but CPU has no direct control over transfers to the flash memory and is unaware that these transfers occur.

The system can implement a variety of data transfers between memories to accomplish specific objectives. In general, the computing device sends commands about data collections called files. The commands are quite simple: read this file, write the file, or update an existing file. The command comes to the SSD as SATA commands which are interpreted by the master controller. The data from the external bus is streamed into the logical flash at full speed and the logical flash controller is directed to store or replace previous versions of the associated data file. The external bus may be a SATA bus, USB bus, or any other appropriate protocol or technology. When the computing device wants to read back a file or part of a file, the read command is initially given to the logical controller which is directed to retrieve the desired data from data stored in its memory. If the data is not in the DRAM logical flash, it is stored there under direction of the master controller from the flash devices and then transferred at high speed to the computing device. This data is maintained in the DRAM logical flash because it is likely to be updated and reloaded.

The present disclosure describes five different data transfer techniques. A first technique is data transfer using logical records which is described in greater detail in FIGS. 4, 5, 6A, and 6B. The processor deals with logical records while the controllers deal with physical records. A translation table is used to convert/index the relationship between logical records and physical records. The translation table used for the SSD differs from the translation tables used in hard disk storage systems. This data transfer technique uses logical records to index and store data from the CPU memory to the working area of the DRAM logical flash as directed by the CPU and to subsequently store data files that are not being used to the working area of the flash memory under direction of the master controller. The master controller also directs retrieval of the data out of the working area in the flash memory into the working area of the DRAM logical flash for direct retrieval by the CPU memory.

Figure 7:
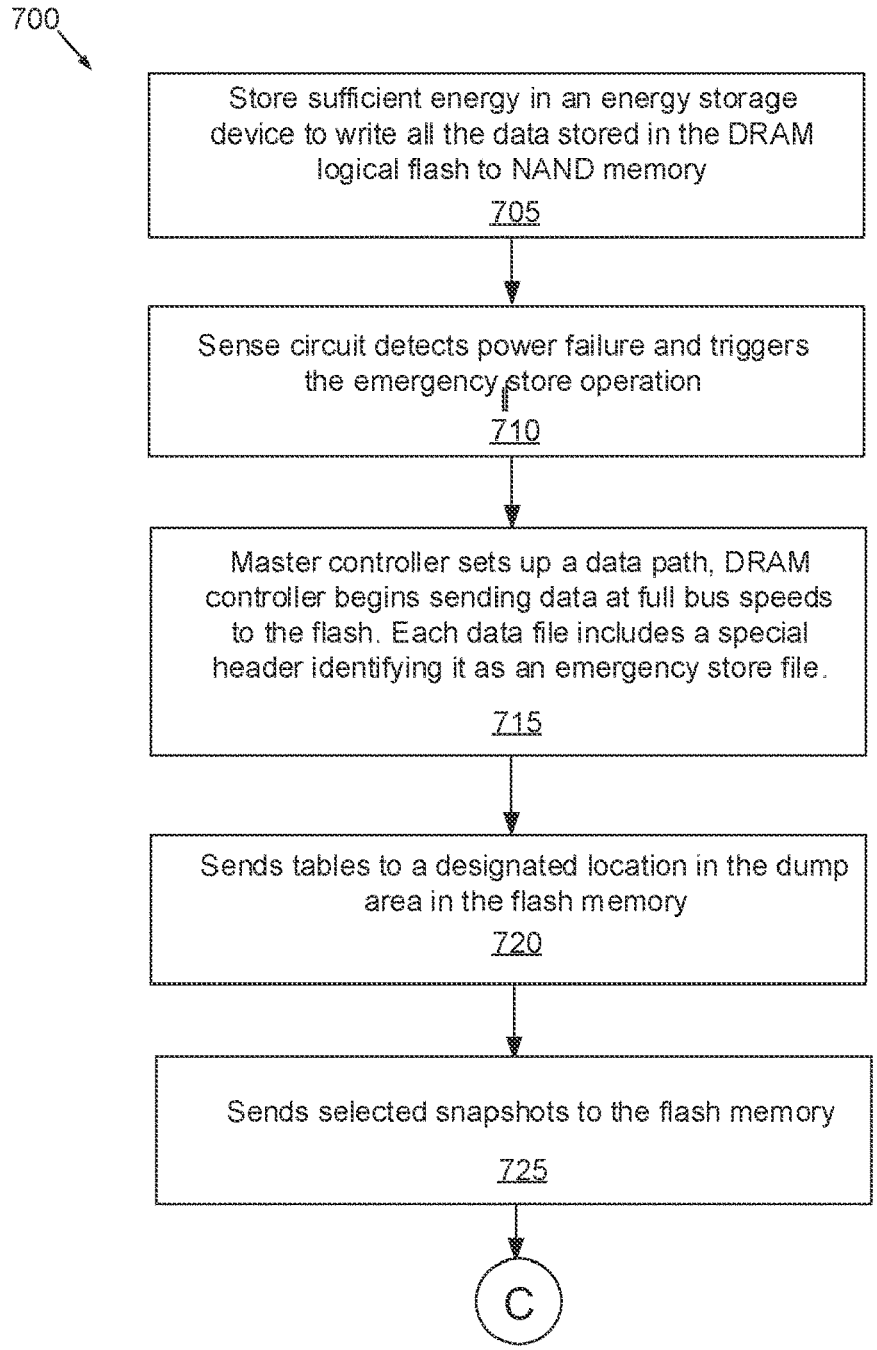
FIG. 7 is a flow chart of a method for data dump/recovery, according to one example of principles described herein.
Figure 7:
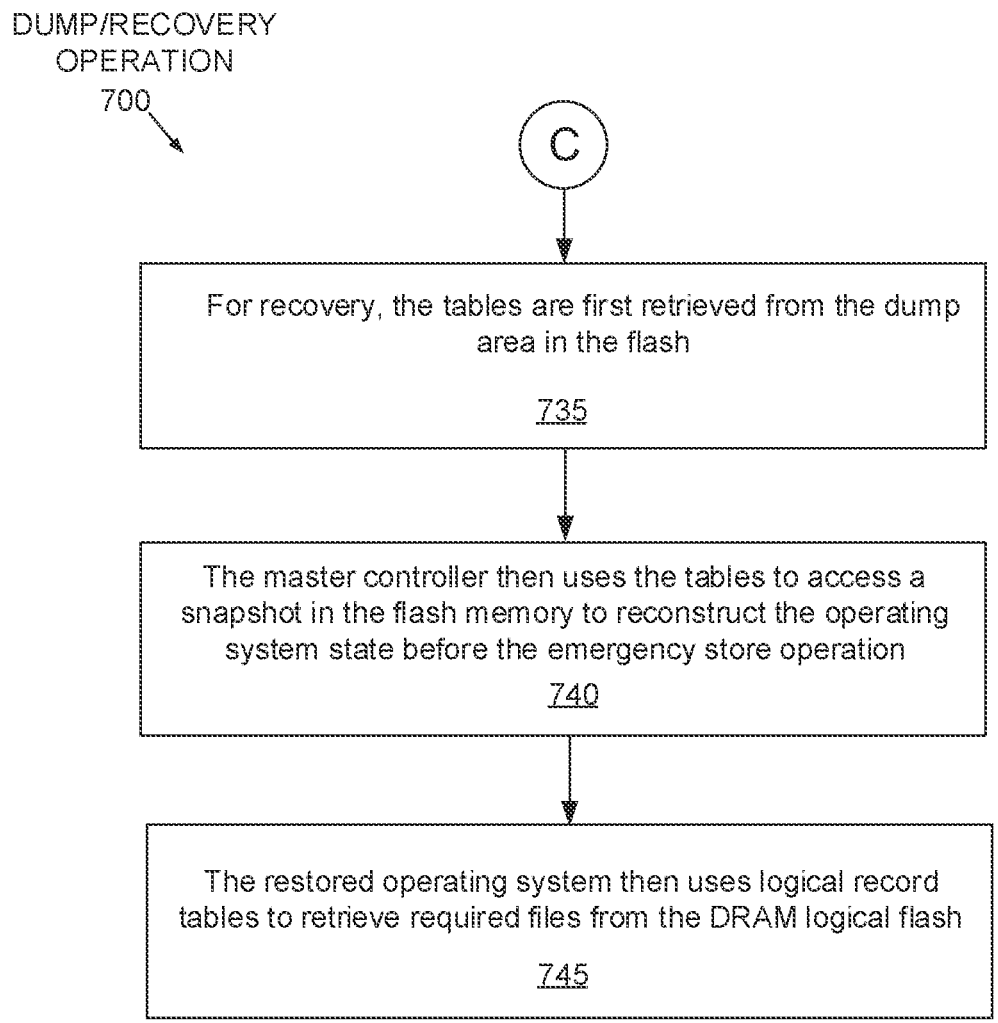

Another data transfer/storage technique is a dump/recovery process described in more detail in FIG. 7. The dump/recovery process occurs on power down or power loss. The dump/recovery process moves data out of the DRAM logical flash into a specified dump area in the flash memory. To recover, power is restored to the computing device and the data in the dump area is transferred back into DRAM logical flash and then to the CPU memory.

Although the DRAM logical flash is illustrated as an integral physical part of the SSD, in some implementations, the DRAM logical flash may be constructed in the CPU volatile memory, with the CPU providing the control of reading, writing, and flash operations of the DRAM logical flash. However, in conventional CPU/CPU memory systems, there is no mechanism to maintain the power while dumping the data to the volatile CPU memory when the power goes down. To successfully implement the principles discussed herein, the computing device could have an independent power source to allow the data stored in the CPU memory to be dumped from the DRAM logical flash to the flash in the solid state drive.

Writing Files to the Solid State Drive

During ordinary operation the CPU uses the same protocols to write files to the SSD that it would use to write data to a typical hard drive. For example, the CPU may use the technique of writing and reading to the SSD using logical records. The internal operations of the SSD drive are independent from the CPU operations and are hidden from the CPU. As discussed above, the SSD drive accepts the data from CPU, but internally manages and stores the data in a unique manner that overcomes speed and lifetime limitations of the NAND flash memory. However, the SSD drive controls the interface between the SSD drive and the CPU so that it fully appears to the CPU that it is writing to hard drive or ordinary flash drive. Consequently, the SSD is a plug and play memory storage device that can be used in any of a variety of computing devices and transparently provides superior data transfer rates, long lifetime, and low power consumption.

Figure 4:
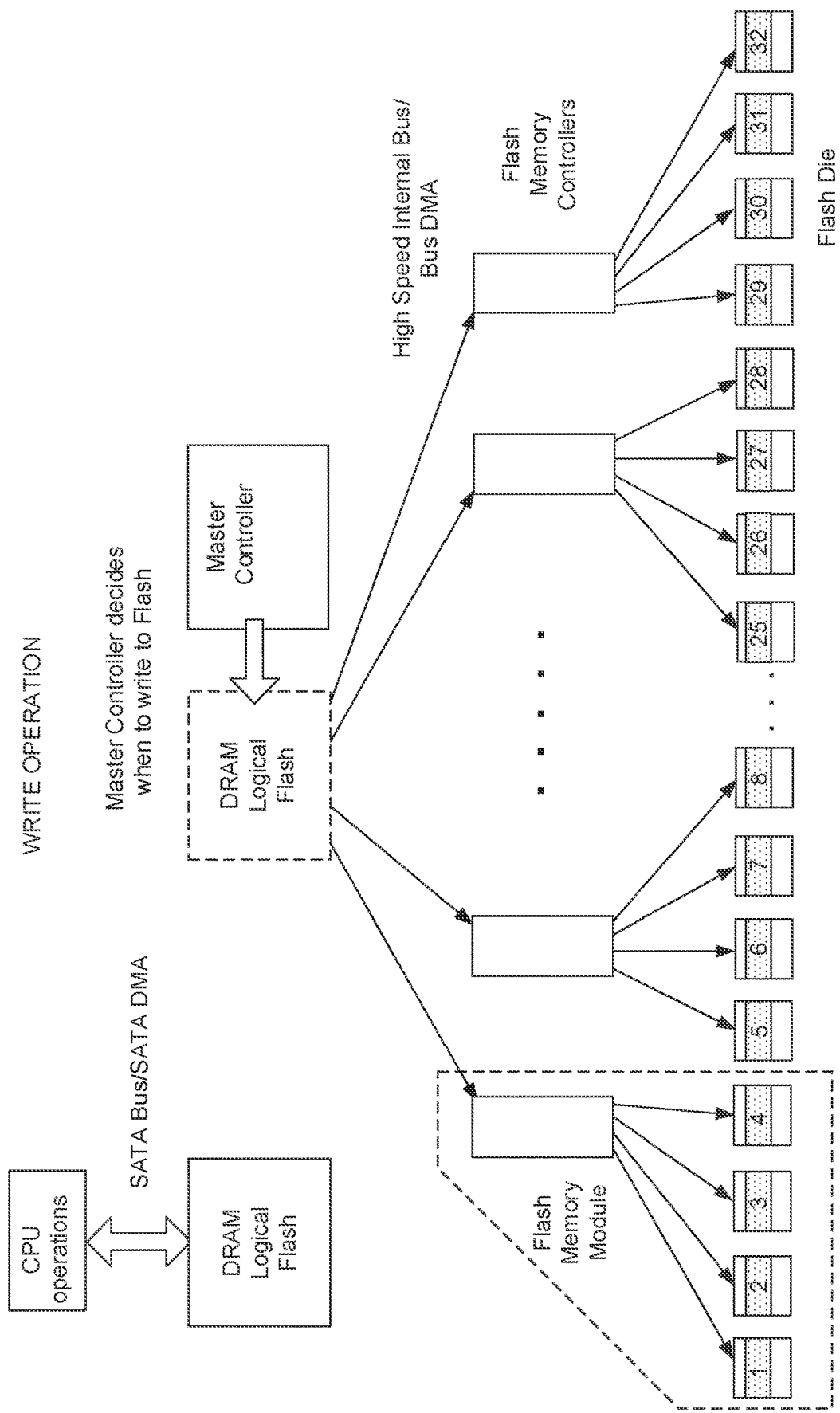
FIG. 4 shows data flow during writing of data to the solid state drive, according to one example of principles described herein.

FIG. 4 is a diagram that shows illustrative data flow through the SSD architecture that allows for extremely fast data transfer rates. Data is initially transferred by CPU operations over the system bus. For example, the system bus may be a SATA bus. The data is transferred off the system bus using a DMA process to the DRAM logical flash. As discussed above, the DRAM logical flash stores the data for later retrieval by the CPU. The CPU is only aware of the DRAM logical flash, which appears to be extremely fast non-volatile solid state memory with a memory capacity of the flash memory.

If the master controller determines that it is appropriate, the master controller decides to write data out of the DRAM logical flash to the flash memory. There may be any number of flash memory modules within the SSD. For example, the SSD architecture may include eight flash memory modules. For purposes of illustration, FIG. 4 shows only four of those devices. As discussed above with reference to FIG. 3, each of the flash memory devices includes a memory controller with buffers and a number of flash memory die. For example, each flash memory controller may control distribution to four, eight, or sixteen separate die. The distribution of data among a number of flash memory controllers provides a number of benefits including simultaneous writing to multiple flash die. This compensates for the relative slow write times that are inherent in the current implementation of flash memory. The independence of the master controller and various flash memory controllers allows for parallel data transfer with minimal latency. To enable parallel writes and parallel reading operations, a file is striped across the various flash memory die. In FIG. 4 this is illustrated as numbered boxes in each of the flash memory die. When a file is written the master controller sequentially address the individual flash memory controllers, which in turn sequentially address the flash die they control. This results in the file being distributed across the die and various portions of the file being written in simultaneously to different flash die. When the file is retrieved from the flash die, it can be read from the die in parallel. This is shown in FIG. 6A.

Figure 5:
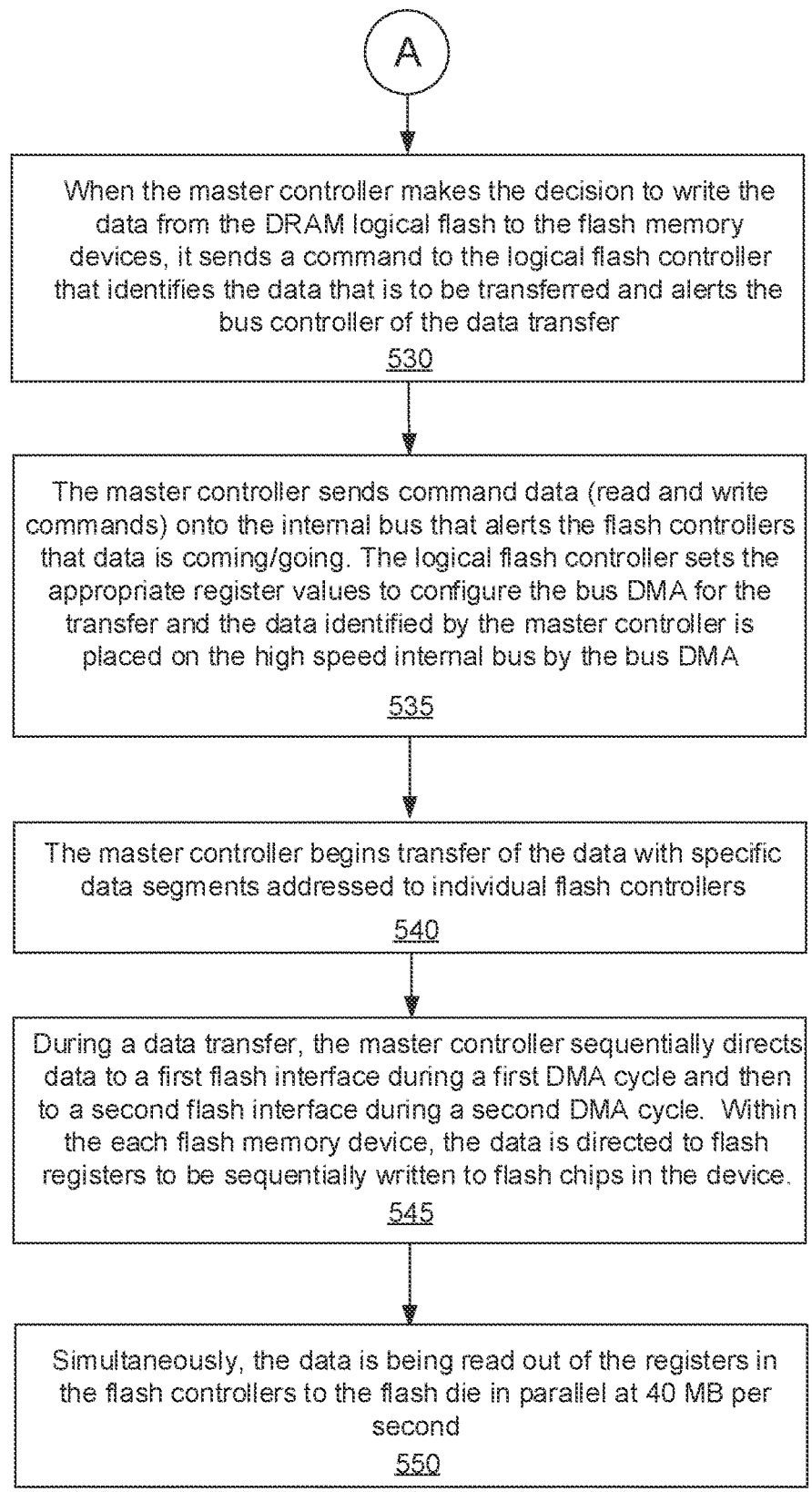
FIG. 5 is a flow chart describing a method for writing data to the solid state drive, according to one example of principles described herein.

An illustrative method for writing files to the SSD is shown in FIG. 5. In a first step, the CPU sends a write command and places data to be written to the SSD on SATA bus (step 505). The write command is transferred to the master controller, which instructs the DRAM controller to accept the data and transfer it to the DRAM memory (step 510). The DRAM controller may be configured to discriminate between commands and other data and send the commands to the master controller over a separate bus. This example, the DRAM controller sends a write commend to the master controller. When the master controller interprets the write command, it alerts the DRAM controller that new data is coming. The DRAM controller looks for the logical records in the command and searches for the logical records in its tables to determine if the data is already contained in the DRAM logical flash. For example, the current logical record maybe part of another bigger file. The DRAM controller is able to determine that the data is already in the DRAM logical flash by searching for the beginning and end logical record for each file. If the current logical record is between the beginning and end logical record for each file, the data is currently stored in the DRAM logical flash and will be overwritten. To allow for mishandled file recovery as described below, the logical record data is written in a new space in the DRAM logical flash with a notation of the address of the replaced file. However, if the logical record is not in DRAM logical flash and represents new data, a new record is created for the new logical record and the data is collected in the DRAM logical flash. When the writing is complete, a File allocation Table (FAT) is updated and sent by the CPU over the SATA interface. In some operating systems, the storage of each FAT table entry can involve multiple, redundant write cycles. If the FAT table is requested from the SSD, the request is serviced from the DRAM logical flash. The FAT tables are stored in the DRAM logical flash and only saved to the flash memory on power down. This can save thousands of erase/write cycles in the flash memory.

The logical flash controller sets up the SATA DMA and manages the transfer of the data into the DRAM logical flash (step 515). As discussed above, the DRAM memory used in the DRAM logical flash is extremely fast random access memory. The combination of DMA transfers, a dedicated DRAM controller, and the extremely fast DRAM memory means that data stored in the DRAM logical flash is easily and rapidly accessible to the CPU at speeds that are typically limited by the SATA bus. The DRAM logical flash is used to store data that is frequently accessed. This insulates the flash memory devices in the SSD from excessive write cycles. The logical flash controller manages the data in the DRAM as flash files, including using flash techniques to consolidate and update the data (step 520). This allows the DRAM logical flash to interface with the SATA bus in the same way as standard flash memory, but at much higher speeds.

There is no temporal correlation between SATA data and the flash data. The flash memory and data stored on the flash memory is not directly accessible to the CPU, but is controlled by master controller. The CPU interfaces only with the DRAM logical flash, with command data being transferred from the DRAM logical flash to the master controller. The logical flash controller periodically evaluates the usage of the data and determines if the data should be written from the DRAM logical flash to the NAND flash memory (step 525). For example, a file that is in use by the CPU may be saved regularly to the SSD drive during the time that the user is working with the file. After the user is finished with the file, the file can be dormant for days or months before it is again accessed. The data stored in the DRAM logical flash is written at specified save points to the NAND flash memory. For example, the data stored in the DRAM logical flash may be transferred to the NAND flash memory when the file is closed or when the computer is powered down. Other save points may occur when the capacity of the DRAM logical flash is mostly consumed. In this case, a file that is less frequently saved can be transferred to the flash memory.

The transfer of data from the DRAM logical flash to the NAND flash memory under control of the master controller will now be described. When the master controller makes the decision to write the data from the DRAM logical flash to the flash memory devices, it sends a command to the logical flash controller that identifies the data that is to be transferred and alerts the bus controller of the data transfer (step 530). The master controller places command data onto the internal bus that alerts/enables the flash controllers so that they can receive/retrieve the desired data. The logical flash controller sets the appropriate register values to configure the internal bus DMA for the transfer and the data identified by the master controller is placed on the high speed internal bus by the bus DMA (step 535). The master controller (or alternatively the optional bus controller) then begins transfer of the data with specific data segments addressed to individual flash controllers (step 540). A variety of techniques can be used to manage the transfer of data over the high speed internal bus. In one implementation, data that is loaded onto the internal bus includes a marker indicating the beginning of the data sequence, a marker indicating the end of the data sequence, and a structure than identifies the component the data is addressed to. Each flash controller watches for its identifier in the data stream and diverts the appropriate data segments to its internal storage. In other implementations, there may be a separate command/enable lines that are connected to each of the memory controllers. When data is intended for a specific flash memory module, the enable line connected to this memory controller is asserted while the enable lines for the other memory controllers are not asserted. This configuration is shown in FIG. 3.

The high speed bus operates on a clock that ensures that data transfer to and from the bus is performed at 400 MB per second. The bus controller directs transfer of the data from the DRAM logical to the flash memory devices at the full data rate of 300+MB per second. During a data transfer, the master controller sequentially directs data to a first flash register during a first DMA cycle and then to a second flash register during a second DMA cycle, and so forth. The master controller distributes the data across the eight different flash controllers sequentially (step 545). The data is sequentially read out of the registers in the flash controllers to the flash die in parallel at 40 MB per second (step 550). The registers (flash memory buffers) that are loaded have their clock switched from the bus speed to the flash speed. Eight flash controllers operating in parallel (at 40 MB per seconds for each) results in an overall transfer rate of 320 MB per second. However, the extra 20 MB per second allows for additional overhead data, such as error correcting code (ECC) to be written into the flash memory. Additionally, there may be a number of additional operations, such extra writes or reads that are performed during maintenance of the flash memory. This additional overhead makes the 40 to 50 MB transfer rates for the eight parallel flash drives approximately equal to the 400 MB per second transfer rates on the internal bus.

The SSD may also have a number of additional features. For example, the SSD may be partitioned into various sections that differing access and security levels. For example, a protected portion of the SSD may be designated for software executables. This protected portion of the SSD may not be directly accessible by the user or by the operating system. For example, the protected portion of the SSD may not be indexed by logical record numbers. Consequently, there is no mechanism for the user or the operating system to access the protected portion. Instead, the protected portion may be available only to the software supplier for loading new software and updating existing software. The protected portion can be addressed by a different technique with special commands that are specific to this type of data. For example, an address that is equivalent to a logical record could be used but be indexed on a different lookup table.

To run the software contained in the protected portion(s), the software could be transferred to a second "read only" section and accessed by the operating system. One of the advantages of this technique is that the software executables could be updated independently of what the user is doing. For example, the user may be using the Windows, operating system and a Microsoft Office® application to edit a document. In the background, the software supplier may be pushing out an update to the Windows® operating system executable stored in the protected portion of the SSD. The user's work is not interrupted. In most user situations, such as document preparation or accessing the internet, there is little or no communication traffic to/from the SSD.

Consequently, the new data can be streamed into the protected portion(s) of the SSD without adversely affecting the performance of the flash drive. The next time the user boots up the system, the new version of the operating system will be loaded from the protected portion of the drive into the "read only" section and transferred to the CPU through the DRAM logical flash. On shutdown or failure of power, there is no need for the computing system to attempt to save these executable files because they have not been changed and are already stored on the protected portion of the drive.

Additionally or alternatively there may be a special section of the drive that is designated for storing snapshots. As discussed above, snapshots are records of the complete state of the computing device at a given point in time. The snapshots allow for recovery of the computing device to that state.

Retrieving Files from the Solid State Drive

FIG. 6A is a diagram of read operations in the computing device. As discussed above, the CPU communicates directly with the DRAM logical flash over the SATA Bus and SATA DMA to retrieve data. When a read command is received, the master controller determines if the data is stored in the DRAM logical flash. If it is, the data is sent from the DRAM logical flash to the CPU. If it is not, the master controller determines where it is stored on the flash memory modules and retrieves it. In many instances, the data may be striped across multiple flash memory modules and multiple die within each module. Thus, a data file may be rapidly retrieved by simultaneously reading the data from multiple die using multiple independent controllers.

Figure 6B:
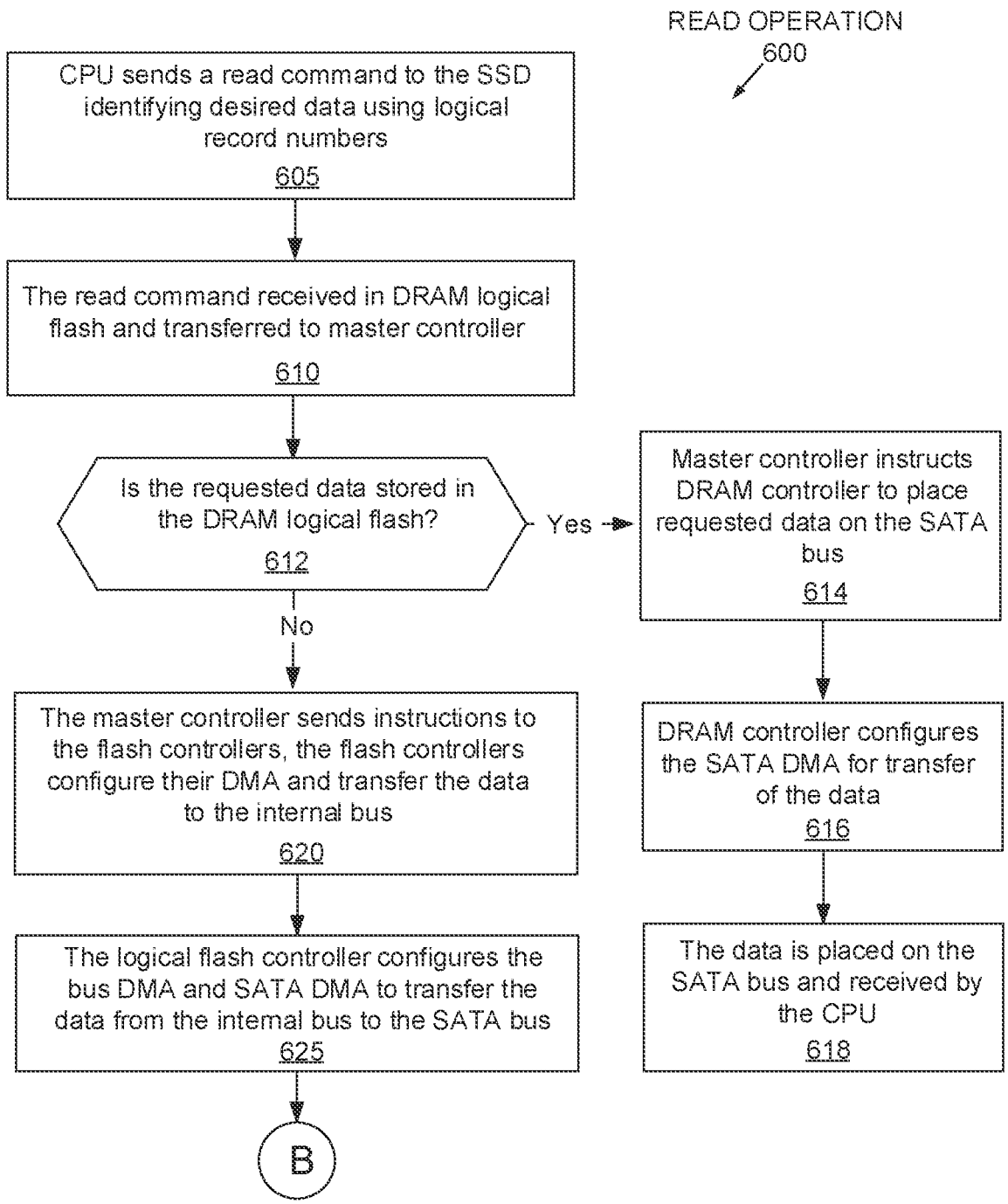
FIG. 6B is a flow chart describing a method for reading data from the solid state drive to CPU memory, according to one example of principles described herein.
Figure 6B:
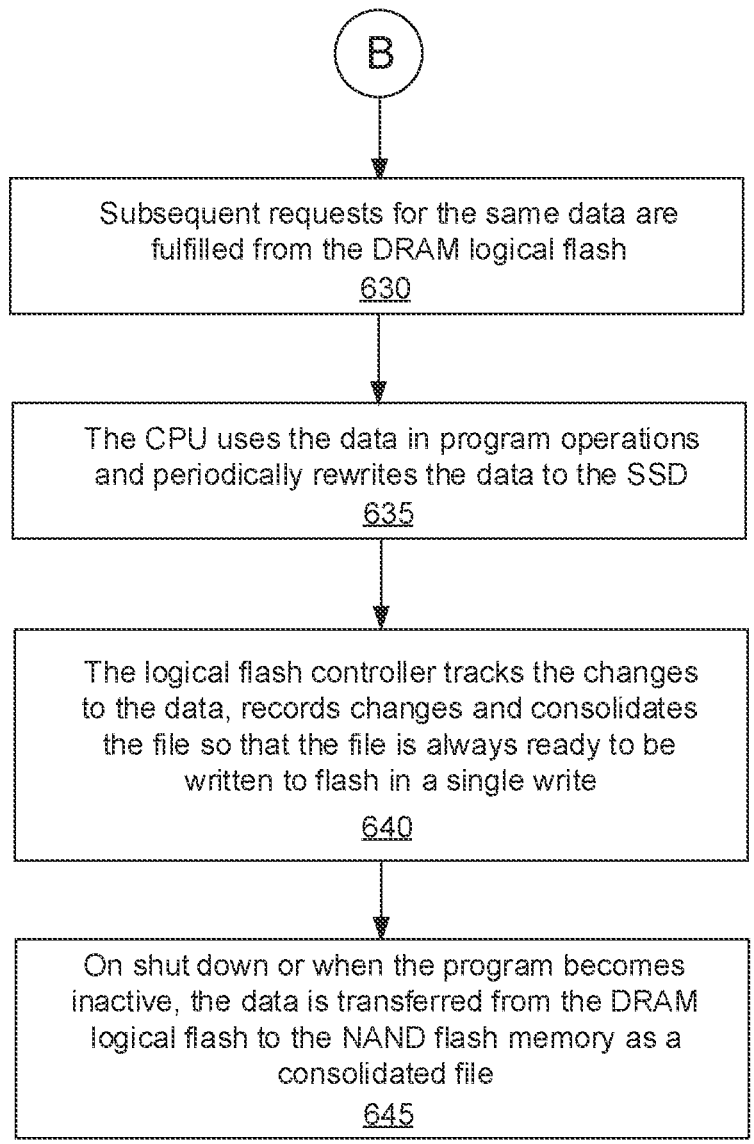

FIG. 6B is a flow chart of an illustrative method (600) for reading data from the flash memory. When a new or updated file is needed, the CPU sends a read command with logical record numbers corresponding to the needed data to the SSD via the SATA interface (step 605). The read command is received in the DRAM logical flash and transferred to the master controller (step 610). For example, the DRAM controller may be configured to recognize commands and send them to the master controller over a special high speed bus, alerting the master controller that a new command has been received. The master controller or DRAM controller determines if the requested data is stored in the DRAM logical flash (determination 612). In some implementations, the DRAM controller tracks all the files as read or written so that, in response to a request from the CPU or master controller, it can send the correct data to the SATA interface. The DRAM controller looks for the logical records in the command and searches for the logical records in its tables to determine if the data is already contained in the DRAM logical flash. If the requested data is in the DRAM logical flash ("Yes"), the master controller instructs the DRAM controller to place the requested data on the SATA bus (step 614). The DRAM configures the SATA DMA for transfer of the data (step 616). The data is placed on the SATA bus and received by the CPU (step 618).

If the requested data is not stored in the DRAM logical flash ("No"), the master controller sends instructions to the various flash controllers to place the data on the internal bus. The flash controllers configure their individual DMAs to make the transfer the data from the NAND flash die to the internal bus (step 620). The logical flash controller configures the bus DMA to receive the data and transfer it into the DRAM logical flash. The logical flash controller also configures the SATA DMA to transfer the data out of the DRAM logical flash and onto the SATA bus (step 625). This transfer from flash memory is made at 300 to 400 megabyte per second speeds. Subsequent requests for the same data are fulfilled by the DRAM logical flash instead of from the flash memory at full SATA rates (step 630). After the transfer of data from the flash memory, the DRAM logical flash allows all subsequent transactions to be performed at maximum SATA speeds (from 300 to 1000 MB per second).

The CPU uses the data in program operations and may periodically rewrite the data to the SSD (step 635). The logical flash controller tracks the changes to the data and consolidates the file so that it is always ready to be written to the NAND flash devices in a single write (step 640). If a new file is received from the CPU and it is an update to that a file that current exists in the DRAM logical flash, all of the logical records associated with the new file are written to a new location in the DRAM logical flash and the new file is written. The locations of the old data file are made available for data contained in future writes. This means that all of the current files are in one place in the DRAM so that they can be efficiently stored in the flash memory upon power down. However, if data in the DRAM logical flash has not been changed (as is the case with many executable files), there is no need to write it back to the NAND flash memory because an identical copy of it is already stored in the flash memory. Changes to the data stored in the DRAM logical flash can be designated using a "dirty bit." If the file stored in the DRAM logical flash is not changed, then the dirty bit remains unchanged and the file is not rewritten to the flash memory at a save point. If the data has been changed while it is in DRAM logical flash this indicated by the dirty bit and the data is written to the non-volatile flash memory before power down of the system (step 645). The use of a dirty bit to track changes to the data stored in the DRAM logical flash allows the system to save time and wear on the NAND flash memory. Throughout the process described above all communications are handled at the logical record level. This makes the data handling process uniform and transparent for all controllers and for the CPU.

Saving Data During Power Down

FIG. 7 is flowcharts of an illustrative method (700) for saving data stored in the DRAM logical flash into nonvolatile flash memory when the machine turns off or loses power. A power capacitor circuit or other energy storage device may also be included in the SSD. The energy storage device stores sufficient energy to write all the data stored in the volatile DRAM memory into the nonvolatile NAND flash memory (step 705). When there is a power interruption to the SSD a sensor in the power supply starts the power down store operation. Additionally, a power down store operation may be triggered by the user or operating system (step 710). During the power down store operation, energy from the power capacitor is used to refresh the DRAM to preserve the data, operate the controllers, transfer the data to the memory controllers, and write the data in the NAND flash memory. The master controller sets up a data path and the DRAM controller begins sending the data via the internal bus to the memory controllers. The data is written into each memory module at full speed. Each data file includes a header that identifies the file as part of a power down store operation (step 715). Each segment of data includes a logical record flag allowing the dump and recovery program to restore the logical flash data exactly as stored. Each of the eight flash memory controllers watches for its logical record flag. When a flash controller identifies its logical record flag, the controller stores the subsequent data in its flash memory (step 720). Because the dump loads the entire flash memory in sequence there are no erase cycles and the write speed can approach 300 MB per second. In theory, the complete 8 GB DRAM memory can be dumped into the flash in 24 seconds. Where the DRAM logical flash is not entirely full or contains files that have not been changed, transfer times can be significantly less. The energy storage device has a capacitive power circuit that is designed to maintain power to the SSD drive for maximum speed data transfer of all data in the DRAM logical flash to the flash memory.

In one embodiment, spare blocks in the flash die are used to store the data during the power down store operation. The spare blocks are already blank, so no erasure delays occur. The spare blocks are distributed throughout each of the die. Consequently, the snap shot is not physically located in one contiguous location. However, the header included in each of the data segments identifies the next data segment. Consequently, by storing the first data segment in a known location, the master controller can recover all of the data files in the same order that they were written (first-in, first-out).

Before the capacitive power circuit is exhausted, pointers can be stored to help with restart. In one implementation, the master processor accumulates a directory of the logical records loaded into the flash. This directory is written on the flash memory in a protected area. When the computing device is restarted, the directory is retrieved from the protected area. The master controller then uses the table to control the operations of the logical flash.

The restore process is the reverse of the power down store process. The operating system senses the restart and causes the snapshots to be retrieved. Any necessary tables or other indexing data are first retrieved from the dump area in the flash (735). These tables may be stored in the memory of the master controller or stored in the DRAM logical flash. The master controller then uses these tables to access the snapshot and reconstruct the operating system state before the power down store operation (740). In one implementation, the first segment of data saved is transferred back to the logical flash, followed by the second segment of data and so forth until all the data is again stored on the DRAM logical flash. This operation restores a cleaned-up version of the data to the DRAM logical flash. The restored operating system then uses logical record tables to instruct the master controller to retrieve required files from the logical flash.

In general, the recovery sequence will be under control of the CPU and operating system. The operating system will instruct the loading of the various files as required. In some implementations, there may be dump references for programs that were open. If the dump references are constant, these are not rewritten. The master controller may maintain a set of bread crumbs for each open program so that the recovery process can reset the code to the last place running. However, not all programs will have bread crumbs but will be loaded as part of the recovery sequence.

In sum, the illustrative SSD architectures described above provide plug and play alternatives to hard disk drives. A number of principles are described above that allow for flash memory to be used effectively as non-volatile storage despite its finite number of erase/write cycles. The use of DRAM logical flash simulates flash behavior, allows all flash commands to be handled at full interface speeds and minimizes writes to the NAND flash memory. As far as the system processor is concerned, it is always writing to flash memory within the SSD. However, the system processor is writing to DRAM which acts as logical flash but without the life time or addressing limitations of NAND flash memory. The DRAM logical flash stores files in the same way as flash and responds to flash commands. Further, the DRAM logical flash uses the FAT table, updates logical records, combines files, and is attached to a SATA bus. Because the DRAM logical flash has a virtually unlimited number of read/write cycles, the system processor and operating system can store as many updates and snap shots as desired. Further, the DRAM logical flash is extremely fast in both reading and writing data. The SSD stores enough power to move the entire data content stored in the DRAM logical flash to flash memory if the external power is interrupted.

The flash controllers in the SSD deal with logical record translations, error detection and recovery, and device optimization. In some embodiments, each of the flash interface devices may control 2 to 4 die for speed and ease of use. The master controller (and in some embodiments the bus controller) controls data transfer between the DRAM logical flash and each flash controller.

As discussed above, the DRAM memory and its controller make up the DRAM logical flash. The data in the DRAM logical flash is managed by the local microprocessors (DRAM controller, logical flash controller, and master controller) to fully appear to be the flash drive. All transactions for all communication with the SATA system occur only through this interface. The DRAM logical flash always reads from and writes to the SATA bus at full SATA speed. Thus, the DRAM logical flash fully appears to be a flash device but has significantly higher data transfer rates. This makes the SSD operation transparent to the computing device, which can function just as if it were writing to a standard flash or hard drive device.

The DRAM logical flash is not a cache and does not function as cache. The files in the DRAM logical flash are written just as they would be in flash, with logical record to physical location mapping and file management. The DRAM controller accepts flash commands and implements them such that CPU always believes it is writing to flash memory drive. However, the CPU is always reading and writing to the DRAM logical flash. The CPU does not directly access the flash memory. The flash is written to only at specific predetermined points determined by the master controller. These points are independent of the CPU commands and cannot be directly triggered by the CPU.

The implementations given above are only illustrative examples of principles described herein. A variety of other configurations and architectures can be used. For example, the functions of the DRAM controller and logical flash controller could be combined into a single controller. In other implementations, the functions of the master controller and bus controller could be combined. The number and type of buses, volatile memory, and nonvolatile memory devices could be varied to accommodate various design parameters and new technologies. For example, although a SATA bus, DRAM memory, and NAND memory are described in the example above, a variety of other bus and memory technologies could be used.

Consequently, the SSD is a drop in replacement for standard hard drives and does not require any programming or physical changes to the computing device.

FIGS. 1-7 describe an SSD architecture for use with a SATA bus; however, different data busses may be used. The physical structure, and protocol associated with different busses, may drive adjustments to the SSD architecture. In any example and for various protocols, the overall principle of writing just to DRAM and not to the flash memory remains the same, but the hardware components are different. That is, different communication busses between the host computing device and the SSD require different hardware components.

As one specific example, the peripheral component interconnect express (PCIe) bus operates very differently than the SATA bus previously described. Specifically, modern computing devices now have the equivalent of four complex processors doing parallel operations in a multitasking environment. The PCIe data bus and the associated communication protocol allows packet transfers on the size of 4 kilobytes. However, because parallel transmission is used, large quantities of data, albeit in small packet sizes, may be transmitted via the PCIe data bus. That is, the PCIe connection is a very high speed bit connection between the computing device and the SSD with transmission speeds of 1 gigabyte per second or higher.

To manage the PCIe data bus, a communication protocol referred to as the non-volatile memory express (NVMe) was developed. The NVMe protocol is used to transfer commands and data between the host computing device and the SSD via a PCIe bus. FIGS. 8-21 describe an SSD that provides the same benefit described above where the central processing unit (CPU) of the computing device interfaces exclusively with the DRAM rather than the flash memory in order to preserve the life of the flash memory and to achieve faster data transmission rates than would be possible by interfacing directly with the flash memory. However, the SSD of FIGS. 8-21 includes hardware components that accommodate a PCIe data bus along with its small data packets and multiple parallel data transmissions. That is, FIGS. 8-21 depict a system that uses available code for both PCIe and NVMe and manages commands and data using the NVMe protocol. The NVMe protocol is a simple interface where commands are received over a command channel, data to be written is passed via a write channel, and data is sent to the computing device over a read channel.

Accordingly, the SSD as described in FIGS. 8-21 reduces wear out and improves write speed by writing all data to the DRAM. In some examples, the SSD includes 2 gigabytes worth of DRAM, spread over any number of DRAM die. As a user generally uses data about megabytes per day, it is unlikely that the DRAM will fill up over the course of a day. However, if and when the DRAM is full to a certain degree, the data therein can be passed to the flash memory as described below.

Such a system has several unique attributes. A first attribute is that all writes are to DRAM and all reads are first checked to see if the data is still in DRAM or if a data block has been transferred to the flash memory. Based on the location of the data, a read command triggers a sequential sending of data to the PC from DRAM or the flash memory based on a logical block address (LBA) order.

The second attribute is that all writes are sent to block tables as well as to DRAM buffers. As an example, each new LBA uses 32k from a 2 GB DRAM. When more than half the DRAM buffer has been used, a set of completely written blocks are moved to the flash memory in a stripe fashion. That is, the full block table is sampled to get blocks matched with 16 die to take advantage of stripe writes. In this example, 256 megabytes of data can be cleared from DRAM with each stripe. Because they are completely written blocks they are less likely to be changed. Moving a single completely written block clears up 16 megabytes of DRAM. In such a fashion, up to 1 GB of DRAM may be freed up. In this example, any LBA that has to be updated will create a new 32k block for that LBA and store the data in DRAM. Accordingly, small new data will be mixed with the already written flash data to make a complete copy for the updated buffer.

The third attribute relates to the "dump" for power down, which is triggered as the hardware signals that the power is to be shut off. In this scenario, there are a set of open flash devices that are written from the DRAM sequentially and that include the return DRAM block address. After all the data is written, using stripe mode, all the internal registers are copied to the flash memory. A power circuit is used that keeps the power on long enough to write all the data to flash. When power is restored, the flash drives are read using stripe mode and the DRAM and registers are restored. These flash die can then be erased for the next dump. The NICKS does its own recovery.

Figure 8:
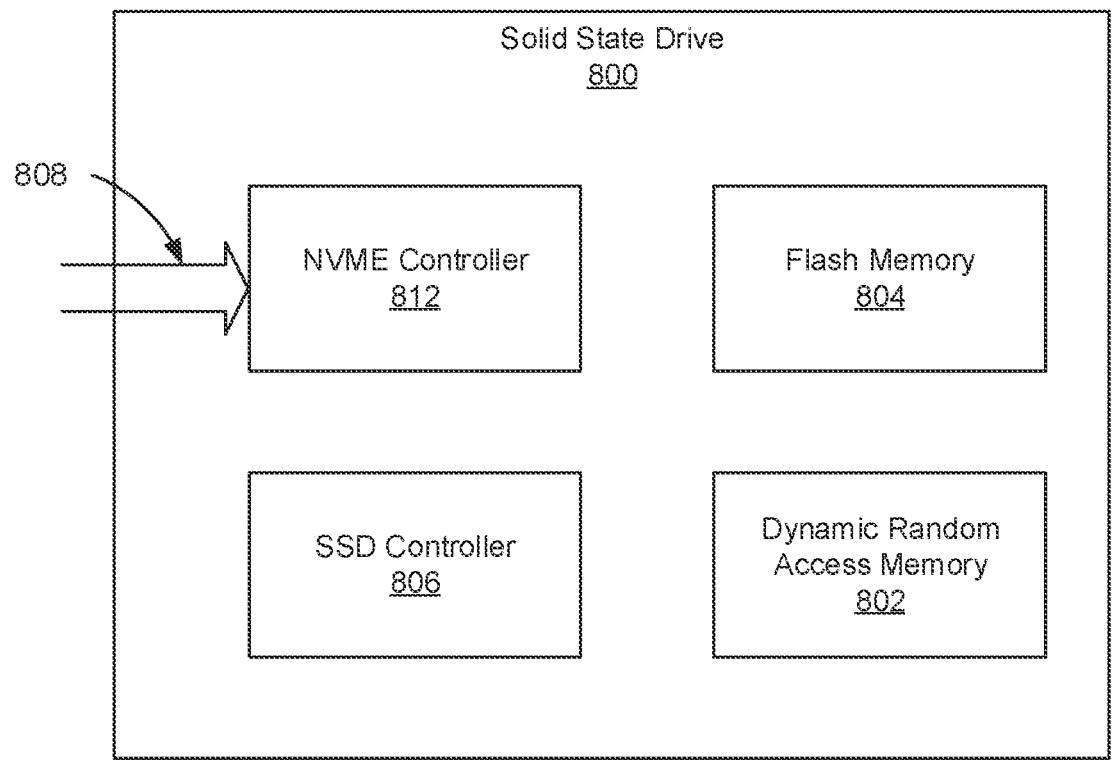
FIG. 8 is a block diagram of a solid state drive with a peripheral component interconnect express (PCIe) bus, according to one example of the principles described herein.

FIG. 8 is a block diagram of a solid state drive (800) with a peripheral component interconnect express (PCIe) data bus (808), according to one example of the principles described herein. As described above, SSDs (800) are non-volatile storage devices that use integrated circuits, such as NAND flash memory (804), to store data. SSDs (800) have a number of advantages, such as high shock resistance, low power requirements, faster access times, and more variable form factors. However, integrated circuits that are used as memory in SSDs (800) have a limited lifetime.

In the example depicted in FIG. 8, the SSD (800) includes dynamic random access memory (DRAM) (802). As described above, DRAM (802) is very fast at reading data and writing data which can be done of speeds of up to 1 megahertz. DRAM (802) uses arrays of capacitors to store data. The capacitor may be either charged or discharged. These two states represent the two values of a bit. Since the capacitors leak charge, the state of the capacitor eventually fades unless the capacitor charge is refreshed periodically.

DRAM (802) has various benefits. For example, DRAM (802) is very simple, has negligible read/write cycle wear, and can be very densely packed. Additionally, DRAM (802) provides extremely fast write and read times (on the order of 10 to 100 nanoseconds).

In a specific example, the DRAM (802) is Double Data Rate type three Synchronous Dynamic Random Access Memory (DDR3 SDRAM). For power management, the DRAM (802) can operate at a clock speed of 800 Megahertz. However, any suitable clock speed and amount of DRAM (802) can be included in the design. The DRAM (802) described in FIGS. 8-21 may have similar characteristics of the DRAM described above.

At times, data may be moved from the DRAM (802) to the flash memory (804), for example, when the DRAM (802) has a threshold number of full data blocks. The movement of data out of the DRAM (802) to the flash memory (804) is governed by the SSD controller (806), which as will be described in more detail below, writes data to, and reads data from the flash memory (804) independently of received commands from the computing device. That is, commands into the SSD (800) are processed based on one sequence, and data is transferred between the DRAM (802) and the flash memory (804) in a second, and independent sequence.

As the operations between a computing device and the DRAM (802) have no dependency on the operations between the DRAM (802) and the flash memory (804), in some instances files and/or data may only be stored on the DRAM (802) and never transferred to the flash memory (804). For example, a temporary data file may be created for a transient operation (such as a search) executed. In other examples, a file may be created for a letter or email that will be sent to another system or stored by a remote system. When the file is sent to the remote system, the file can be deleted.

As described above, the DRAM (802) of the SSD (800) is not cache for a number of reasons. For example, cache is an alternative location for the CPU to look for data. If the data is not in the cache, the CPU accesses the underlying non-volatile memory. In contrast, the DRAM (802) is the only memory in the SSD (800) that is directly accessible to CPU. The actual NAND flash memory (804) is under control of a controller and is not directly accessible to the CPU. In other words, the DRAM (802) provides the principal data storage during operation of the CPU and the CPU exclusively reads data from, and writes data to, the DRAM (802).

As yet another example, cache appears to the CPU to be volatile memory, while DRAM (802) appears to be extremely fast non-volatile memory. That is, when a CPU writes data to cache, the CPU does not assume that the data is actually in non-volatile storage. The CPU continues to manage the data flow until the data is actually stored in the non-volatile storage that follows the cache. When power is unexpectedly lost to the cache, the CPU must recover without it.

In contrast, the CPU and operating system assume that the DRAM (802) is the non-volatile memory storage. The DRAM (802) reports that data written to it is stored on the non-volatile flash memory even though it is actually stored in the DRAM (802). When the power to the SSD (800) is lost, the CPU correctly assumes the data stored in the DRAM (802) is stored in non-volatile memory. This is correct because the SSD (800) has a self-contained and self-powered system for dumping the data in the DRAM (802) to flash memory (804) as described above.

By separating the flash memory (804) from the CPU instructions, the flash memory (804) is not subject to numerous peculiarities of the operating system, including frequent writes. This allows the operating system to run without modification while protecting the lifetime of the flash memory (804).

The SSD (800) also includes flash memory (804) that serves as an archive for the data in the DRAM (802). In general, flash memory (804) is slower to write to because it takes effort to force the non-volatile memory cells of the flash memory (804). The flash memory (804) depicted in FIGS. 8-21 may operate similarly to flash memory modules described above. That is, the flash memory (804) may include a number of flash memory modules, each with an independent controller and a number of flash die. Moreover, the flash memory (804) described in FIGS. 8-21 may have similar characteristics of the flash memory described above.

As described above, different communication busses may be used on the SSD (800). FIG. 8 shows an illustrative example of an SSD (800) that is capable of sustaining PCIe data rates and mitigating the limited lifetime of the flash memory (804). That is, in this example, a central processing unit (CPU) external to the SSD (800) is connected to a PCIe bus (808). The SSD (800) accepts data input, commands, and outputs data via the PCIe bus (808) at a non-volatile memory express (NVME) controller (812) which is described in more detail below. Accordingly, the SSD (800) includes a PCIe bus (808) to connect the SSD (800) to a computing device. PCIe is a high speed bit connection between the computing device and the SSD (800) with achievable speeds of 1 gigabyte per second and greater. Given that the PCIe bus (808) allows for parallel transmission, greater amounts of data can be sent, albeit in smaller packet sizes. Given the different way in which data is transmitted, the SSD (800) includes an SSD controller (806) that has hardware components configured to handle the PCIe bus (808) data structure.

Figure 9:
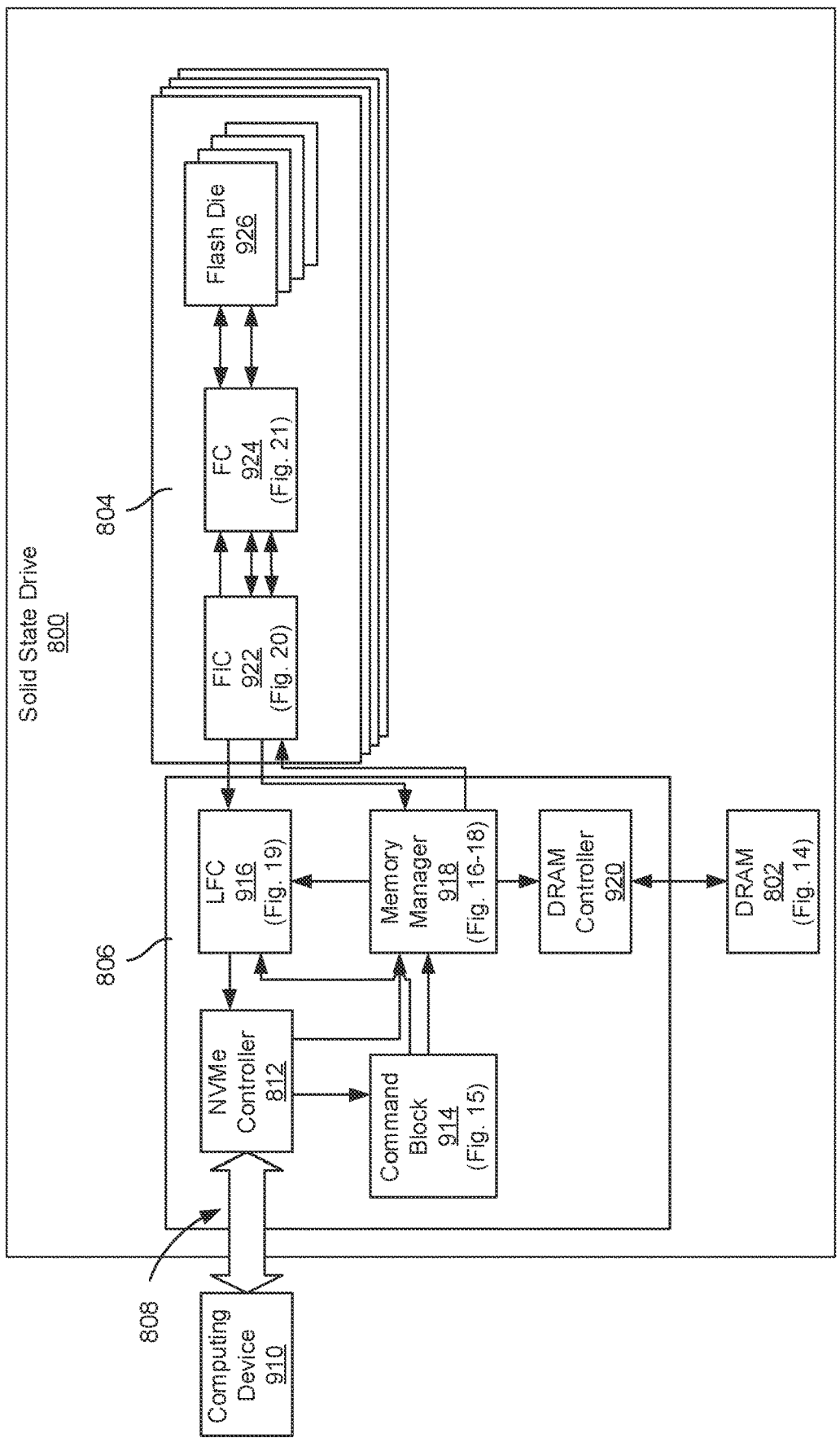
FIG. 9 is a diagram of a solid state drive with a peripheral component interconnect express (PCIe) bus, according to one example of the principles described herein.

FIG. 9 is a diagram of a solid state drive (800) with a peripheral component interconnect express (PCIe) bus (808), according to one example of the principles described herein. As described above, the SSD (800) of FIGS. 8-21 accommodates data transmission between a computing device (910) and the SSD (800) via a PCIe connection. That is, the SSD (800) connects to the computing device (910) via a PCIe bus (808). Via the PCIe bus (808), data access commands are received from the computing device (910) and data is written to the SSD (800) and read from the SSD (800).

As described above, the computing device (910) which sends the commands has no knowledge of the structure of the SSD (800) architecture. A data command includes data to be acted upon, i.e., a command word, and an identifier for the command word, which identifier is referred to as a logical block address (LBA). The SSD controller (806) then translates the (LBA) into internal locations, such as on the DRAM (802) or on the flash memory (804) and executes the command at the internal location mapped to the LBA. The computing device (910) sends a command that has an address for the data on the computing device (910) and the SSD controller (806) provides an address within the SSD (800) that maps to that LBA.

The SSD controller (806) uses a number of controllers to manage internal data flow. The use of multiple internal controllers provides a number of benefits. For example, the controllers can perform dedicated functions that are specifically adapted to the component of the SSD (800) they are controlling while flexibly coordinating with other controllers. As a specific example, the memory manager (918) may interface with the DRAM (802) at a first clock speed and then manage data being written to the flash memory (804) at a different clock speed.

First, the SSD controller (806) includes a non-volatile memory express (NVMe) controller (812) to receive commands to access the SSD (800). That is, commands are received from the computing device (910) via the PCIe bus (808) and immediately passed to the NVMe controller (812).

As described above, to manage the PCIe bus (808), which can be complicated, the NVMe protocol has been implemented. Via this protocol, received commands and data are formatted. In other words, the NVMe controller (812) decodes the commands and data received from the computing device (910) and formats data that is returned to the computing device (910). Each command identifies the type of command (i.e., read or write) and an LBA associated with the command. When the command is a write command, the command also includes data to be written, i.e., the command word. The NVMe controller (812) receives and decodes the commands and sends the whole command to the command block (914) and sends the command word, which is the command to be executed, to the memory manager (918). In some examples, the NVME controller (812) uses an 8-byte word to allow for a reduced input frequency of 125 megahertz. Accordingly, all transactions through the NVMe controller (812) are transmitted at a 125 megahertz rate.

A portion of the command word, which may be 64 bits, includes a reference to where the command from the computing device (910) is stored in the command buffer table, which may be in the command block (914). When an operation associated with the command is complete, data is sent back to the computing device (910) using the addresses stored in the command buffer table. The command word also has a field for storing the current command (i.e., read or write) which is used to implement the command. There is also a count of data to be responded to that is used to decide when to send a command complete indication.

Once the command has been formatted via the NVMe controller (812), it is passed to the command block (914). The command block (914) receives and stores the command. As described above, a command that is stored in the command block (914) includes 1) a logical block address (LBA) that trails throughout the entire SSD (800) and 2) the command word and in some examples an identifier of a type of command.

The command block (914) includes the command buffer table that stores all the commands that are active at a given time. For example, as described above, the PCIe bus (808) allows for parallel data transfer such that multiple processes may send commands to the SSD (800) at any given time or in close succession. Accordingly, the command buffer table of the command block (914) holds the commands until they are completed. When a command is ready to be processed, i.e., data is ready to be read or ready to be written, the LBA in the command is used to identify where the data should be written to, or read from. By copying the command into the command buffer table of the command block (914), the SSD (800) can finish processing the command when there is bandwidth for executing the command (i.e., reading or writing).

The SSD controller (806) also includes a memory manager (918) that manages data transfer into and out of the DRAM (802) based on a mapping between the LBA of a command and a pointer to the location in the DRAM (802). This mapping is indicated in the LR table of the memory manager (918). That is, as described above, it is up to the SSD controller (806) to determine a physical location on the SSD (800) that maps to the LBA. For example, the memory manager (918) determines, using the LR table, if the LBA associated with a command maps to a location on the DRAM (802). If there is such a mapping, the command is executed on the DRAM (802). If the data has been written to the flash memory (804) the pointer will be marked for a flash read and the SSD controller (806) transfers to a flash operation using the command word and LBA to transfer the command to the flash memory control system. In this example, the flash controller reads the LBA, identifies selected flash memory (804) locations, and transfers this data to the logical flash controller (LFC) (916) which uses the command word to build a DMA record that is then transferred to the NVMe controller (812) to store in its selected area.

In the case of a write command, the memory manager (918), creates a new mapping between the LBA and a new unused location on the DRAM (802), which mapping is stored in the LR table as referenced by the LBA. That is, such a mapping between the LBA and a location on the DRAM (802) is on a table stored on the memory manager (918) of the SSD controller (806). Such a table may be referred to as an LR table and may address the DRAM (802) as 32 kilobyte packets.

In other words, as a command is received, the LBA associated with that command is translated into a location on the DRAM (802) where data can be written to or read from. The management of these transactions are done by the LR table that contains a mapping between DRAM (802) pointers and the LBAs. A write to an LBA causes the memory manager (918) to find a 32k DRAM (802) location. If a buffer is not selected, the operation is to select the next buffer in the buffer storage. This buffer address is used for the pointer in the LR table. On a write, the data is transferred from the NVME input directly to the buffer in DRAM (802). The stream continues and the new data is stored in the new selected buffer. That is, if a location is riot selected, the memory manager (918) selects the next DRAM location and an address for the next DRAM location is used as the DRAM pointer in the LR table. The data is then transferred directly from the NVMe input to the DRAM location.

As will be described below in connection with FIGS. 11 and 12, in some cases the memory manager (918) determines if a mapping exists between the LBA and a DRAM (802) pointer. In the case that such a mapping exists, the command may be executed. For example, in a read command, the data from the location identified in the mapping is read and sent to computing device (910) via the NVMe controller (812). In the case that such a mapping does not yet exist, i.e., the particular LBA is not associated with a location on DRAM (802), the memory manager (918) creates such a mapping (in the case of a write command). Additional detail regarding the memory manager (918) is provided below in connection with FIGS. 16-18.

The memory manager (918) also determines when to write data to the flash memory (804) from the DRAM (802). That is, over time, the DRAM (802) may have a threshold amount of full data blocks. In this example, the memory manager (918) determines, through the DRAM controller (920), when this threshold number of data blocks has been reached.

In general, before writing, there is a full table block within the DRAM (802), which will not have to be rewritten often, if at all. In the SSD (800), all 16 flash die (926) are written to in sequence such that one plane can be written to for a set of flash die (926) and the next LBA is stored in the same position on the next flash die (926). The write time is very long per flash die (926). However, this time is shortened when writing to the 16 die in sequence. Accordingly, when writing in sequence, the first flash die (926) may be ready for the next full block as a last flash die (926) is still writing. In some examples, these write operations are done in the background so that the NVME/PCIe bus (108) runs at full speed in interacting with DRAM (or reads from the flash memory (804)). That is, by using the stripe method, flash reads are sequenced across the flash die (926) and because the flash read is much faster than the flash write, reading from flash proceeds at PCIE data rates.

In some examples, the SSD controller (806) includes a DRAM controller (920) to manage the data access to the DRAM (802). That is, the DRAM controller (920) identifies a location on the DRAM (802) indicated by the pointer mapped to a particular LBA and retrieves the data therefrom, or writes the data there. The DRAM controller (920) may include additional components such as buffers, pointers, processors, and memory. As all commands are processed at the DRAM (802) and not the flash memory (806), all data access to the SSD (800) are at full DRAM interface speed.

The SSD controller (806) also includes a logical flash controller (916) which manages data transfer between the SSD (800) and the computing device (910). For example, during a read operation wherein data is pulled from DRAM (802) to the computing device (910), this data is passed from the memory manager (918) to the logical flash controller (916). The logical flash controller (916) then passes this data to the NVMe controller (812) where it can be formatted and passed to the computing device (910) via the PCIe interface (808).

Writing to the flash memory (804) is controlled, and each data block written is marked for reading from the flash memory (804) using the LBA plus ECC data for that page of data. Writes to multi-level cells (MLC), loads data for four pages into four planes and then writes them at the same time to the flash memory (804). For triple level cells (TLC) loads, just three buffers are written to on each flash die (926).

After the flash interface controller (922) operates to retrieve data from flash memory (804), the logical flash controller (916) receives this data and transmits it to the NVMe controller (812) where it is processed and ultimately transmitted to the computing device (910) via the PCIe bus (808). Additional detail regarding the logical flash controller (916) is provided below in connection with FIG. 19.

Returning to the flash interface controller (922), this component buffers data to be written to multiple flash die (926) from the DRAM (802) and otherwise controls the data reads and writes to the flash die (926) that form the storage component of the flash memory (804). Specifically, the flash interface controller (922) is coupled to a flash controller (924) which is paired with one or multiple flash die (926) to manage data access into and out of the flash die (926). Note that while FIG. 9 depicts one flash interface controller (924) and one flash controller (924) coupled to multiple flash die (926), the SSD (800) may include multiple pairings of flash interface controllers (922) and flash controllers (924). The flash interface controller (922) serves as a buffer of incoming commands and the flash controller (924) includes components such as a processor and memory to manage data transfer to corresponding flash die (926). In other examples, while FIG. 9 depicts a one-to-one flash interface controller (920) to flash controller (924) coupling, multiple flash controllers (924) may be coupled to a single flash interface controller (922).

The primary control for the flash die (926) comes from buffers disposed in the flash interface controller (922). For example, during the writing of full blocks from DRAM (802) to the flash die (926), the blocks are first stored in a flash interface controller (922). With MLC blocks of data, 4 pages/planes are copied from the flash interface controller (922) buffers to the buffers for the plate and all four are written at the same time. Handling TLC blocks of data is similar in that there are pages stored in the flash interface controller (922) buffers, but with TLC blocks, three pages are written at the same time.

In either example, as soon as the write command is given, the next flash interface controller (922) is triggered and the next LBA is moved to that flash interface controller (922) buffer for the next die write. When a write command has been given for the current die, the data moves to a subsequent flash interface controller (922) buffer. After a write command has been executed on each flash die (926), the data is moved to the first flash interface controller (922) and the die associated with that first flash interface controller (922) are selected and written to. That is, the data is moved to each flash interface controller (922) buffer as fast as it can be. Such a process is referred to as stripe mode. Additional detail regarding the flash interface controller (922) and the flash controller (924) is provided below in connection with FIGS. 20 and 21, respectively.

Regarding the flash die (926), each flash die (926) is divided into sectors, pages, blocks, and planes. In this example, a sector is approximately 512 bytes with additional room for header and error correction code (ECC) information. In other implementations, the sector may be larger. A page is a group of sectors, a block is group of pages, and a plane is a collection of pages. In one example, a page includes 16 kilobytes of data with ECC data for that page added to the end. When reading, the ECC is used to repair data in the page. Each memory buffer on the flash interface controller (922) is 32 k.

A block may be a group of 1000 pages and a plane is a group of 2096 blocks. A device may include any number of planes. For example, a 32 gigabyte device may include 2 planes or 8,192 blocks. A 256 gigabyte device may include 16 planes or 65,536 blocks. As described above, an MLC block may have 4 planes of 16k pages each, and a TLC block may have 2 planes which have three pages each. These may be read or written with one command.

In some examples, the flash memory (804) includes 16 flash die (926) to make 512 gigabytes of flash storage. Multiple flash die (926) may be grouped with pairings of flash controllers (924) and flash interface controllers (922). For example, 4 flash die (926) may be paired to a single flash controller (924) and a single flash interface controller (922). Four instances of such an arrangement may be implemented on the flash memory (804) to provide the 16 flash die (926). However, other quantities of storage may be available. These die (926) are configured to operate in parallel, providing approximate transfer rates of 320 megabytes per second for data writing. Reading data from flash memory (804) is significantly faster than writing data to the flash memory (804). Consequently, the flash memory modules may exhibit correspondingly higher data transfer rates during reading operations.

Similar to the LR table on the memory manager (918), the flash controller (924) includes a mapping between the LBAs and a location on the flash die (926) corresponding to that flash controller (924). As will be described below, the combination of the flash interface controller (922) buffers and the flash controllers (924), allows data to be written to the flash die (926) in stripe mode, wherein multiple flash die (926) can be written to, or read from in parallel.

An example of writing in stripe mode is now presented. In this example, the memory manager (918) may determine that information is to be written from DRAM (802) to the flash memory (804). As described above, this may be based on a number of completely written DRAM blocks. Just these completely written DRAM blocks are to be written to the flash die (926). Accordingly, data is portioned and transferred to the flash interface controller (922) buffers. Specifically, starting with the lowest LBA associated with the completely written data block, the first 4 pages are written into the 3 or 4 page flash interface controller (922) buffers and then writing the data from the buffers to the planes on the associated flash die (926) at one time. Once this command to write from the FIG. 922) buffers to the flash die (926) has been issued, it is desirable to write the next pages of the completely written block to different flash die (926). This is made possible by parallel FIG. 922) structures such that the next pages are passed to a subsequent FIG. 922) structure and similarly the associated flash die (926) can be written to.

As a request is received to write data to flash, the LBA associated with the DRAM pointer is mapped with a location on the flash memory (804). Then, as that information is requested from the flash memory (804), the LBA is used to locate the information on flash memory (804) such that it can be retrieved.

In summary, the data in DRAM (802) that is to be written to the flash memory (804) is striped across the flash die (926) with different pieces of the data being disposed on different flash die (926). Such a striping operation allows the data to be written more quickly to the flash die (926) than would otherwise be possible. In other words, different flash die (926) may be sequentially enabled and data from the DRAM (802) may be sequentially transferred to the enabled flash die (926) such that the data is striped over all of the flash die (926) to allow for parallel writes to the flash die (926). This writing technique makes for very fast writes, and reads of the flash die (926) because you can start 4 at the time of reading.

That is, as described above, data may be written to and read from various flash die (926) in parallel. That is, a block of data may be passed to buffers in the flash interface controller (922). This data is broken up into pieces and passed to the flash controller (924). Each flash controller (924) incrementally sends data to associated flash die (926). That is, a first portion of data is sent to a first flash die (926). While this is being written to, a second portion of data is sent to a second flash die (926) and so on and so on. Accordingly, a first die is written, to a second is written to, on and on until all die are written to, in some cases simultaneously. Accordingly, in this fashion, it may be that each flash die (926) is written to at the same time, thus resulting in a quicker write operation than could otherwise be performed on flash memory (804). That is, to enable parallel writes and parallel reading operations, a file is striped across the various flash die (926). This results in the file being distributed across the flash die (926) and various portions of the file being written in simultaneously to different flash die (926). When the file is retrieved from the flash die (926), it can be read from the flash die (926) in parallel in stripe mode.

Figure 10:
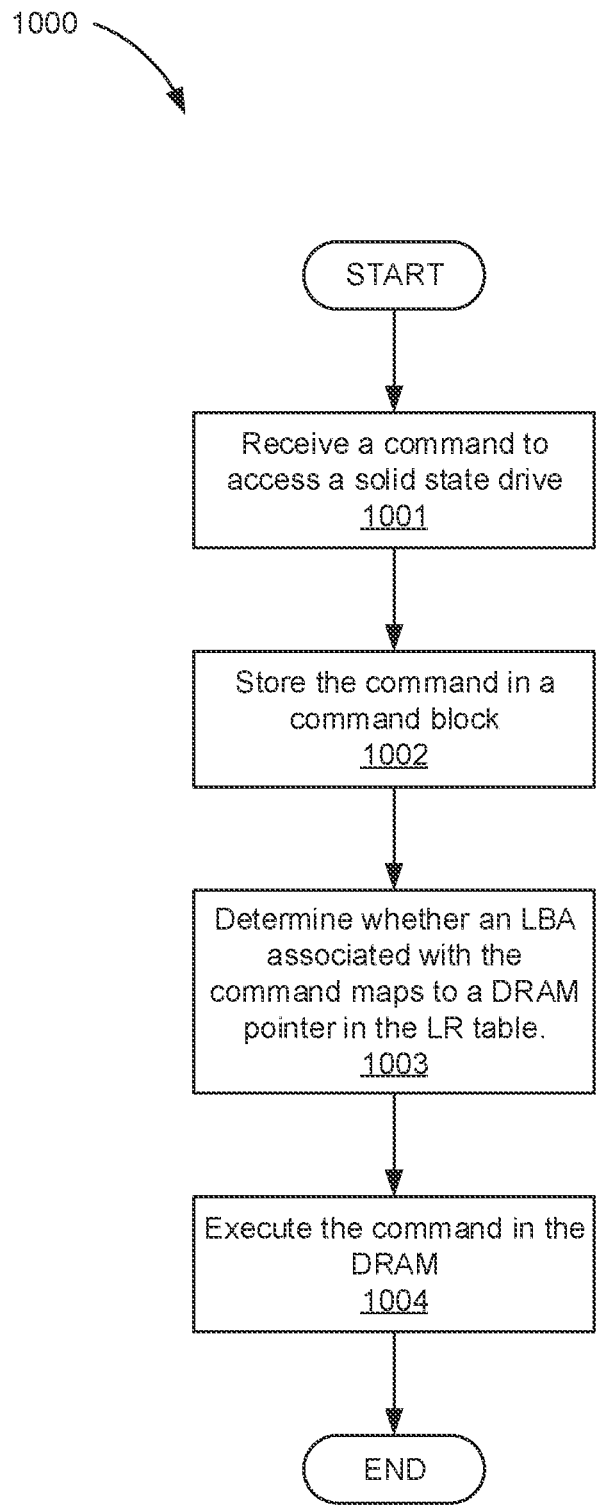
FIG. 10 is a flow chart of a method for data transfer using a solid state drive with a PCIe bus, according to one example of the principles described herein.

FIG. 10 is a flow chart of a method (1000) for data transfer using a solid state drive (FIG. 8, 800) with a PCIe bus (FIG. 8, 808), according to one example of the principles described herein. According to the method (1000), a command to access a solid state drive (FIG. 8, 800) is received (block 1001). The command comes from a computing device (FIG. 9, 910) that is coupled to the SSD (FIG. 8, 800) via a PCIe bus (FIG. 8, 808). The command may be of varying types. For example, the command may be a write command wherein data is to be written to the SSD (FIG. 8, 800). In another example, the command is a read command wherein data is to be retrieved from the SSD (FIG. 8, 800) and passed to the computing device (FIG. 9, 910). A command word is created which includes various pieces of information. For example, the command word may include the command in the first byte of the command word, with the command word being an 8 byte value.

The command identifies the command as a read command or a write command. The command word also has an LBA, or identifier, associated with the command word. The command word is stored (block 1002) in the command block (FIG. 9, 914) of the SSD controller (FIG. 8, 806). As the interface between the computing device (FIG. 9, 910) and the SSD (FIG. 8, 800) is a PCIe bus (FIG. 8, 808), there may be multiple commands received in a short amount of time, or in some cases at the same time. Accordingly, the command block (FIG. 9, 914) includes a buffer table that holds multiple command words until their completion. Once verification is received that the command is complete, the command is cleared from the buffer of the command block (FIG. 9, 914).

It is then determined (block 1003) whether the LBA associated with the command maps to a DRAM (FIG. 8, 802) pointer. Such a determination (block 1003) may be made by using the LR table stored in the memory manager (FIG. 9, 918). As a specific example, it may be the case that a write command and the LBA associated with it are being used for the first time. In this example, no previous mapping may exist. In this case, the memory manager (FIG. 9, 918) creates the mapping. In either case, i.e., an existing mapping or a newly created mapping, the command is executed (block 1004) in the DRAM (FIG. 8, 802). That is data may be written to the DRAM (FIG. 8, 802) or the data may be read from the DRAM (FIG. 8, 802). For a write, depending on the base address for the command, 32k data can be stored in the DRAM (FIG. 8, 802). As the pointers are base zero pointers, the LBA can have short or long writes. If the data count is not complete when the DRAM (FIG. 8, 802) location is full, then the remaining LBA is used to find the next DRAM (FIG. 8, 802) location for this data. If there is no pointer for a next LBA, a new block of DRAM (FIG. 8, 802) memory is requested from a "next available" list and the new 32k location is assigned and used to finish the data operation from the current write command.

In addition to allowing the CPU command access to the DRAM (FIG. 8, 802), the SSD controller (FIG. 8, 806) also prevents access of the computing device (FIG. 9, 910) to flash memory (FIG. 8, 804) on the SSD (FIG. 8, 800). In other words, the present method (1000) describes an SSD (FIG. 8, 800) where only the DRAM (FIG. 8, 802) is accessible to the computing device (FIG. 9, 910) and the flash memory (FIG. 8, 804) is internally accessible, but not externally accessible by the computing device (FIG. 9, 910).

Figure 11:
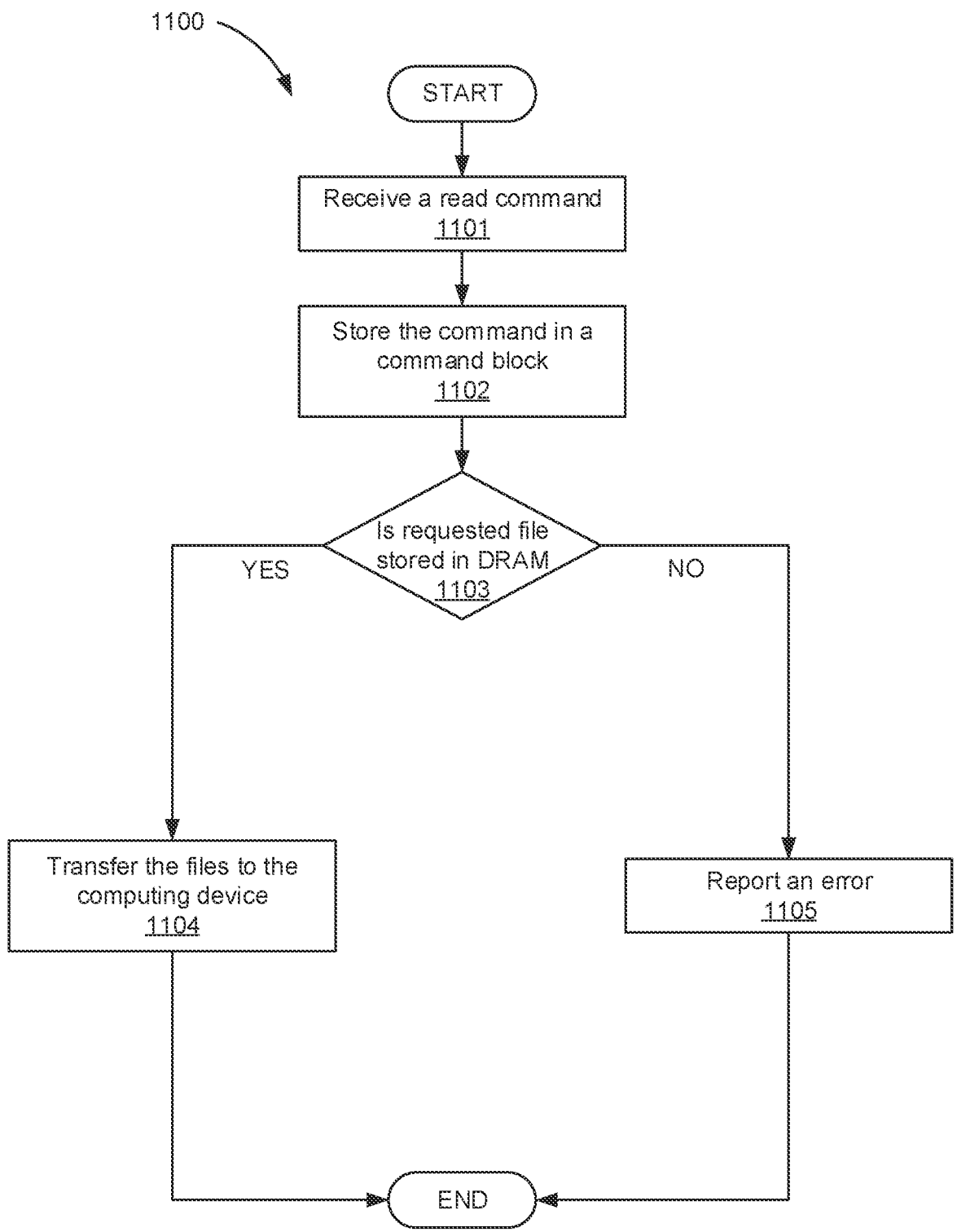
FIG. 11 is a flow chart of a method for reading data using a solid state drive with a PCIe bus, according to one example of the principles described herein.

FIG. 11 is a flow chart of a method (1100) for reading data using a solid state drive (FIG. 8, 800) with a PCIe bus (FIG. 8, 808), according to one example of the principles described herein. In this example, a read command is received (block 1101). That is, the computing device (FIG. 9, 910) sends a request to read information and the request is associated with an LBA. The read command is read from the PCIe bus (FIG. 8, 808) and processed by the NVMe controller (FIG. 8, 812). As described above, a command word with the command is stored (block 1102) in the command block (FIG. 9, 914). It is then determined (block

1103) if the LBA maps to a DRAM (FIG. 8, 802) pointer; that is, if the data associated with the command is stored in the DRAM (FIG. 8, 802). This may be performed by consulting the LR table in the memory manager (FIG. 9, 918) which maps LBAs in command words to locations in DRAM (FIG. 8, 802). When the LBA of the command word does map to a DRAM (FIG. 8, 802) pointer, that is when the next requested file is stored in DRAM (FIG. 8, 802) (block 1103, determination YES), the file is transferred (block 1104) to the computing device (FIG. 9, 910) from the DRAM (FIG. 8, 802) through the memory manager (FIG. 9, 918), logical flash controller (FIG. 9, 916), and the NVMe controller (FIG. 8, 812).

By comparison, when the requested file is not stored in the DRAM (FIG. 8, 802), (block 1103, determination NO); that is when no mapping exists between the LBA of the command word and a location on the DRAM (FIG. 8, 802), an error is reported.

The flash interface controller (FIG. 9, 922) includes a mapping between LBAs and locations on various flash die (FIG. 9, 926) under the control of the flash interface controller (FIG. 9, 922). Accordingly, upon receiving the command, the flash interface controller (FIG. 9, 922) retrieves the LBA, consults the mapping, and locates where on the various flash die (FIG. 9, 926) the data is located. When data associated with the command is striped across various flash die (FIG. 9, 926), the data may read from multiple flash die (FIG. 9, 926) in a stripe mode. The associated data with the LBA can then be passed from the flash memory (FIG. 8, 804) to the logical flash controller (FIG. 9, 922) to be passed to the computing device (FIG. 9, 910) via the PCIe bus (FIG. 8, 808).

Figure 12:
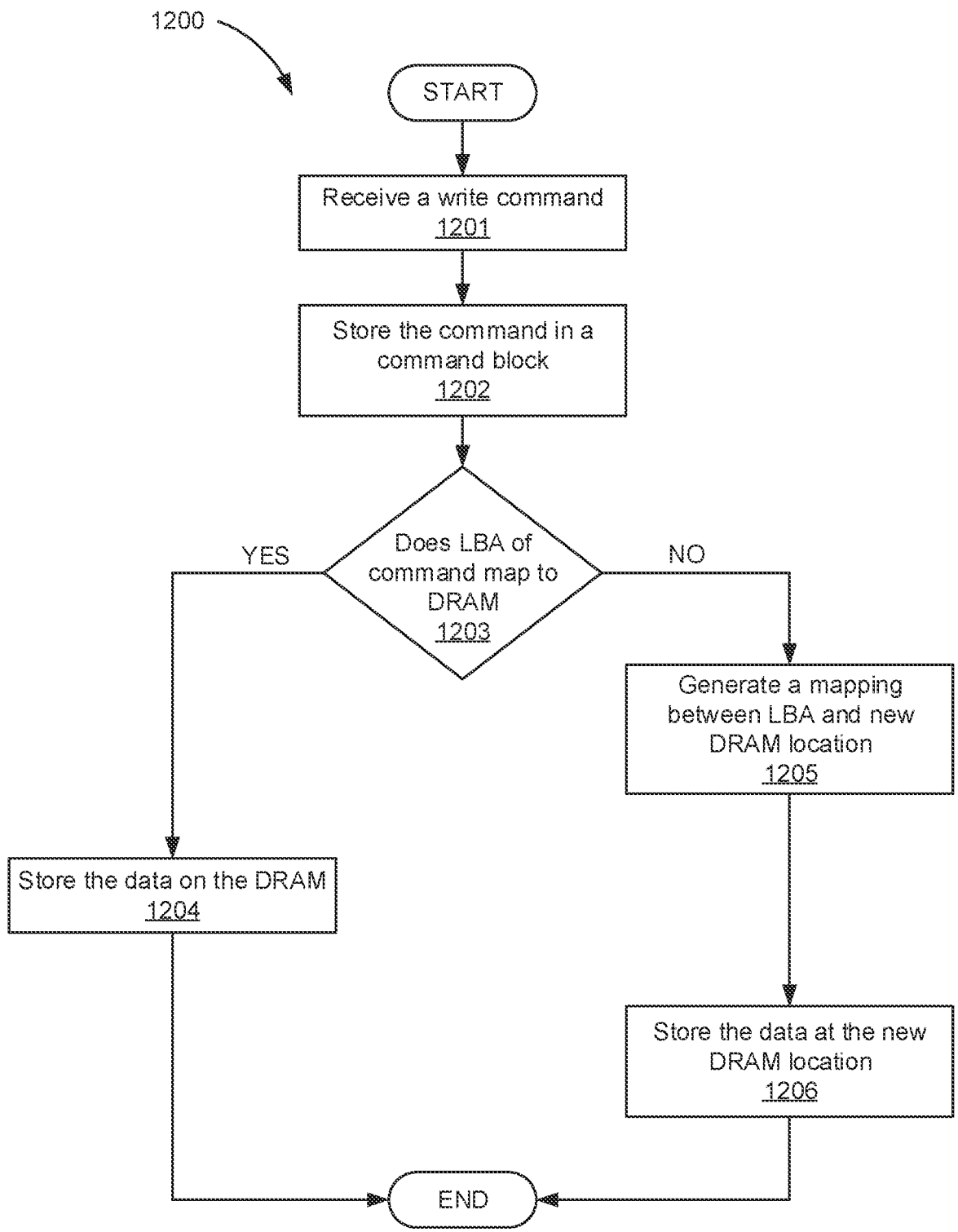
FIG. 12 is a flow chart of a method for writing data using a solid state drive with a PCIe bus, according to one example of the principles described herein.

FIG. 12 is a flow chart of a method (1200) for writing data using a solid state drive (FIG. 8, 800) with a PCIe bus (FIG. 8, 808), according to one example of the principles described herein. In this example, a write command is received (block 1201). That is, the computing device (FIG. 9, 910) sends a request to write information associated with an LBA to the SSD (FIG. 8, 800). The write command is read from the PCIe bus (FIG. 8, 808) and processed by the NVMe controller (FIG. 8, 812). As described above, the command word that includes the command is stored (block 1202) in the command block (FIG. 9, 914). It is then determined (block 1203) if the LBA maps to a DRAM (FIG. 8, 802) pointer. This may be performed by consulting the LR table in the memory manager (FIG. 9, 918) which maps LBAs in commands to locations in DRAM (FIG. 8, 802). When the LBA of the command does map to a DRAM (FIG. 8, 802) pointer (block 1203, determination YES), the data is written (block 1204) to the DRAM (FIG. 8, 802).

By comparison, when the command LBA does not map to a location on the DRAM (FIG. 8, 802) (block 1203, determination NO), a mapping is generated (block 1205) between the LBA and a new DRAM (FIG. 8, 802) location. That is, the DRAM controller (FIG. 9, 920) may have a list of unassigned blocks of DRAM (FIG. 8, 802) memory. When data in a block of DRAM (FIG. 8, 802) is written to flash, a pointer to this DRAM (FIG. 8, 802) location is added to the end of this list of available memory. Generating (block 1205) this mapping takes the next entry in the list for this mapping.

A pointer to these locations is inserted into the LR table of the memory manager (FIG. 9, 918) along with the LBA that is associated with data to be written to that location. The data associated with the LBA is then stored (block 1206) at the new DRAM (FIG. 8, 802) location. It is then reported to the computing device (FIG. 9, 910) that the write command is complete when all the commanded bytes have been written to the DRAM (FIG. 8, 802).

Figure 13:
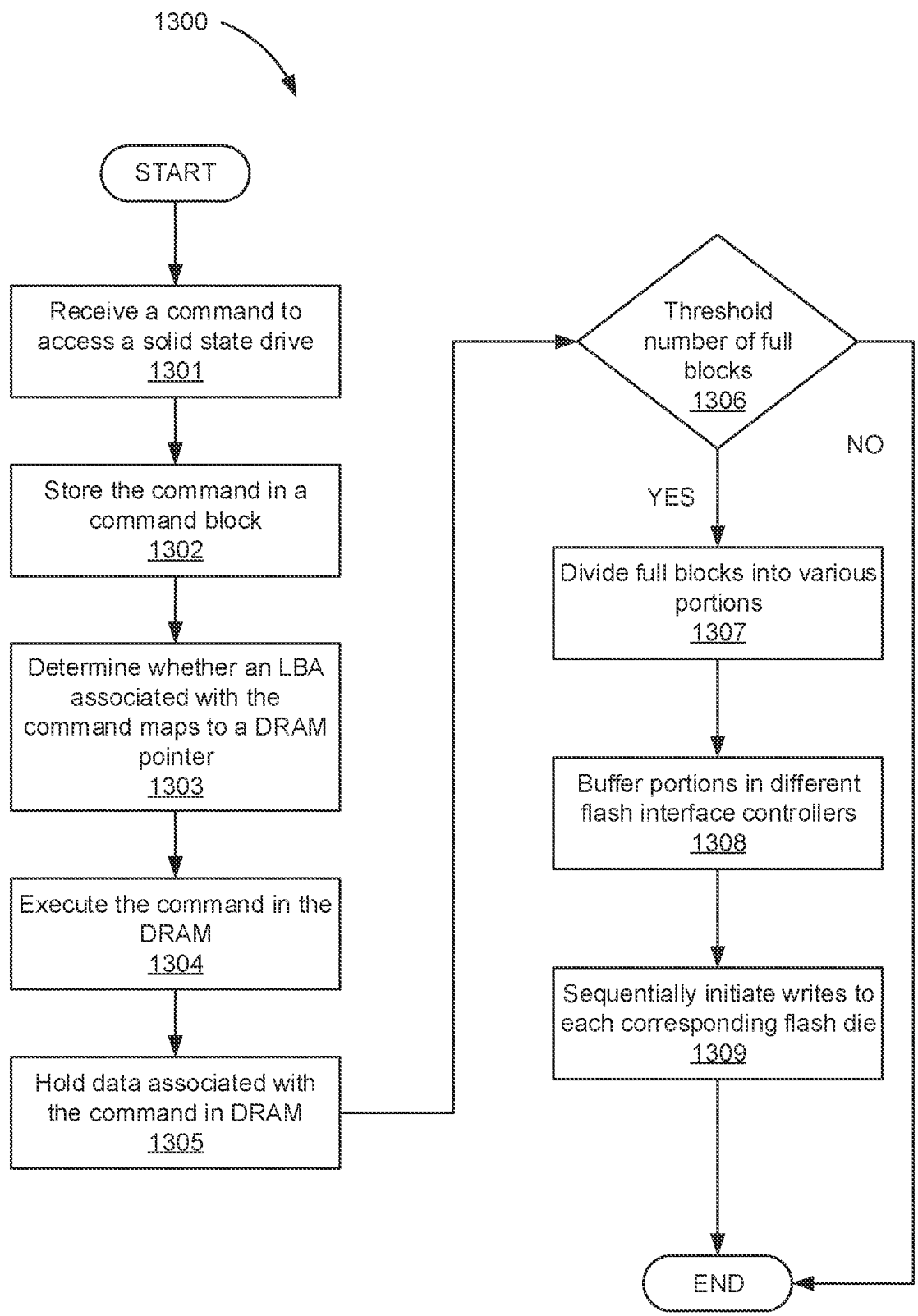
FIG. 13 is a flow chart of a method for data transfer using a solid state drive with a PCIe bus, according to one example of the principles described herein.

FIG. 13 is a flow chart of a method (1300) for data transfer using a solid state drive (FIG. 8, 800) with a PCIe bus (FIG. 8, 808), according to one example of the principles described herein. As described above, a command is received (block 1301) at an SSD (FIG. 8, 800) and stored (block 1302), along with other elements, as a command word in a command block (FIG. 9, 914). It is then determined (block 1303) whether an LBA associated with the command maps to a DRAM (FIG. 8, 802) pointer. When there is such a mapping, the command is executed (block 1304).

Independent of the execution (block 1304) of the command, the data associated with the command, and other commands, is held (block 1305) in the DRAM (FIG. 8, 802) until a threshold number of data blocks within the DRAM (FIG. 8, 802) are full. If there is not a threshold number of full data blocks (block 1306, determination NO) in the DRAM (FIG. 8, 804), data remains there.

If there are a threshold number of full data blocks (block 1306, determination YES), the data in the full blocks is divided (block 1307) into portions and buffered (block 1308) at a flash interface controller (FIG. 9, 922). The LBA decodes which buffer will be written. That is, the LBA indicates the die address for this transfer to the flash interface controller (FIG. 9, 922) buffer. Note that as described above, the transferring of full data blocks to the flash memory (FIG. 8, 804) is independent of any received command.

As described above, in order to reduce the time for combined writes, each flash die (FIG. 9, 926) is managed in stripe mode which means that buffered data is written in parallel with a single flash write. As described above, with MLC blocks 4 pages are written at one time while with TLC blocks, 3 pages are written at one time.

Accordingly, for each flash die (FIG. 9, 926) and associated flash controller (FIG. 9, 924), the flash controllers (FIG. 9, 924) sequentially initiate (block 1309) writes to each corresponding flash die (FIG. 9, 926). That is, after a write has been initialized on a first flash die (FIG. 9, 926), a write to a second flash die (FIG. 9, 926) is initiated before the write to the first flash die (FIG. 9, 926) is complete. In this example, multiple, or even all of the flash die (FIG. 9, 926) may be written to, or read, at the same time. Thus, enhancing the speeds at which the flash die (FIG. 9, 926) can be accessed.

In some examples, if data remains in the buffer and the write on the first flash die (FIG. 9, 926) has been terminated, another sequential write on the first flash die (FIG. 9, 926) may be initiated. By spreading the logical records across the flash die (FIG. 9, 926) in this order, normal read and write times are masked. In other words, the flash controller (FIG. 9, 924) gets lots of high speed short commands that are queued so that every flash die (FIG. 9, 926) could be processing the slow reads and writes at the same time and the effect is that the data always flows at maximum rate.

Figure 14:
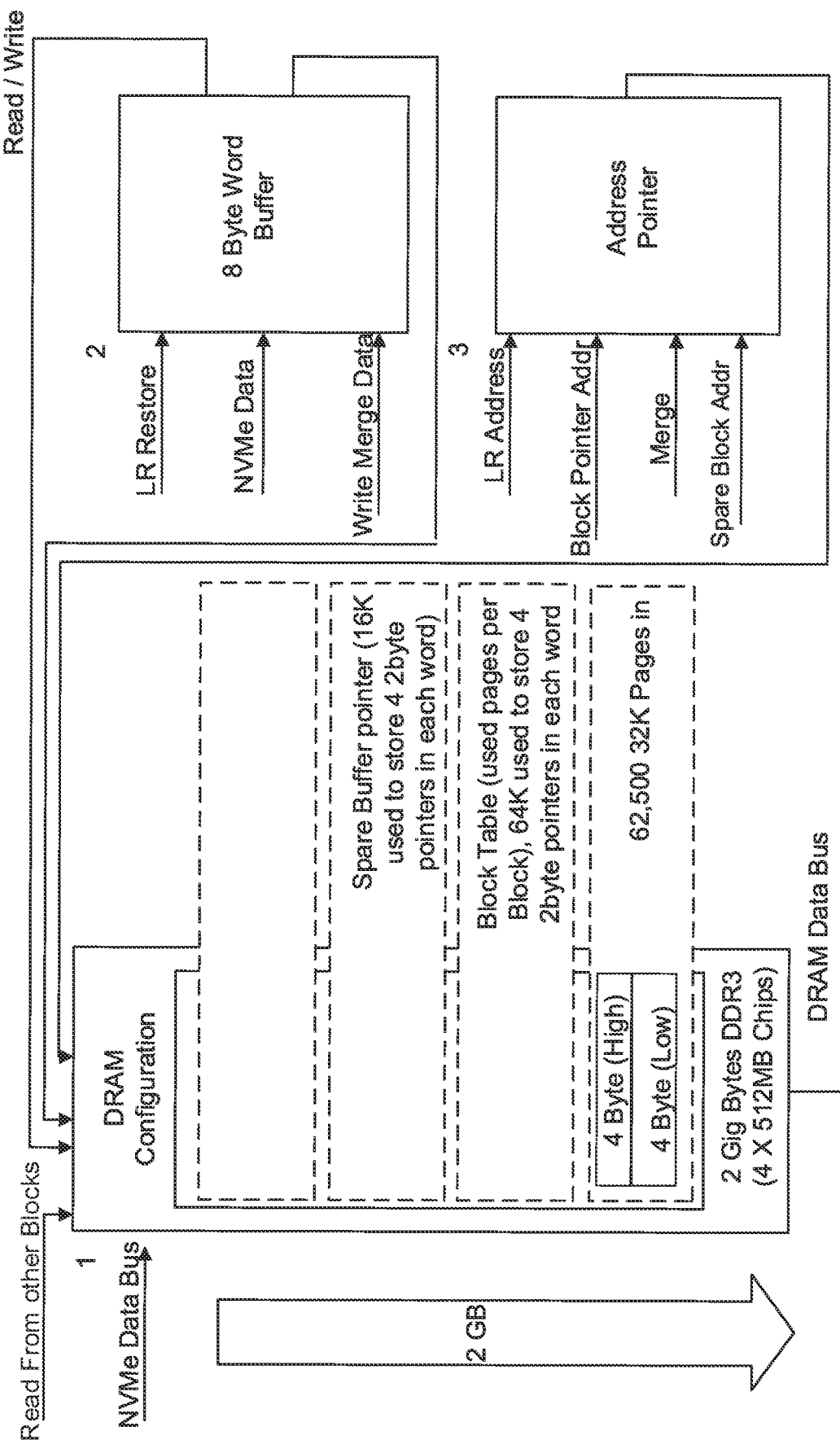
FIG. 14 is a diagram of the dynamic random access memory of FIG. 12, according to one example of the principles described herein.

FIG. 14 is a diagram of the dynamic random access memory (802) of FIG. 9, according to one example of the principles described herein. FIG. 14 depicts the DRAM configuration as well as an 8-byte word buffer, and an address pointer.

Figure 15:
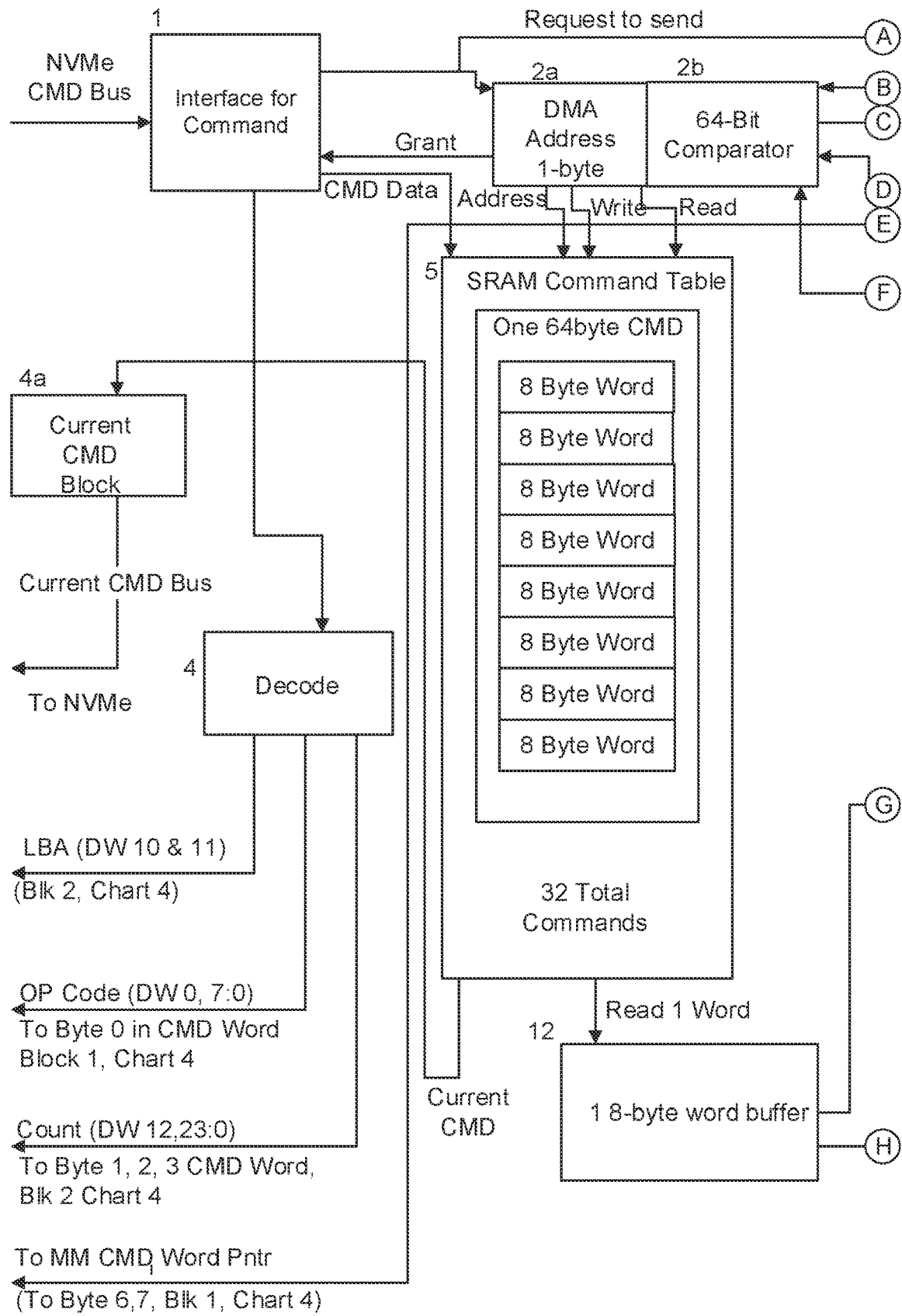
FIG. 15 is a diagram of the command block of FIG. 9, according to one example of the principles described herein.
Figure 15:
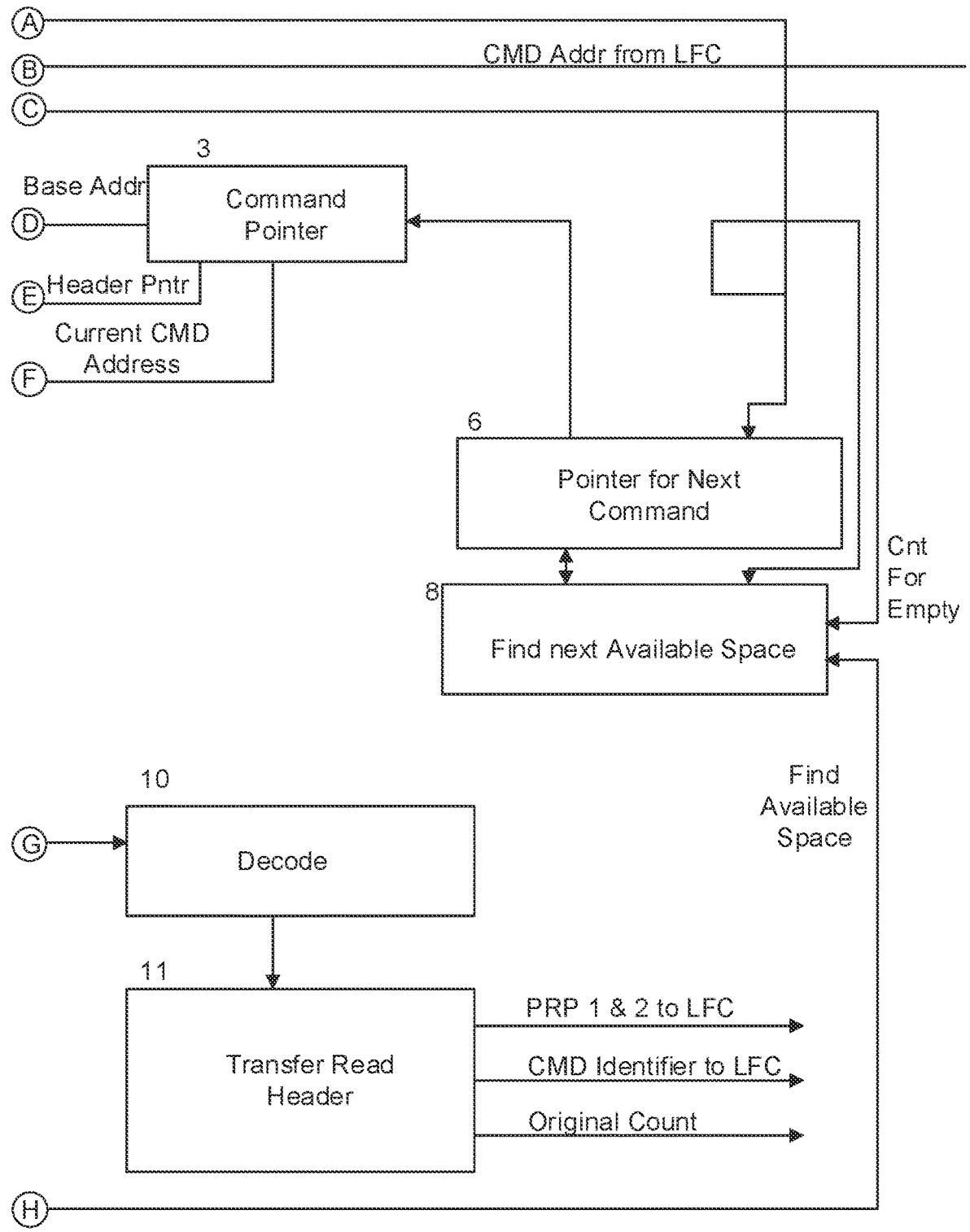

FIG. 15 is a diagram of the command block (FIG. 9, 914) of FIG. 9, according to one example of the principles described herein. FIG. 15 depicts a TC interface bus from the NVMe controller (FIG. 8, 812) and the writing to the SRAM Command Table. The interface is a connection between the memory manager (FIG. 9, 918) to the flash interface controller (FIG. 9, 916). The signal that is sent is a Request to Send to go to the next word. The signal back is a Grant. If both signals are just enabled a new word is transferred on every clock. The receiving device has logic for the connection and there are 8-bytes of data in the transmission. There is a receiver function that moves the first word to a command word buffer. The second word is stored in the LBA for that page and the rest of the data goes to this selected buffer. For commands like Read from Flash, only the command word and LBA are sent in this transmission. The processor reads the command word and stores it and the LBA then uses both to create a read from flash. This read sets up a new command word for the logical flash controller (FIG. 9, 916) so that the flash interface controller (FIG. 9, 922) buffer is sent through the logical flash controller (FIG. 9, 916) to the computing device (FIG. 9, 910).

FIG. 15 also delicts a DMA 8 Count RNV Control used for loading and reading the SRAM Command Table. This is a 3-byte address counter and a 2-byte counter. The DMA addresses the SRAM command table for commands.

FIG. 15 also depicts the command pointer, which is a 2-byte storage for buffer for this command. FIG. 15 also depicts a decode block that decodes to build the command word from the NVMe controller (FIG. 8, 812). In this example, word 0, byte 0 and 1 decodes to byte 0 and 1 of the command word and word 6, byte 0 and 1 decodes to byte 3 and 4 of the command word. The command pointer transfers to byte 6 and 7 of the command word.

FIG. 15 also depicts the SRAM Command Table which is memory organized in 64 bits per word and has sequential access to one port 4K-bytes. The table is addressed by the DMA. FIG. 15 also depicts a pointer for a next command which is a 2-byte register for storing next free Block space.

FIG. 15 also depicts a find next available space block. This is a state machine using DMA addresses to read a buffer and looking for "ZERO" words which saves the address for the DMA stored in the Pointer for Next Command.

Another decode block decodes from selected words using DMA to move control register, pointers to select the word selected, which is an 8-byte register. A set of state machines move the words or decoded versions of the words to the Transfer Read Header which is selected and used by the logical flash controller (FIG. 9, 922) at the start of each data transfer to the NVMe controller (FIG. 8, 812). Decode is word 0, word 2, word 3. In some examples, the count will come from the input file. First time word 6 byte-0 and one for initial count for the command sent to count file in the logical flash controller (FIG. 9, 916). 8-byte containing the LBA, word 5 from the interface transfers to the memory manager (FIG. 9, 918).

The Transfer Read Header is the set of data for the logical flash controller (FIG. 9, 916) to move to the NVMe controller (FIG. 8, 812). It stores the data from the Decode block and has a word of command descriptor and two words of PRP1 and PRP2 and stores the count into the current count if this is the first count.

The 1 8-byte word buffer is the output data from a DMA read which is used to select the word to use for the collection of the word or words. The decode is delayed one clock to assure we do not have timing issues.

Figure 16:
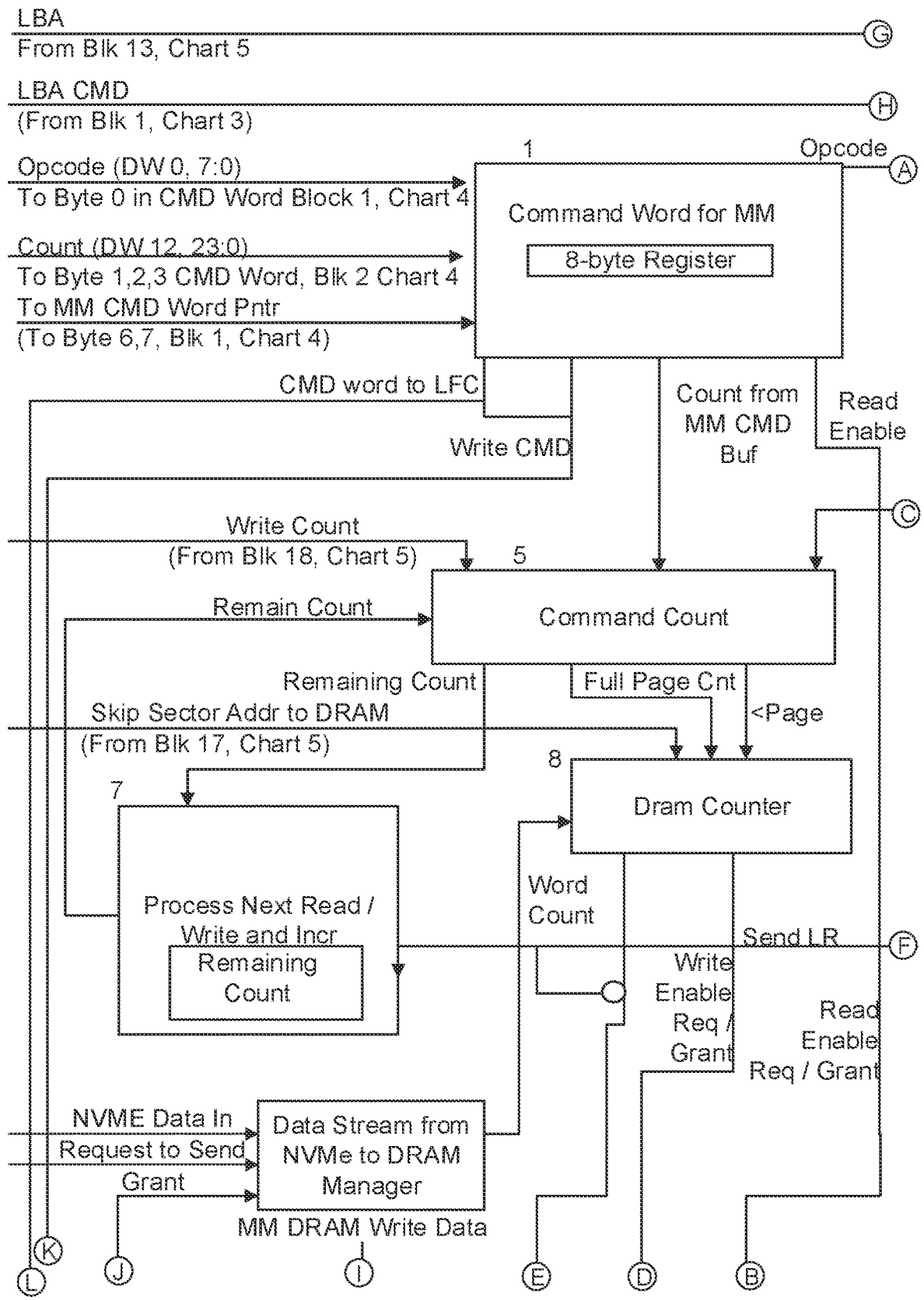
FIGS. 16-18 are diagrams of the memory manager of FIG. 9, according to one example of the principles described herein.
Figure 16:
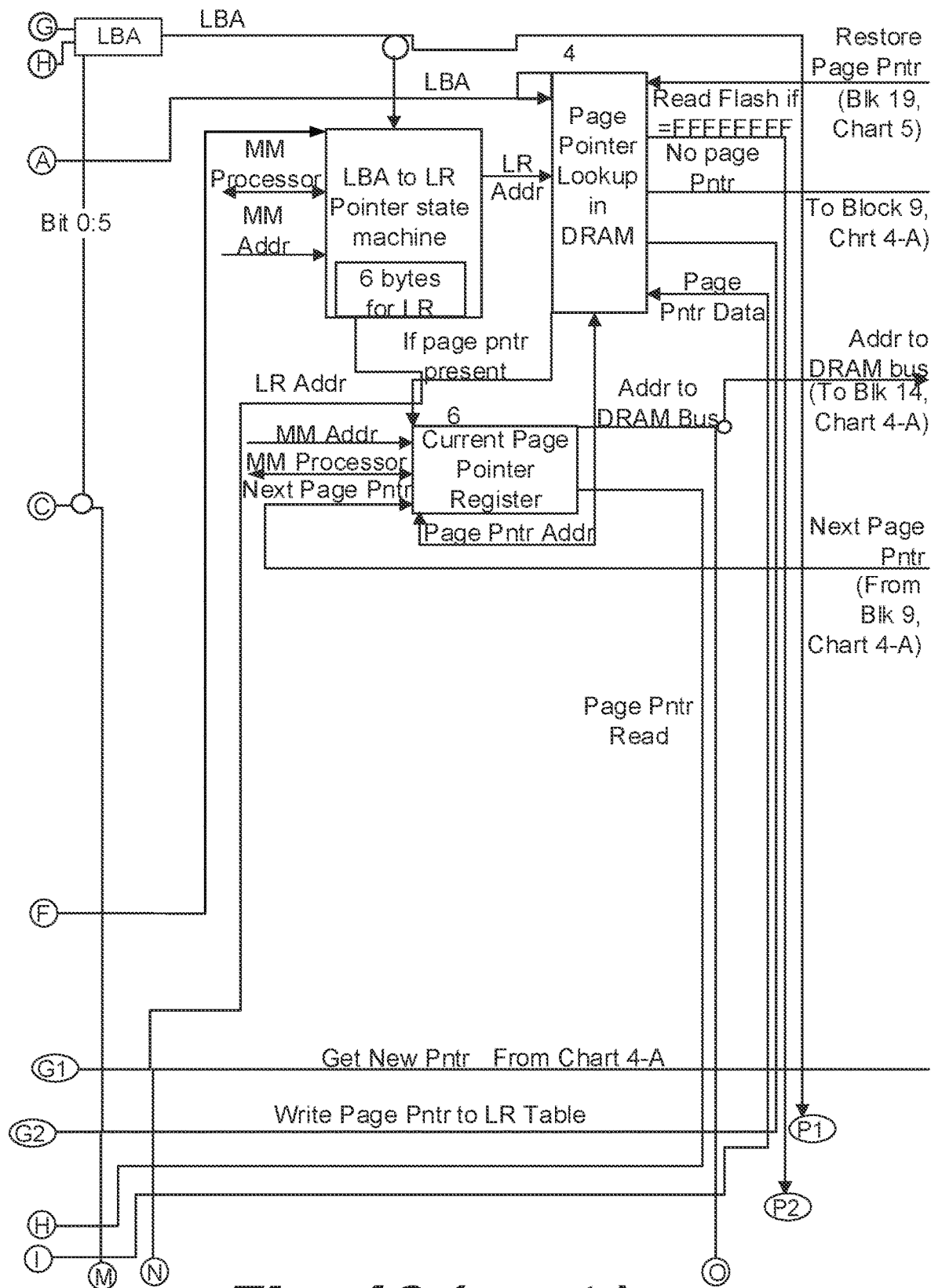
Figure 16:
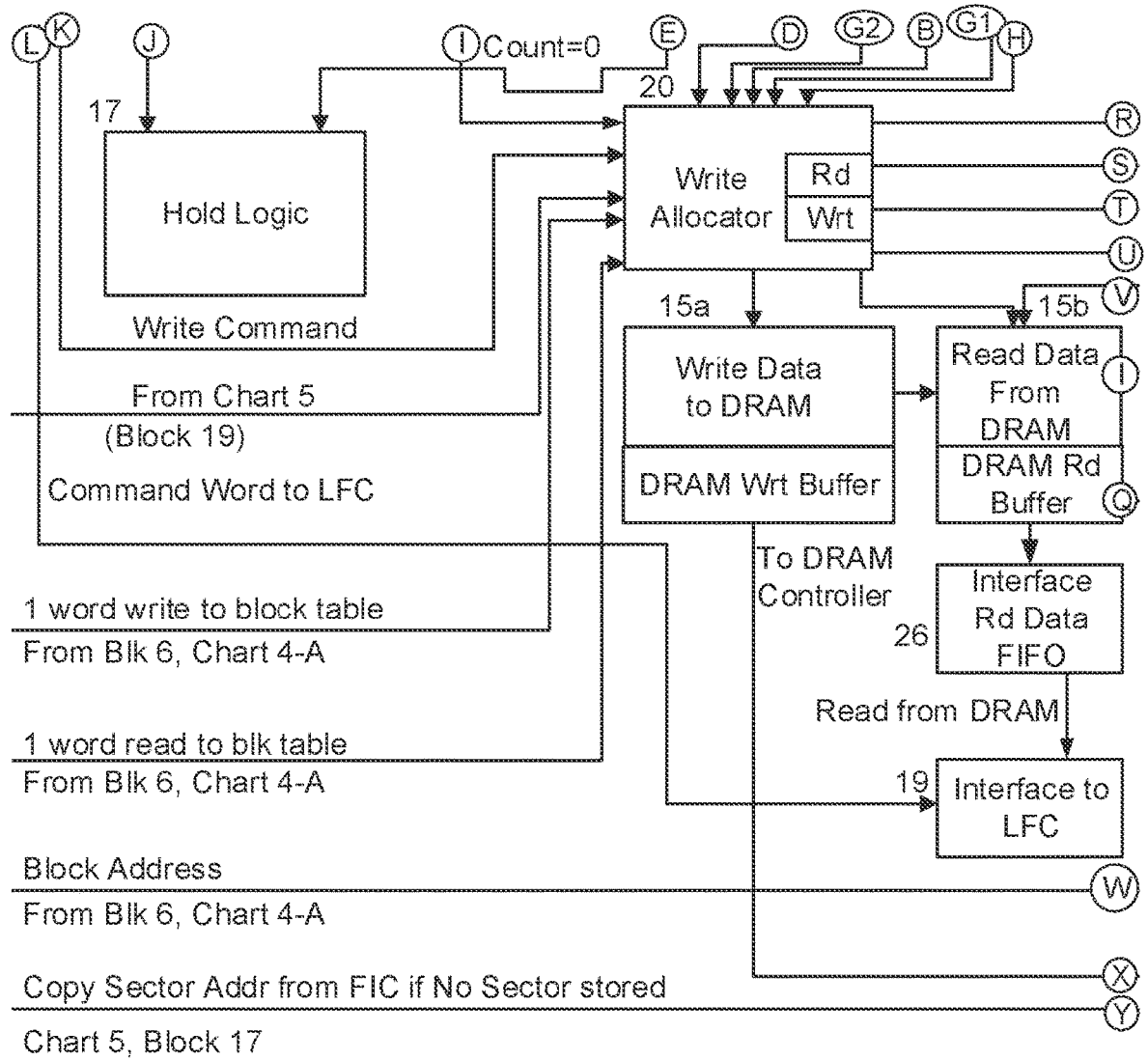
Figure 16:
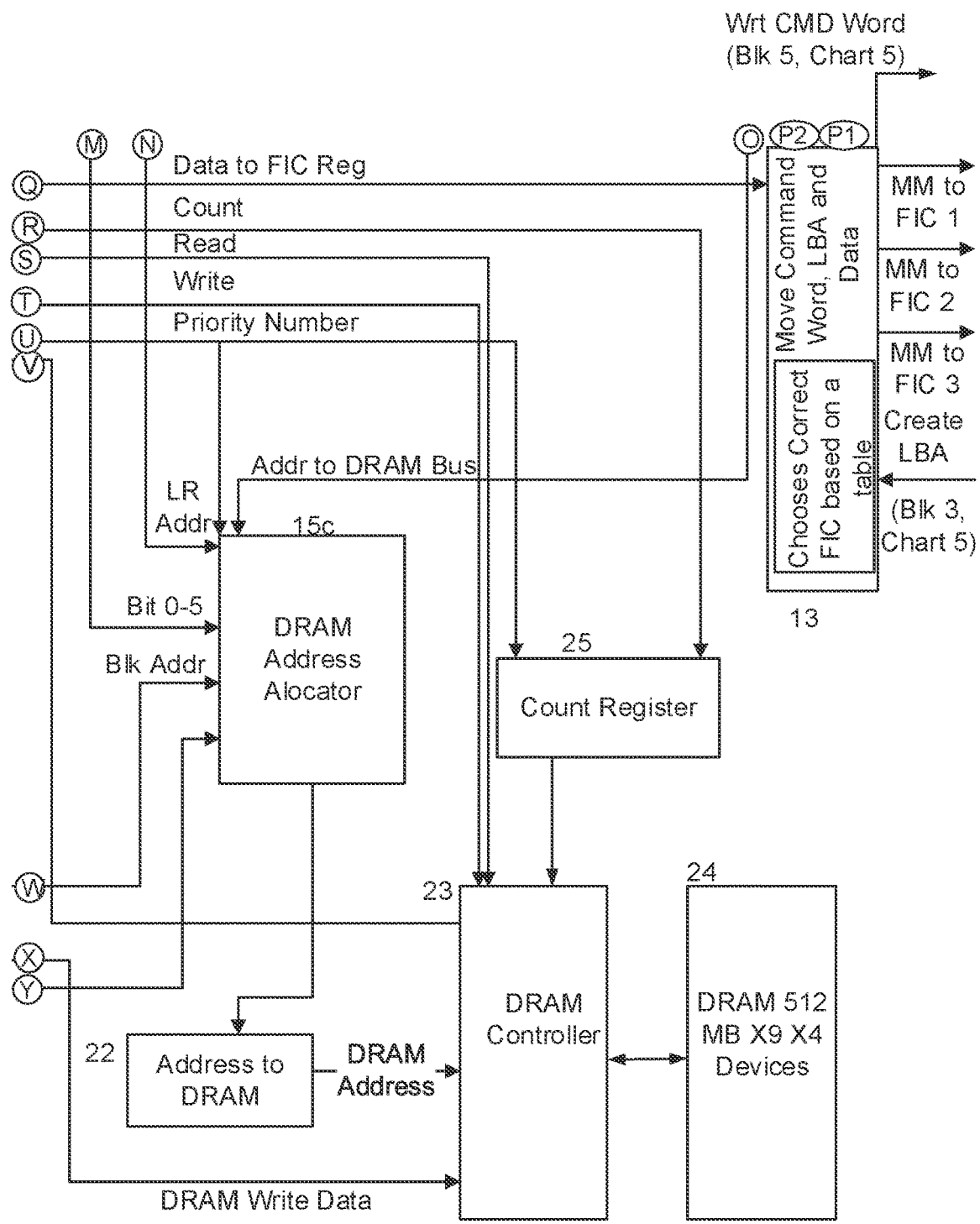
Figure 17:
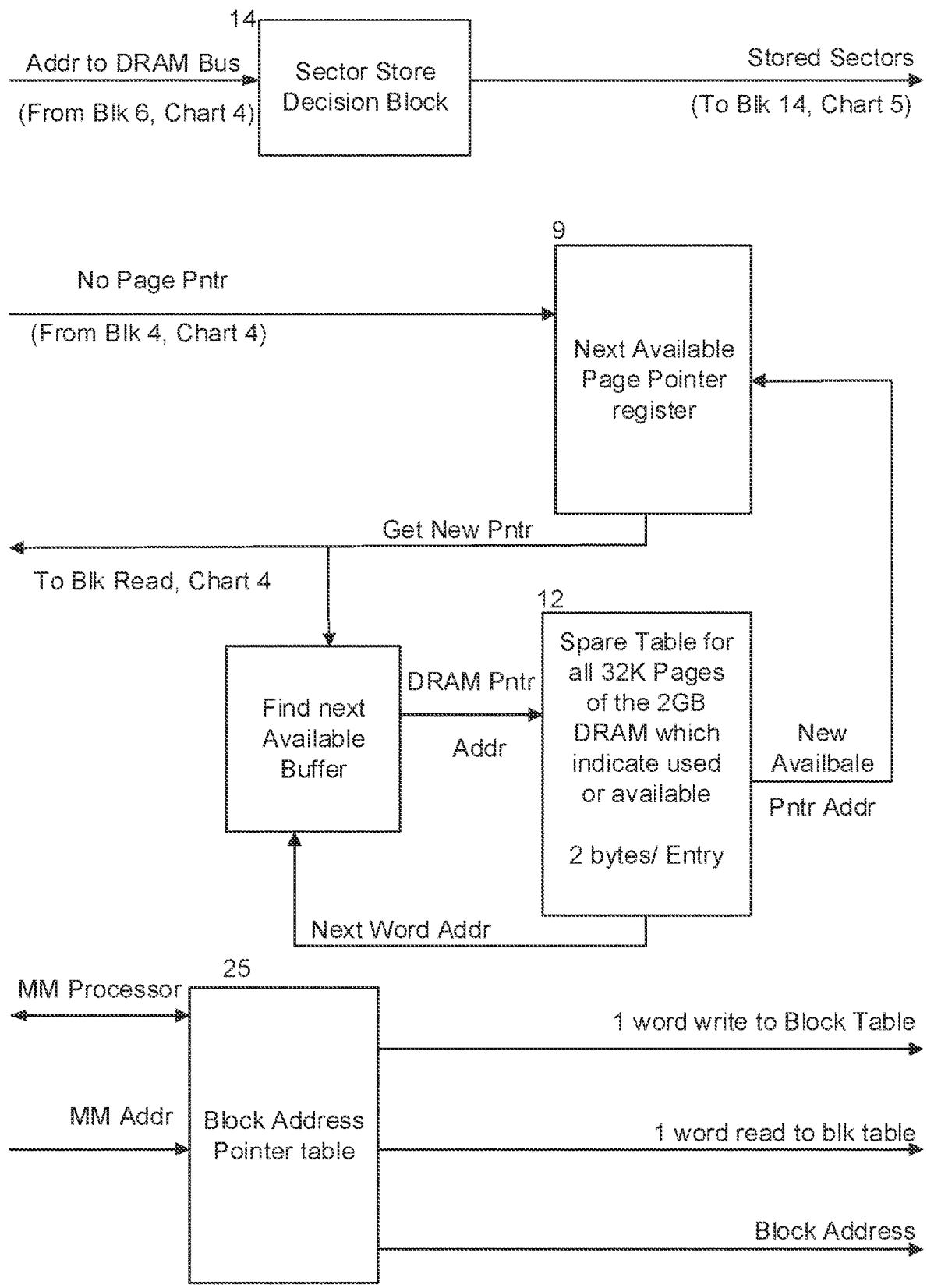
Figure 18:
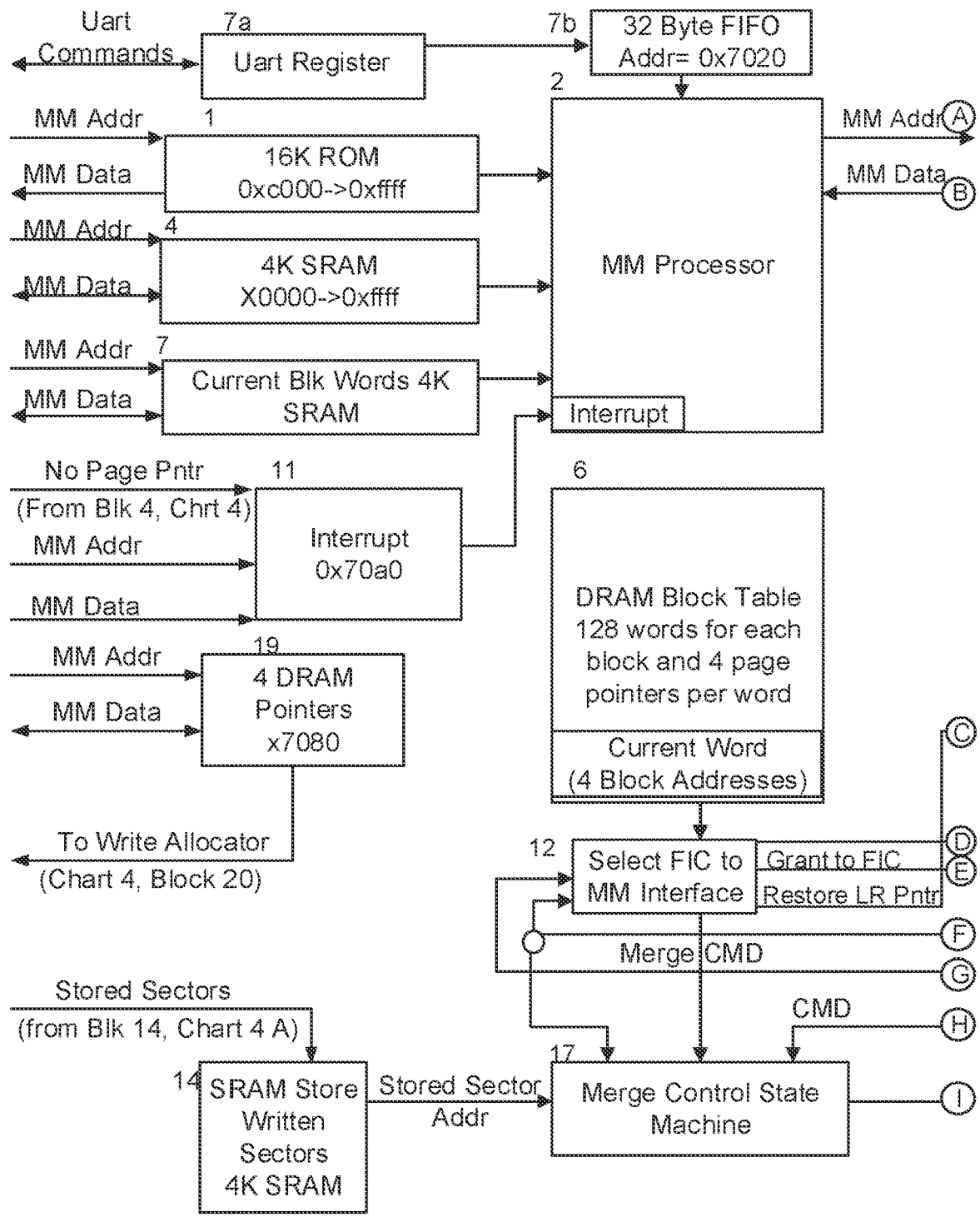
Figure 18:
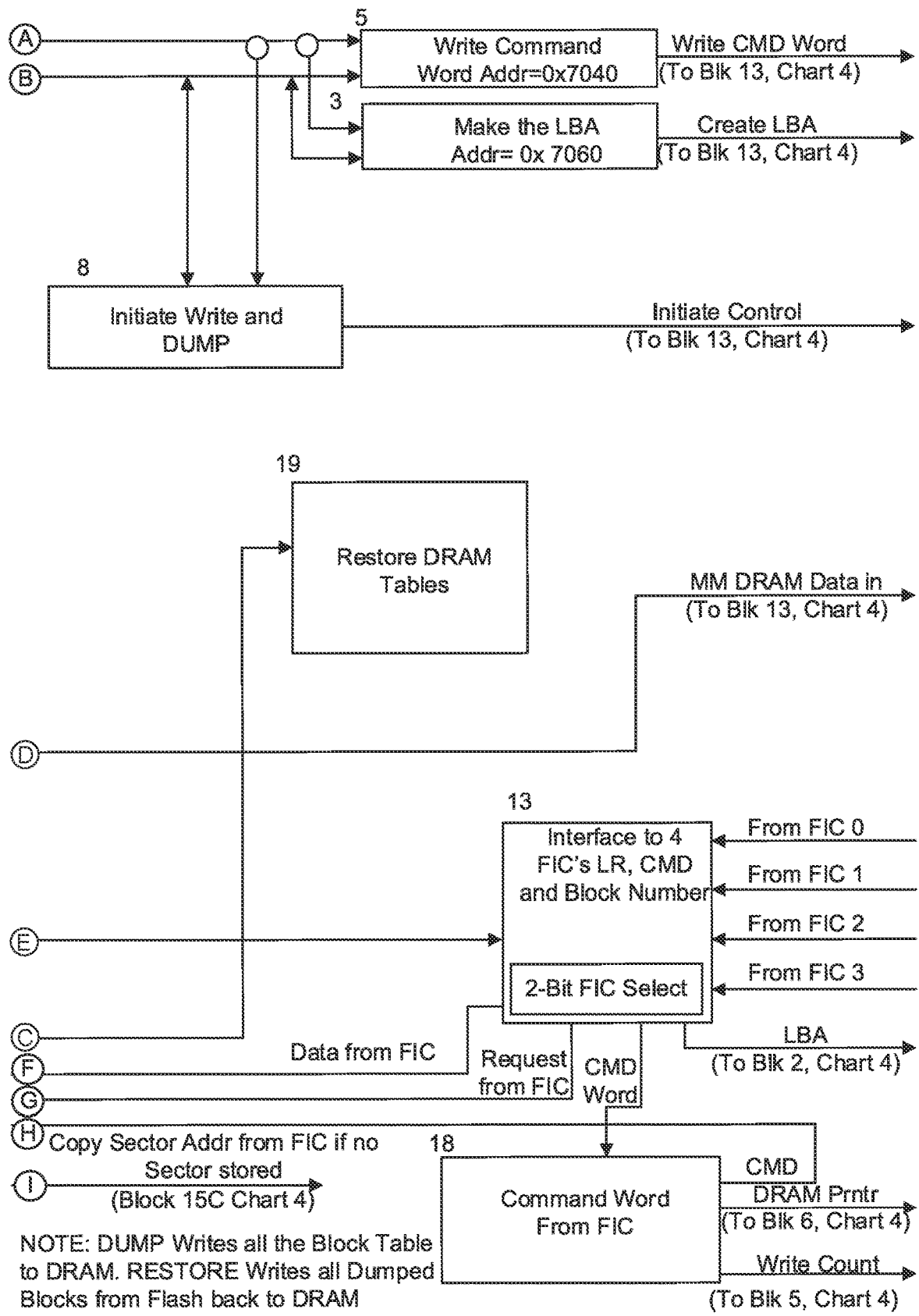

FIGS. 16-18 are diagrams of the memory manager (FIG. 9, 918) of FIG. 9, according to one example of the principles described herein. The "Command Word for MM" is an 8-byte register with contents of byte 0, 1. This is the command operation from the NVMe controller (FIG. 8, 812). Command operation from NVMe and include byte 3 and 4 of the command word and a count for this operation. Bytes 6 and 7 of the command word and a pointer to command block in the command table. FIG. 16 also depicts the LBA which is an 8-byte register and addresses this data. The "Memory Pointer State Machine" converts the LBA into LR which is stored in LR set of bytes. The "Page Pointer Lookup" is 2-bytes from the LR Table. The "Command Count" is a 2-byte counter. This is a state machine that creates word counts from several inputs. Sector count from command word is to be loaded as word value by loading it offset to bit 6. A sector pointer from the LBA subtracts this count from 64 which is the new count for the selected block if the block is even. If it is not even, subtract this count from 32. If the count is less than that number we just use the count. If not, the remaining count goes into the over storage area. If we go to the next page we will write only extra sectors in that page with this command it is possible that we might get another command for the first page. We must have command queue to the flash interface controller (FIG. 9, 922) for both pages that have partials. The merge handles multiple merge requirements by keeping the block number in the spare.

The "Current Page Pointer Register" is 2-bytes. The "Process Next Read/Write and Increment LR" is 6-bytes, with 2-bytes for counter. The "DRAM DMA Counter" includes 2-bytes address and 2-bytes count. The "Next Available Page Pointer Register" is 2-bytes. The "DRAM Data in Bus Manager" is a T2 Interface Bus manager for the NVMe to DRAM. The "Find Next Available Buffer" is a state machine for Look up in DRAM. Counters for storing the current are pointer. The load pointer for new spares may be added. The "Spare Table for all 32K Pages of the 2 GB DRAM" indicates used or available. The "move Command Word" block moves command word and LBA to flash interface controller (FIG. 9, 922). The command word is created while the NVMe command is being stored in the Command table.

The "move Command Word" block is also used by the Write to Flash operations. The command word will have byte-0 for command word, a count in byte-3 and byte-4, memory buffer number in byte-6 and 7. This command word is setup by the Processor. As only the processor writes to flash, it sets up the control words for write. The "move Command Word" block is given a write command or DUMP command and it sends the current LBA as the second word. Then the sequence will control connection to DRAM selected by the pointer register. The DMA counter will get set at 32K. When the DUMP is complete the processor starts writing the lower addresses in the memory so that it writes out the whole LR table and the spare memory table plus the used block table. DUMP and RESTORE are only full pages. This starts with sequence first for command word read and then second for LBA. Each of these will send grant it then counts to 32K and moves to the other planes in the same die and then moves to another flash die on another controller. The "move Command Word" manages its own grant and request to send sequence. In general, the system keeps clocking data at full rate. The logic for the transport is done by the receiver the DMA on the receiving end will signal completion so that the sequence can be terminated.

The "SRAM Store Written Sectors" stores number of sectors written to prepare for a MERGE. The ""write data to DRAM" block is addressed as 4-byte words translated into a DRAM interface with 8-bytes. The rest of the system works only with 8 bytes words and the interface combines the 4-byte words into 8-bytes' odd even. 4 tables is the LR buffer table and one is the table in DRAM. There is a spare buffer table and written Block table. The Block number entry is 2-byte Block address and 2-byte number of written Pages The "Interface to LFC" is a T3 Interface. The initial request to send is triggered by the LBA write for this pointer address and the DMA set up for that address. The sequence sends the control word and then enables the transfer from the memory using request and grant until the count in the logical flash controller (FIG. 9, 916) completes. Most of the logic except for grant are in the logical flash controller (FIG. 9, 916) for this transmission.

Figure 21:
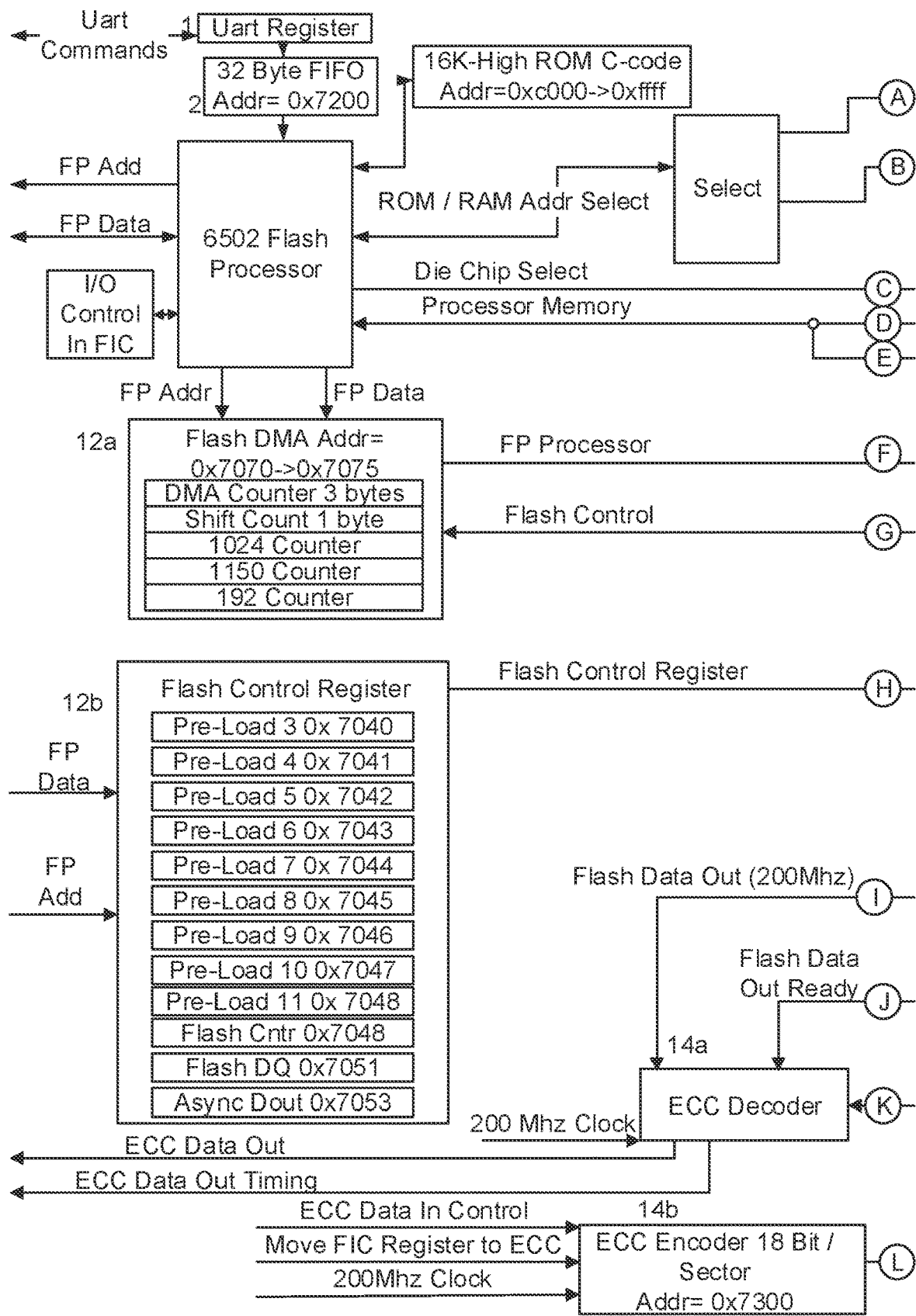
FIG. 21 is a diagram of the flash controller of FIG. 9, according to one example of the principles described herein.
Figure 21:
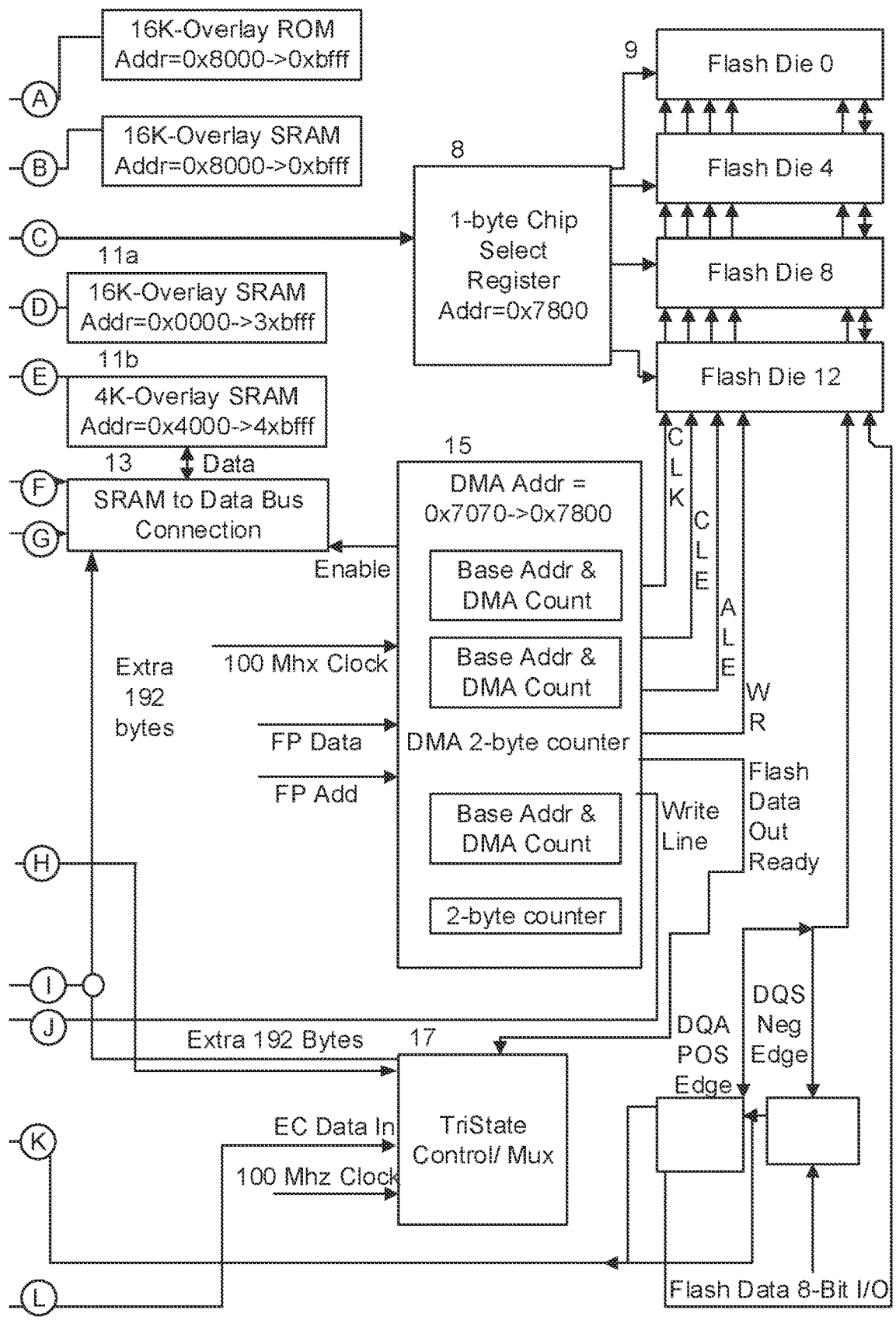

FIG. 18 depicts a 16K ROM which is 0xc000->0xf1ff. FIG. 21 also depicts a "MM Processor" which is a 6502 processor. FIG. 18 also depicts the "Send to Selected FIC" and "4K SRAM" the latter of which is 0x0000->>0x2fff.

FIG. 18 also depicts the "command word" which is 2-bytes. FIG. 18 also depicts the "SRAM used Block Tables" which are 0x3000->0x4000.

FIG. 18 also depicts the "UART & 32 byte FIFO 0x720" which are access ports for debugging purposes. The "DMA" is used for DRAM.

The "DRAM" is 2 tables. One is the LR buffer table and one is the Block # table in DRAM. The block number entry is a 2-byte Block address and a 2-byte number of written Pages. The "Select FIC to MM Interface" block is a register written by the processor which defines what output is being used.

The "Interface to 4 FIC's" is set up to read from 4 FIC's. Because the FIC request to send is random, there is a 2-bit counter that is running at clock rate. It has logic so that if the selected FIC has a request to send that is active, the counter stops to let the system process from that FIC. The sequencer in the block sends a grant and transfers the result to the command word buffer. It then sends a second grant and transfers the word to the LBA buffer. The next grant is held until the MERGE control can select a page address to store the data. For a MERGE, this page address will already be selected before the read command is sent and the MERGE control reads the addresses stored in the MERGE table for this LBA. If there is a match with the current DMA setting the MERGE control turns off the write command until the next sector count. If there are entries in the sector table, the Write is turned off otherwise the Write is turned on and the data from the data channel is written in this page. When the page is completely written the Sector entry in the Sector memory is erased and the page is unblocked for Read.

FIG. 18 depicts a "SRAM Store Written Sectors during the Write from the NVMe." That is, any sector written is added to the written sector table to skip the update from the flash read. The "MERGE Control" block finds the MERGE table for this update and blocks write on all sectors in the written sector entries in the table.

Figure 19:
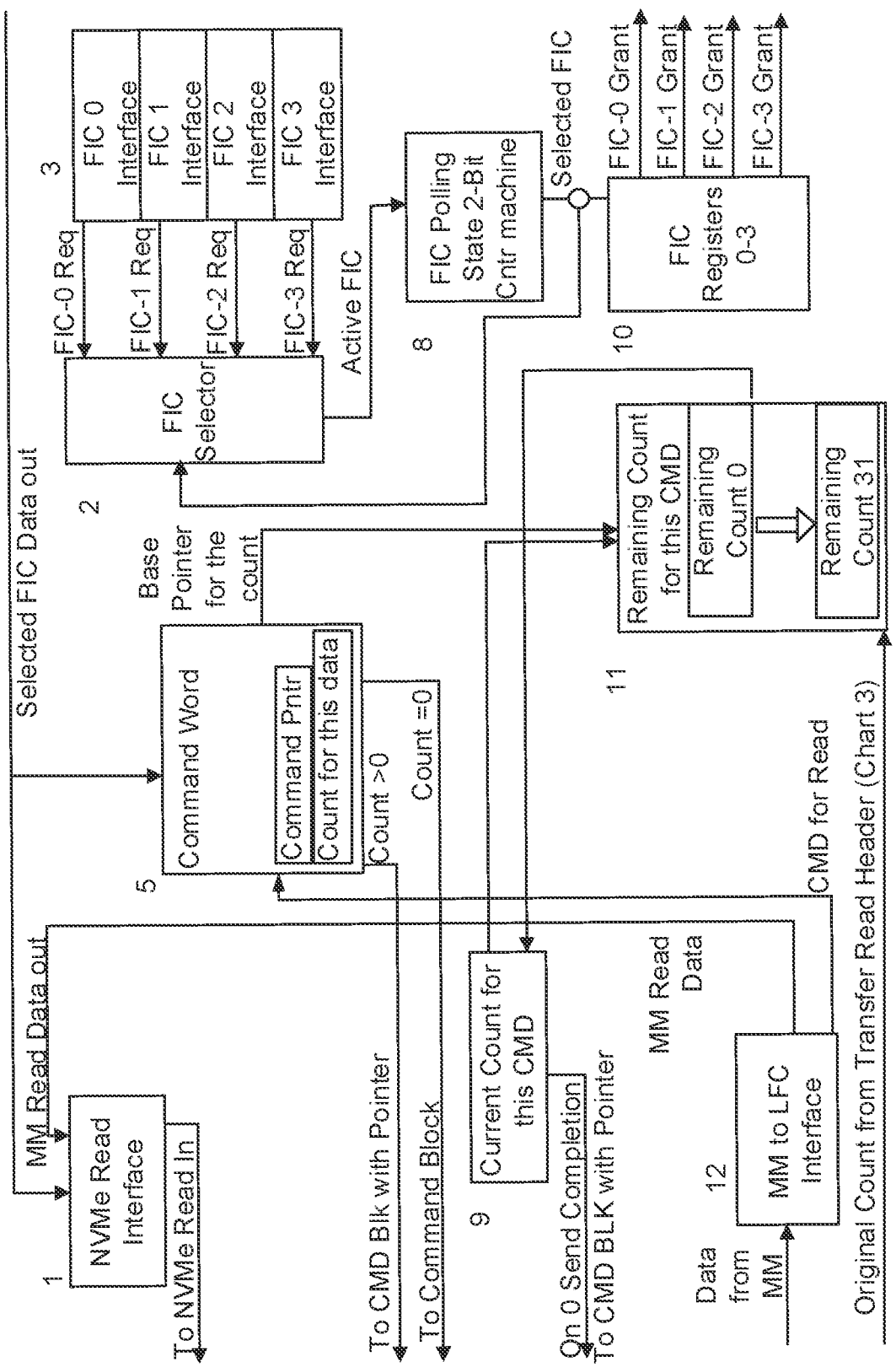
FIG. 19 is a diagram of the logical flash controller of FIG. 9, according to one example of the principles described herein.

FIG. 19 is a diagram of the logical flash controller (FIG. 9, 916) of FIG. 9, according to one example of the principles described herein. In some examples, some of the data for sending read records are fetched from the command table by a state machine that controls writes to DMA control for the command table and transfers the data to the "Format for Read" block which sends it as next word on the interface. Note that all FIC interfaces are T3 without LBA transfer. The "NVMe Read Interface" is a T4 Interface and the "FIC Selector" is 1-byte enable for the "FIC Interface" which is 4 FIC interfaces controlled by the "HO Selector."

In an example, there are 4 output registers; 1 for Completion Record, 1 for the Command descriptor, and 2 words for PRP1 and 2. The "Command word" has 2-bytes for Command pointer, a 2-byte counter for Count 32K and a down counter loaded as the command word. The "Current count for this Command" and this 32K counter count down together. The "FIC Polling State 2-bit Counter machine" is a 1-byte pointer to current FIC and the "Current Count for this Command" is 2-bytes from the "Remaining Count for this CMD" block and includes data from the count record for this Command. This is loaded when ready to count. When this is zero, it triggers the send completion from the "Format for Read" block.

FIG. 19 depicts "FIC Registers 0-3." Each byte is a grant from a FIC. The "Remaining Count for this CMD" block is a table of counts indexed by command pointer. The initial count loaded from a command table read. Longer counts are reloaded from the "Current Count for this Command" block when the count is zero.

Figure 20:
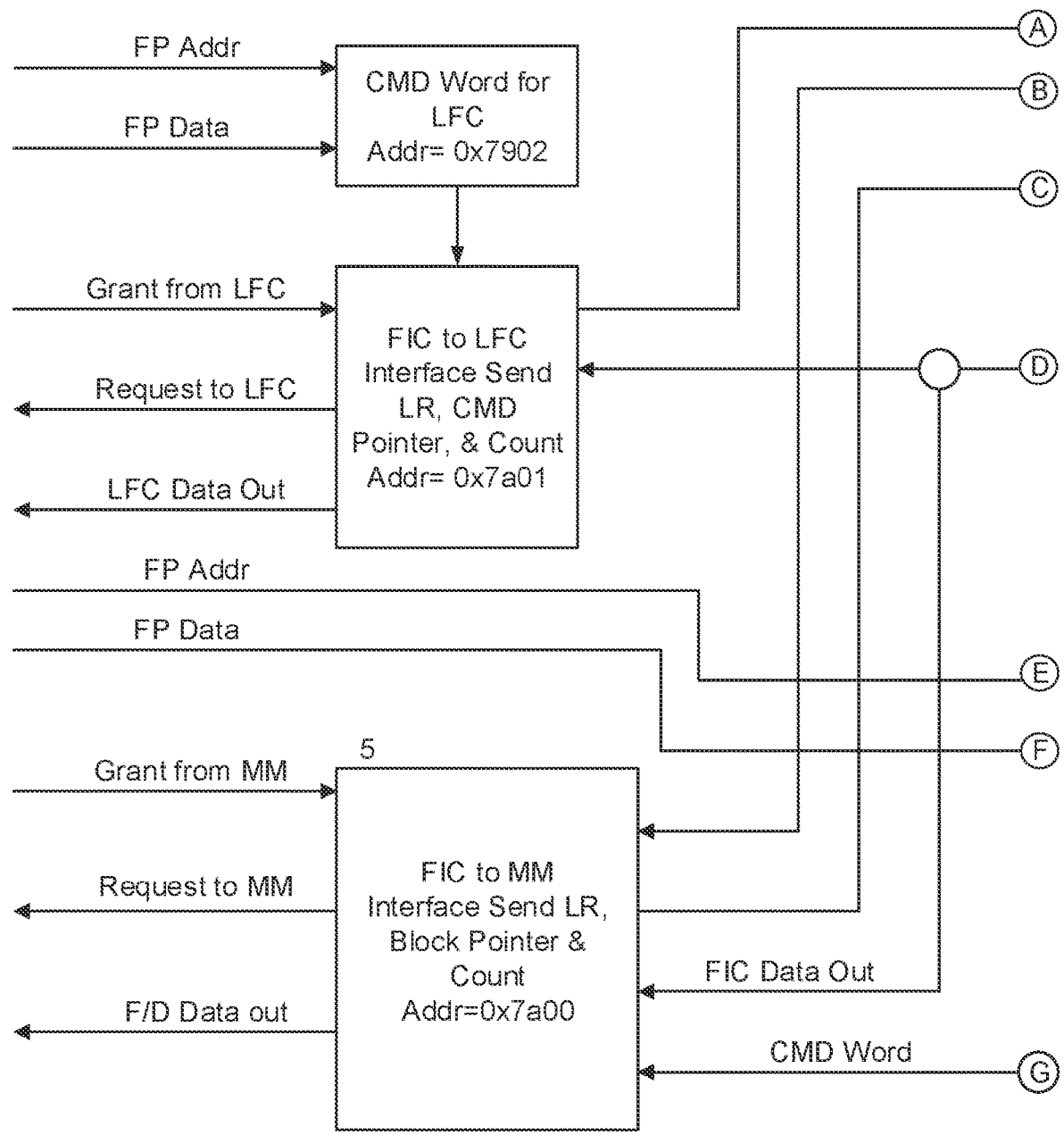
FIG. 20 is a diagram of the flash interface controller of FIG. 9, according to one example of the principles described herein.
Figure 20:
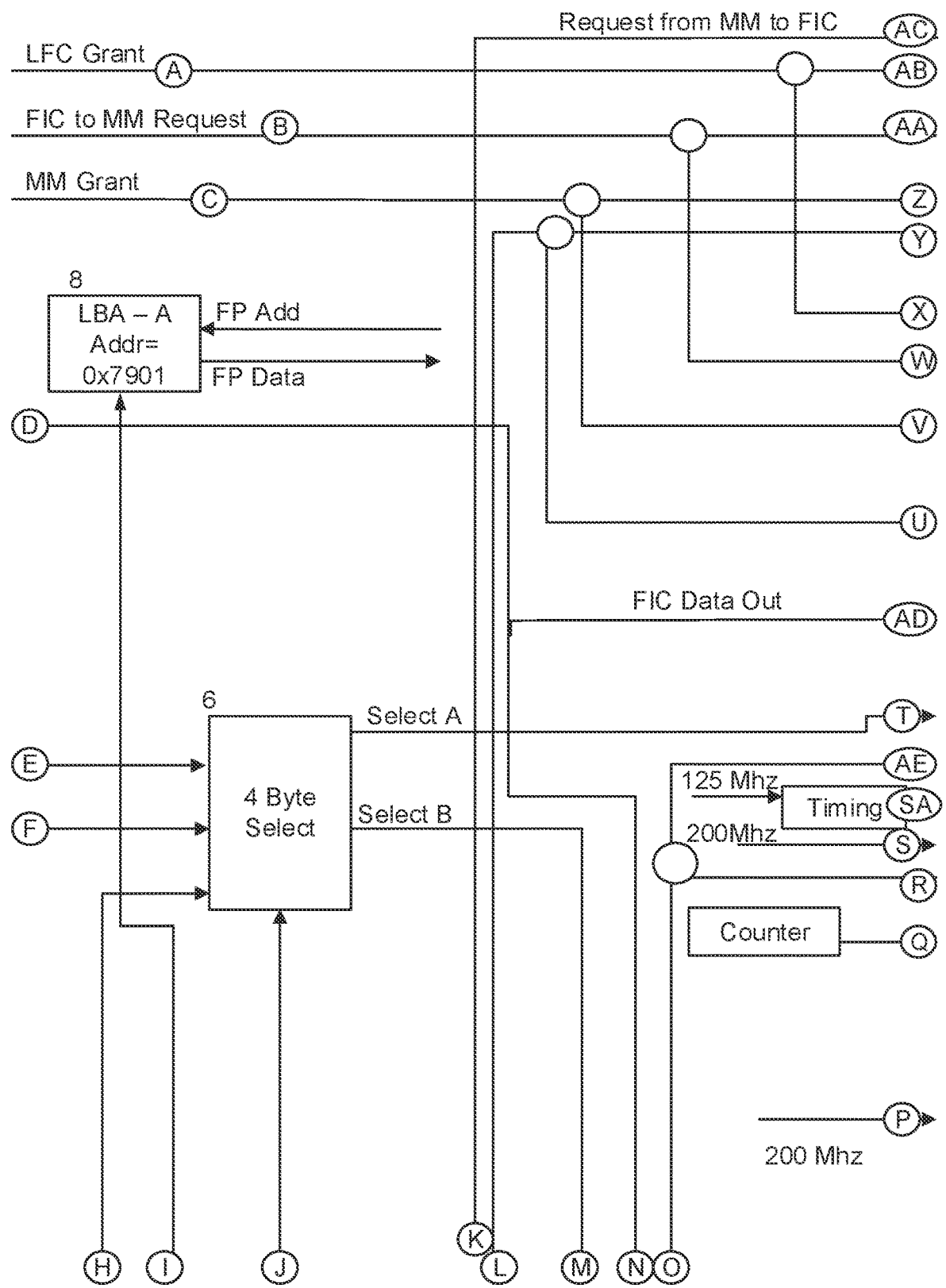
Figure 20:
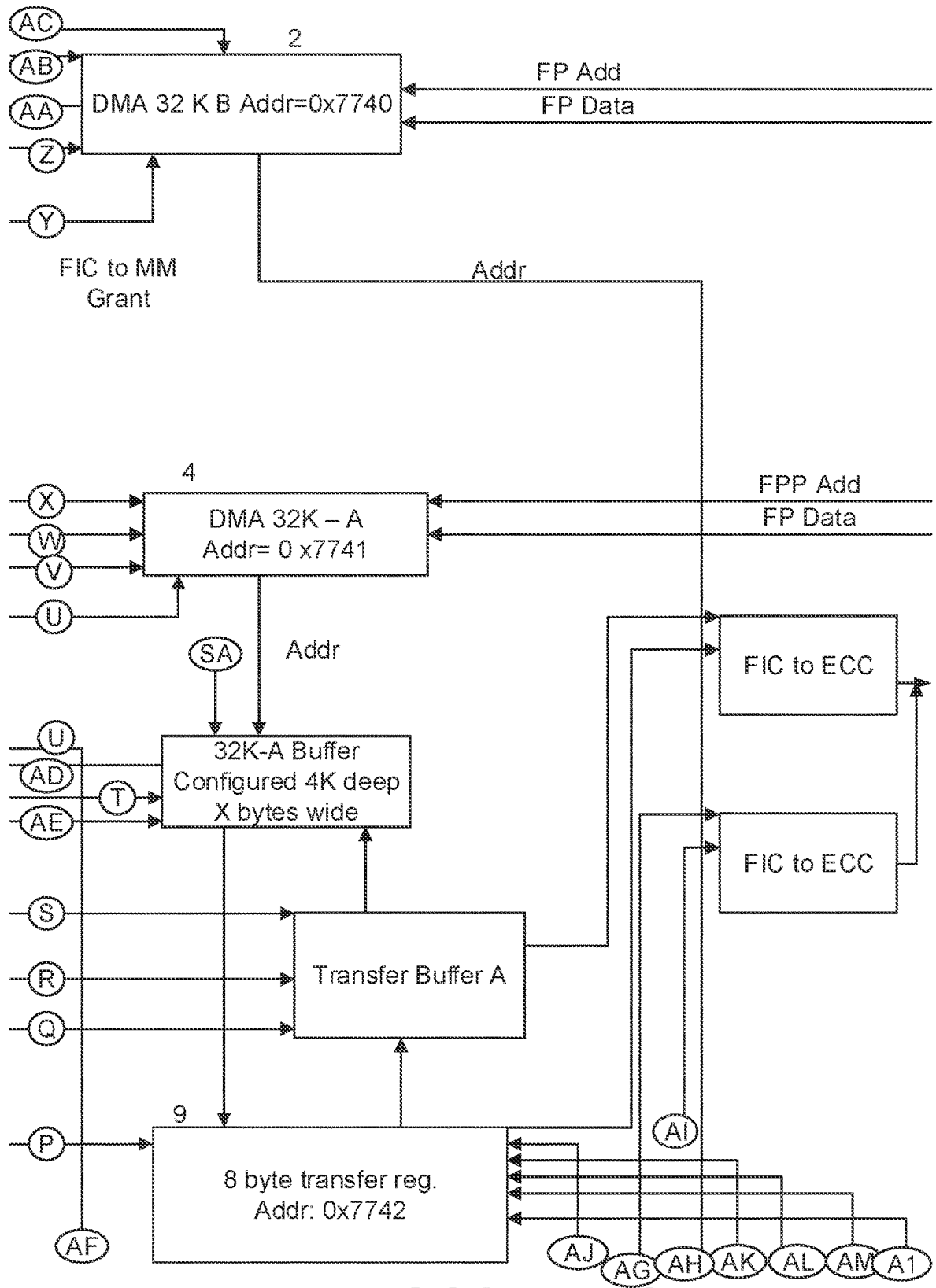
Figure 20:
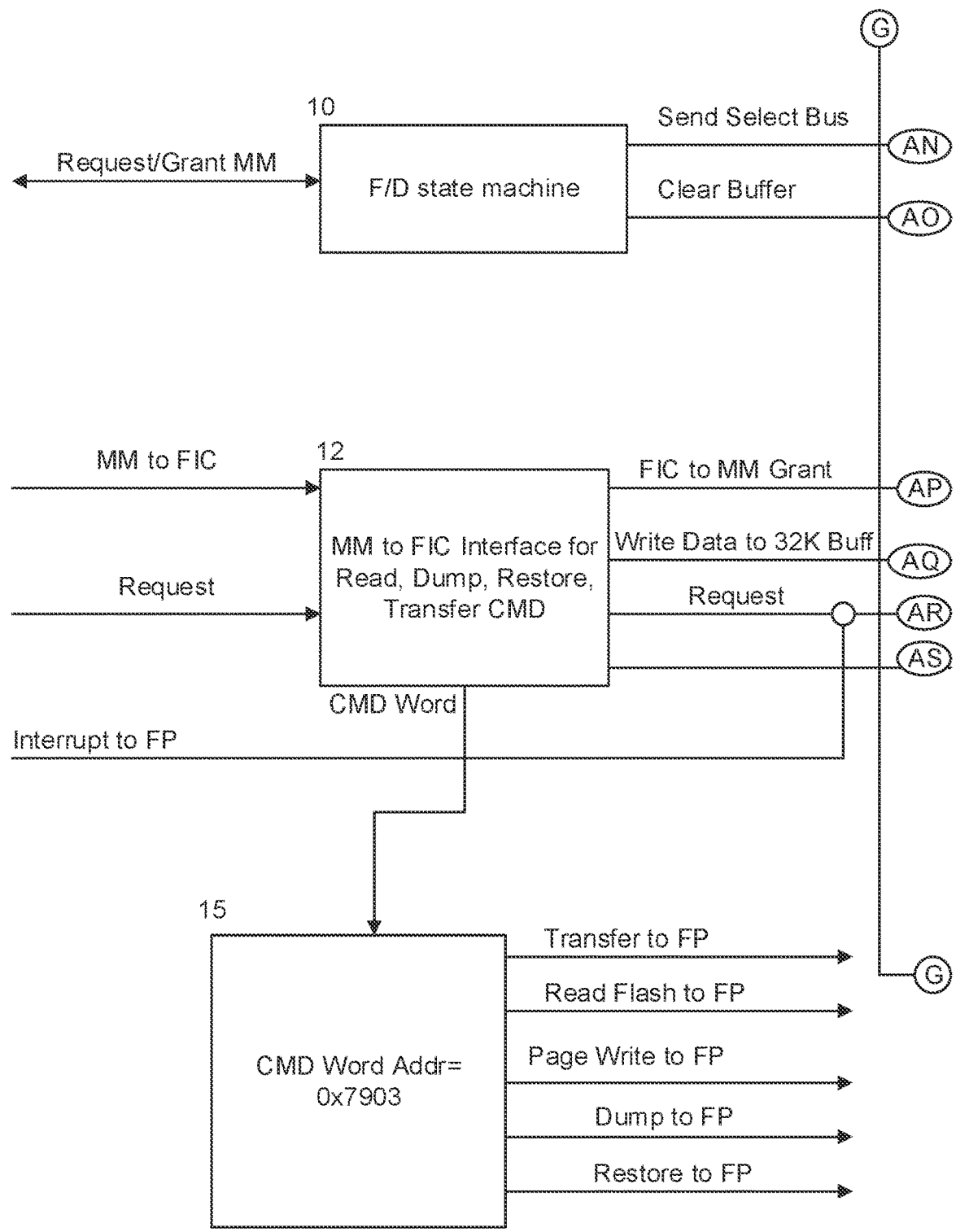
Figure 20:
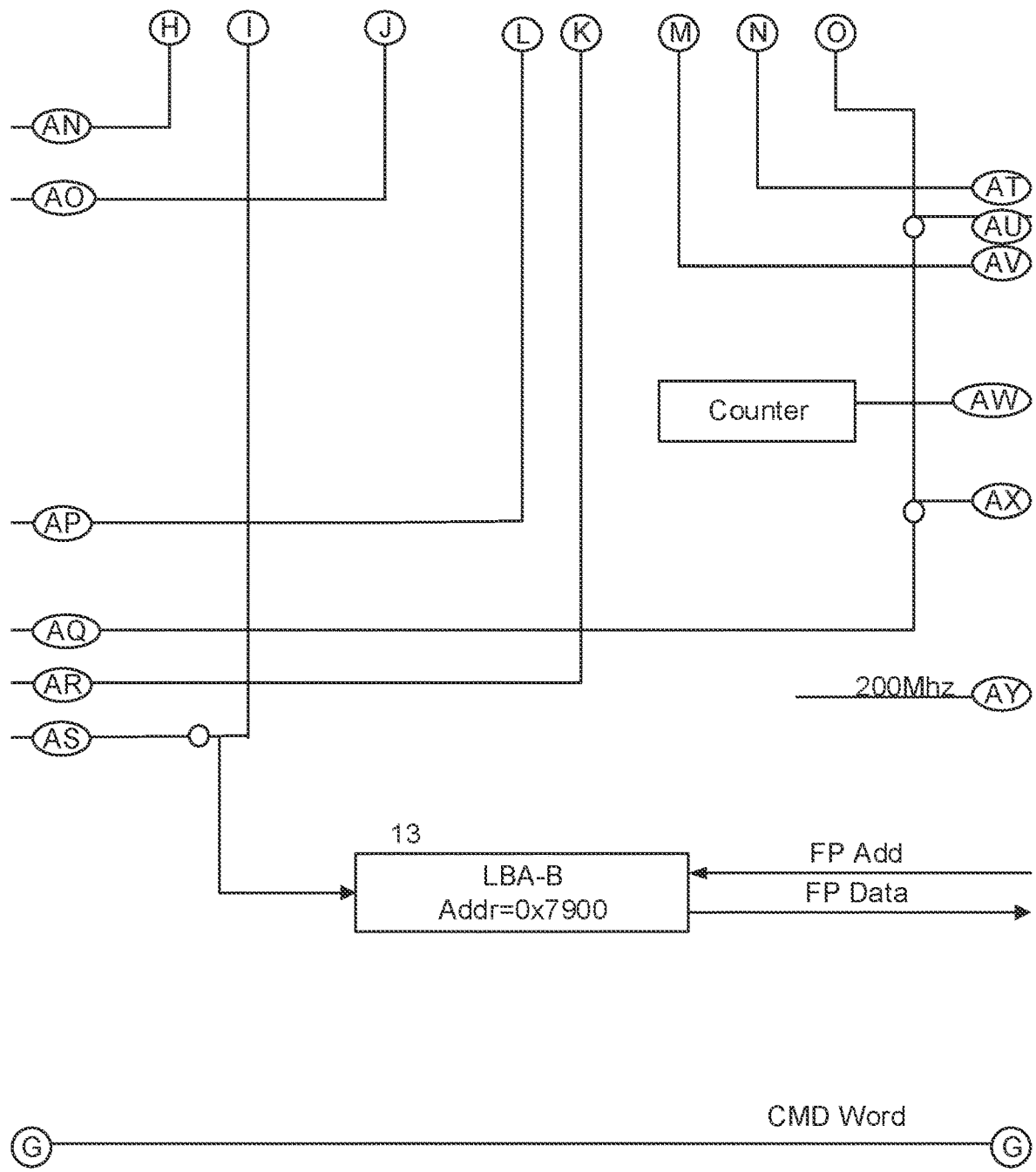
Figure 20:
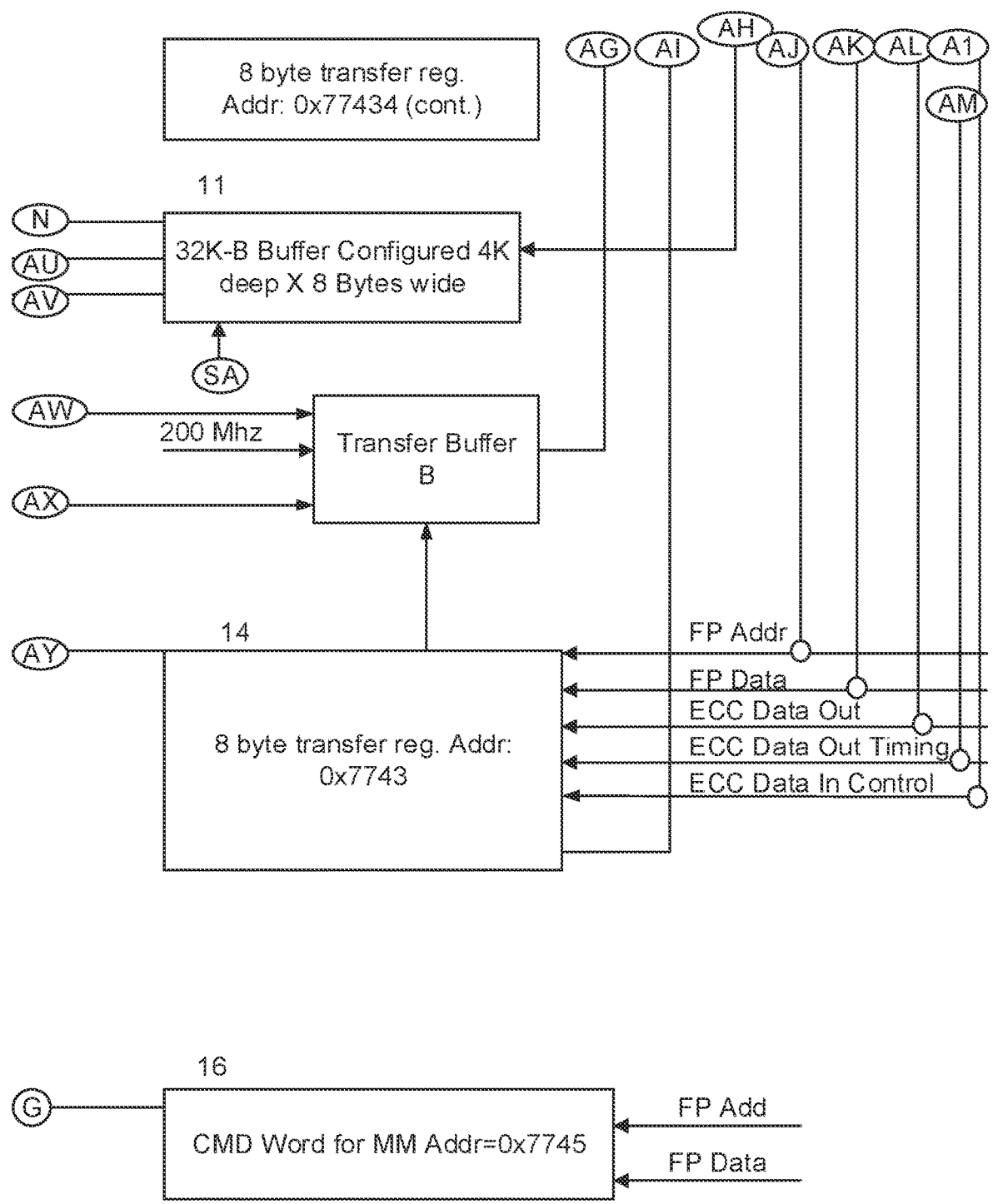

FIG. 20 is a diagram of the flash interface controller (FIG. 9, 916) of FIG. 9, according to one example of the principles described herein. The "CMD Word for writing to LFC" block receive a command 2 bytes-0, 1, Count byte-3, 4, pointer to Command buffer byte-6 and 7. The ""DMA 32K-A and 32K-B" block are memory interface 3-bytes, 2-bytes counter. 1-byte enable for EGO and 1-byte count for number of 1024 operations. Starting at zero the memory address for the SRAM words counts with 2-byte counter that is set at 1024 and counts down to zero. Enable triggered by 1148 count on flash counter for buffer write. There is a third counter for controlling shift operations when enabled this counter counts down Flash counts from 8 when zero enables the reset of counter to 8 and step one count on the memory address counter and the Sector counter. The clock used in the setting of the registers=120 MHz, all counts are stepped by 50 MHz clock. Operation from initial start to when the number of 1024 counter=0.

The "FIC to LFC Interface" is a T3 line that sends command word. The "FIC to MM Interface Send" is a T1 connection with CMD 2 bytes-0, 1 count byte-3, 4 CMD pointer byte-6 and 7. The "4-byte Select" register selects one Flash input and one Flash output each for 32K buffer A and B. FIG. 20 also depicts the "32K-A Buffer" and the "LBA." FIG. 20 depicts an "8 Byte Transfer Register." FIG. 20 depicts the "F/D State Machine" which is a new MM to FIC request to send selects a buffer.

FIG. 20 also depicts the "MM to FIC Interface" which is a T1 command word block word interface. FIG. 20 also depicts the "LBA" sent between the MM to FIG. FIG. 20 depicts an "8-byte Transfer Register" and a "CMD Word" which is for the FIC and mostly read by the flash processor.

FIG. 20 also depicts a "CMD Word for MM" block which is set by Flash Processor for MERGE and RESTORE Command bytes-0, 1, count bytes-3, 4, memory.

FIG. 21 is a diagram of the flash controller (FIG. 9, 924) of FIG. 9, according to one example of the principles described herein. Specifically, FIG. 21 depicts one of multiple similar flash controllers (FIG. 9, 924) that allow parallel writes to the flash die using stripe mode.

FIG. 21 depicts the "UART" and "32 byte FIFO" blocks as well as a "6502 Processor" which interrupts requests to send from MM.

FIG. 21 also depicts a "16K ROM Code" and a "Select" block that is 1-byte that selects the 16K ROM Overlay or 1-byte selects the 16K SRAM overlay.

The "1-byte Chip Select Register" selects 1 of 4 flash die to write to. The "I/O Control" block indicates connections from other components to this flash processor.

The "Flash DMA" controls all the commands 2-byte address counter plus 1-byte 8-byte counter. Every time the 8-byte counter completes, it triggers a new word from the 2-byte counter to the output buffer word. The ECC has an enable signal that controls the counting. In and another that controls the counting out.

The "ASYNC Flash Control" mixes control for Die. The flash processor sends real address after converting for this die. Controls CLE and ALE sequence. The "ECC Decoder" reads data from the flash buffer to ECC decoder 1148-bytes, FIFO holds the read bytes and upgrades the 1024 data bytes. Output line controls 1024 count to the register.

The "ECC Encoder" takes input from register 1024-bytes and outputs 1148-bytes to the Flash buffer, this includes the correction data.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A solid state drive (SSD) comprising:
dynamic random access memory (DRAM);
a DRAM buffer;
flash memory;
a solid state drive (SSD) controller configured to:
   translate a logical block address (LBA) from a computing device into internal locations corresponding to either the DRAM or the flash memory;
   write data to the flash memory from the DRAM independently of received commands from the computing device, wherein:
      data writes are sent to block tables as well as the DRAM buffer; and
      when more than half the DRAM buffer has been used, a set of completely written blocks are moved to the flash memory in a stripe fashion to free up the DRAM such that any LBA to be updated creates a new block for that LBA and data is stored in the DRAM to provide new data to be mixed with already written flash data; and
a peripheral component interconnect express (PCIe) bus configured to connect the SSD to a computing device such that a central processing unit (CPU) of the computing device exclusively reads data from, and writes data to, the DRAM; and
a power circuit configured to:
   provide, following power down, power to the computing device to facilitate stripe writing the data to the flash memory; and
   copy internal registers to the flash memory, wherein responsive to power being restored, the flash memory is stripe read and the DRAM and internal registers are restored, freeing the flash memory for a subsequent power down.

2. The SSD of claim 1, wherein the SSD controller comprises:
a non-volatile memory express (NVMe) controller to receive commands from the computing device to access the SSD;
a command block to receive and store the commands, wherein a command includes a logical block address and a command word;
a memory manager to manage data transfer into and out of the DRAM based on a mapping between the logical block address of the command and a pointer to a location in the DRAM;
a logical flash controller to manage data transfer between the SSD and the computing device;
at least one flash interface controller to buffer data to be written to multiple flash die from the DRAM; and
a flash controller per flash interface controller paired with a flash die to manage data access into and out of the flash die.

3. The SSD of claim 2, wherein the at least one flash interface controller comprises multiple flash interface controllers.

4. The SSD of claim 3, wherein multiple flash die are written to in parallel.

5. The SSD of claim 2, wherein the SSD controller further comprises a DRAM controller to manage data access to the DRAM.

6. The SSD of claim 2, wherein the flash interface controller maps the logical block address to locations on corresponding flash die.

7. The SSD of claim 1, in which data access to the DRAM is implemented at full interface speed.

8. A method, comprising:
receiving from a computing device, a command to access a solid state drive (SSD), wherein the command includes a logical block address (LBA) and a command word;
formatting the command via a non-volatile memory express (NVMe) controller;
storing the command in a command block of an SSD controller;
translating the LBA from the computing device into internal locations corresponding to either a dynamic random access memory (DRAM) or a flash memory;
determining, from a logical record (LR) table stored in a memory manager of the SSD controller, whether the logical block address maps to a location on (DRAM) or a location on the flash memory; and
when the logical block address maps to a pointer in the DRAM, executing the command in the DRAM based on the mapping, while preventing access of the computing device to flash memory of the SSD;
writing data to the flash memory from the DRAM independently of received commands from the computing device, wherein:
   data writes are sent to block tables as well as a DRAM buffer; and
   when more than half the DRAM buffer has been used, a set of completely written blocks are moved to the flash memory in a stripe fashion to free up the DRAM such that any LBA to be updated creates a new block for that LBA and data is stored in the DRAM to provide new data to be mixed with already written flash data;
providing, following power down, power to the computing device to facilitate stripe writing the data to the flash memory; and
copying internal registers to the flash memory, wherein responsive to power being restored, the flash memory is stripe read and the DRAM and internal registers are restored, freeing the flash memory for a subsequent power down.

9. The method of claim 8, wherein:
the command is a read command; and
the method further comprises:
   determining from the LR table, with the memory manager, if data associated with the command word is stored in DRAM;
   when the data associated with the command word is stored in DRAM, transferring the data from the DRAM to the computing device; and when the data associated with the command word is not stored in DRAM:
sending the command word to a flash interface controller;
determining at the flash interface controller a location on the flash memory where the data is stored; and
transferring the data from the flash memory to the computing device.

10. The method of claim 9, wherein data is stored on the DRAM in 32k packets.

11. The method of claim 8, wherein:
the command is a write command; and
the method further comprises:
when the logical block address maps to a location on the DRAM, storing data associated with the command word in DRAM; and
when the logical block address does not map to a location on the DRAM:
generating a mapping between the logical block address of the command and a new unused location on the DRAM; and
storing the data associated with the command on the DRAM in the new unused location; and
reporting to the computing device that the write command is complete.

12. The method of claim 8, further comprising:
holding data associated with the command in DRAM;
determining when the DRAM has a threshold amount of full blocks; and
when the DRAM has the threshold amount of full blocks, transferring the full blocks to the flash memory, wherein the full blocks are transferred to the flash memory independent of any received command.

13. The method of claim 12, wherein transferring the full blocks to the flash memory comprises:
dividing the data in the full blocks into various portions;
buffering the various portions in different flash interface controllers; and
for each flash interface controller:
sequentially initiating writes to each corresponding flash die via a flash controller coupled to a flash die.

14. The method of claim 13, wherein:
after a write has been initialized on a first flash die, initiating a write on a second flash die before the write to the first flash die is complete; and
when data remains in the buffer and the write on the first flash die has terminated, initiating another sequential write on the first flash die.

15. The method of claim 14, wherein writes to each flash die are at three or four page increments.

16. A solid state drive (SSD) comprising:
dynamic random access memory (DRAM);
a DRAM buffer;
flash memory comprising:
multiple flash die;
at least one flash interface controller configured to buffer data to be written to a subset of the multiple flash die from the DRAM; and
a flash controller per flash interface controller and paired with a flash die, the flash controller configured to manage data access into and out of the flash die, wherein the data is stripe written into the flash die,
a peripheral component interconnect express (PCIe) bus coupling the SSD to a computing device; and
a solid state drive (SSD) controller comprising:
a non-volatile memory express (NVMe) controller configured to receive and format commands to access the SSD;
a command block configured to receive and store the commands, wherein a command includes a logical block address (LBA) and a command word, wherein the SSD controller is to translate the LBA from the computing device into internal locations corresponding to either the DRAM or the flash memory;
a memory manager configured to manage data transfer into and out of the DRAM based on a mapping between the LBA of the command and a pointer to a location in the DRAM;
a logical flash controller configured to manage data transfer between the SSD and the computing device; and
a power circuit configured to:
provide, following power down, power to the computing device to facilitate stripe writing the data to the flash memory; and
copy internal registers to the flash memory, wherein responsive to power being restored, the flash memory is stripe read and the DRAM and internal registers are restored, freeing the flash memory for a subsequent power down
wherein:
the solid state controller is configured to:
translate the LBA from a computing device into internal locations corresponding to either the DRAM or the flash memory;
write data to the flash memory from the DRAM independently of received commands from the computing device, wherein:
data writes are sent to block tables as well as the DRAM buffer; and
when more than half the DRAM buffer has been used, a set of completely written blocks are moved to the flash memory in a stripe fashion to free up the DRAM such that any LBA to be updated creates a new block for that LBA and data is stored in the DRAM to provide new data to be mixed with already written flash data;
less than all writes to the SSD are written to the flash memory;
reads and writes to the DRAM are checked to determine if the data is in the DRAM or has been transferred to the flash memory; and
the DRAM reports data stored thereon is stored in the flash memory.

17. The SSD of claim 16, wherein the DRAM is the only memory accessible by the computing device.

18. The SSD of claim 16, wherein the NVMe controller receives multiple commands and stores the multiple commands in a command buffer of the command block.

19. The SSD of claim 16, wherein the command block comprises a command buffer table to store commands that are active at a given time.

20. The SSD of claim 16, wherein pages of the flash die are identified as having errors and eliminated from a block while other pages in the block remain in use.

* * * * *